(12) United States Patent
Seshimo et al.

(10) Patent No.: US 8,206,891 B2
(45) Date of Patent: *Jun. 26, 2012

(54) POSITIVE RESIST COMPOSITION AND METHOD OF FORMING RESIST PATTERN

(75) Inventors: Takehiro Seshimo, Kawasaki (JP);
Yoshiyuki Utsumi, Kawasaki (JP);
Akiya Kawaue, Kawasaki (JP);
Takahiro Dazai, Kawasaki (JP);
Tomoyuki Hirano, Kawasaki (JP);
Fumitake Kaneko, Kawasaki (JP);
Kotaro Endo, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 245 days.

This patent is subject to a terminal disclaimer.

(21) Appl. No.: 12/573,686

(22) Filed: Oct. 5, 2009

(65) Prior Publication Data

US 2010/0086873 A1    Apr. 8, 2010

(30) Foreign Application Priority Data

Oct. 7, 2008  (JP) .................... 2008-260866
May 13, 2009  (JP) .................... 2009-116843

(51) Int. Cl.
G03F 7/004    (2006.01)
G03F 7/30     (2006.01)

(52) U.S. Cl. .............. 430/270.1; 430/326; 430/910; 430/922

(58) Field of Classification Search .......... 430/270.1, 430/326, 907, 910, 922
See application file for complete search history.

(56) References Cited

U.S. PATENT DOCUMENTS

| | | | |
|---|---|---|---|
| 4,458,001 A | 7/1984 | Taylor | |
| 5,945,517 A | 8/1999 | Nitta et al. | |
| 6,153,733 A | 11/2000 | Yukawa et al. | |
| 7,074,543 B2 | 7/2006 | Iwai et al. | |
| 7,078,562 B2 | 7/2006 | Furukawa et al. | |
| 7,682,772 B2 * | 3/2010 | Seshimo et al. | 430/270.1 |
| 7,767,379 B2 * | 8/2010 | Dazai et al. | 430/270.1 |
| 8,124,313 B2 * | 2/2012 | Seshimo et al. | 430/270.1 |
| 2002/0012874 A1 | 1/2002 | Namba | |
| 2009/0023097 A1 | 1/2009 | Dazai et al. | |
| 2009/0068590 A1 * | 3/2009 | Dazai et al. | 430/285.1 |
| 2009/0104563 A1 | 4/2009 | Ishiduka et al. | |
| 2009/0130597 A1 * | 5/2009 | Seshimo et al. | 430/285.1 |
| 2009/0226842 A1 | 9/2009 | Shimizu et al. | |
| 2010/0015552 A1 | 1/2010 | Kawaue et al. | |
| 2010/0015553 A1 | 1/2010 | Shimizu et al. | |
| 2010/0062364 A1 * | 3/2010 | Dazai et al. | 430/270.1 |
| 2010/0062369 A1 * | 3/2010 | Dazai et al. | 430/285.1 |
| 2010/0136480 A1 | 6/2010 | Motoike et al. | |
| 2010/0178609 A1 | 7/2010 | Dazai et al. | |
| 2010/0183981 A1 | 7/2010 | Matsumiya et al. | |
| 2010/0196821 A1 | 8/2010 | Dazai et al. | |
| 2010/0209848 A1 | 8/2010 | Dazai et al. | |
| 2010/0233623 A1 | 9/2010 | Kurosawa et al. | |
| 2010/0233624 A1 | 9/2010 | Kakinoya et al. | |
| 2010/0233625 A1 | 9/2010 | Hirano et al. | |
| 2010/0233626 A1 | 9/2010 | Shimizu et al. | |
| 2011/0236824 A1 | 9/2011 | Hirano et al. | |

FOREIGN PATENT DOCUMENTS

| | | |
|---|---|---|
| JP | 2006-016379 | 8/1997 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-037888 | 2/2005 |
| JP | A-2007-031355 | 2/2007 |
| WO | WO 2004/074242 | 9/2004 |

OTHER PUBLICATIONS

Office Action in U.S. Appl. No. 12/461,687 mailed Sep. 12, 2011.
Office Action in U.S. Appl. No. 12/717,870 mailed Sep. 14, 2011.
The Office Action issued on Jan. 20, 2012 for U.S. Appl. No. 12/758,650.
Notice of Allowance issued in U.S. Appl. No. 12/461,687 on Jan. 25, 2012.
Office Action issued in U.S. Appl. No. 12/717,870 on Jan. 26, 2012.

* cited by examiner

*Primary Examiner* — John Chu
(74) *Attorney, Agent, or Firm* — Knobbe Martens Olson & Bear LLP

(57) ABSTRACT

A positive resist composition including: a base component (A) which includes a polymeric compound (A1) containing a structural unit (a0) represented by the general formula (a0-1) and a structural unit (a1) derived from an acrylate ester having an acid dissociable, dissolution inhibiting group; and an acid generator component (B) which includes an acid generator (B1) containing an anion moiety represented by the general formula (I):

[Chemical Formula 1]

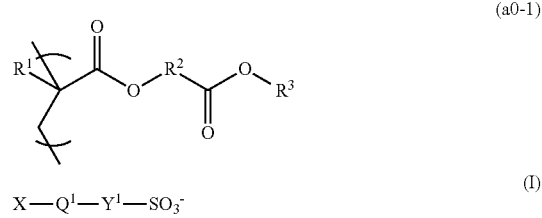

(in the formula (a0-1), $R^1$ represents a hydrogen atom, a lower alkyl group of 1 to 5 carbon atoms or a halogenated lower alkyl group of 1 to 5 carbon atoms; $R^2$ represents a bivalent linking group; and $R^3$ represents a cyclic group containing —$SO_2$— within the ring skeleton. In the formula (I), X represents a cyclic group of 3 to 30 carbon atoms, $Q^1$ represents a bivalent linking group containing an oxygen atom; $Y^1$ represents an alkylene group of 1 to 4 carbon atoms or a fluorinated alkylene group of 1 to 4 carbon atoms).

6 Claims, No Drawings

POSITIVE RESIST COMPOSITION AND METHOD OF FORMING RESIST PATTERN

TECHNICAL FIELD

The present invention relates to a positive resist composition and a method of forming a resist pattern. Priority is claimed on Japanese Patent Application No. 2008-260866, filed Oct. 7, 2008, and Japanese Patent Application No. 2009-116843, filed May 13, 2009, the contents of which are incorporated herein by reference.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and then a developing treatment is conducted, thereby forming a resist pattern of the prescribed shape in the resist film.

Resist materials in which the exposed portions change to become soluble in a developing liquid are termed positive materials, whereas resist materials in which the exposed portions change to become insoluble in the developing liquid are termed negative materials.

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used; however, nowadays, KrF excimer lasers and ArF excimer lasers are starting to be introduced in mass production of semiconductor elements. Furthermore, research is also being conducted into lithography techniques that use $F_2$ excimer lasers, electron beams (EB), extreme ultraviolet radiation (EUV) and X-rays.

Resist materials are required to have lithography properties such as high sensitivity to the aforementioned light source and enough resolution to reproduce patterns with very fine dimensions.

As resist materials which fulfill the aforementioned requirements, a chemically-amplified resist is used containing: a base component that displays changed solubility in an alkali developing solution under action of an acid; and an acid generator that generates an acid upon exposure.

For example, as the chemically-amplified positive resist composition, a composition containing a resin component (a base resin) that exhibits increased solubility in an alkali developing solution under action of acid and an acid generator component is commonly used. If the resist film formed using the resist composition is selectively exposed during formation of a resist pattern, then within the exposed portions, an acid is generated from the acid generator, and the action of this acid causes an increase in the solubility of the resin component in an alkali developing solution, making the exposed portions soluble in the alkali developing solution.

Resins (acrylic resins) that contain structural units derived from (meth)acrylate esters within the main chain thereof are now widely used as base resins for resists that use ArF excimer laser lithography, as they exhibit excellent transparency in the vicinity of 193 nm (for example, see Patent Documents 1 and 2).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of an acrylate ester having a hydrogen atom bonded to the α-position and a methacrylate ester having a methyl group bonded to the α-position. The term "(meth)acrylate" is a generic term that includes either or both of an acrylate having a hydrogen atom bonded to the α-position and a methacrylate having a methyl group bonded to the α-position.

Also, as base resins for chemically amplified resists, base resins containing a plurality of structural units are now used in order to improve lithography properties and the like.

For example, in the case of using a positive-type resist, a base resin is typically used which includes a structural unit having an acid dissociable, dissolution inhibiting group, the group dissociating under action of an acid generated from an acid generator, and further includes a structural unit having a polar group such as a hydroxyl group and a structural unit having a lactone structure. Of these structural units, the structural unit having a lactone structure is generally considered to contribute to the improvement of the adhesion of the resist film with a substrate, the improvement of compatibility with an alkali developing solution, and the improvement of lithography properties.

On the other hand, as acid generators usable in a chemically-amplified resist, various types have been proposed including, for example, onium salt-based acid generators such as iodonium salts and sulfonium salts; oxime sulfonate-based acid generators; diazomethane-based acid generators; nitrobenzylsulfonate-based acid generators; iminosulfonate-based acid generators; and disulfone-based acid generators.

Currently, as the acid generator component for a chemically amplified resist, an onium salt-based acid generator containing an onium ion such as triphenylsulfonium as the cation moiety is used. As an anion moiety of the onium salt-based acid generator, an alkylsulfonate ion or a fluorinated alkylsulfonate ion in which a part or all of the hydrogen atoms of the alkyl group within the alkylsulfonate ion are substituted with fluorine atoms is used (for example, see Patent Document 3).

DOCUMENTS OF RELATED ART

Patent Documents

[Patent Document 1] Japanese Unexamined Patent Application, First Publication No. 2003-241385.
[Patent Document 2] Japanese Unexamined Patent Application, First Publication No. 2006-016379.
[Patent Document 3] Japanese Unexamined Patent Application, First Publication No. 2005-037888.

SUMMARY OF THE INVENTION

Problems to be Solved by the Invention

The demand for a novel material which can be used for lithography has been increased, since it is expected that lithography technologies will further make progress and the fields of application will be broadened.

For example, as the miniaturization of patterns makes progress, improvement in various lithography properties such as excellent resist pattern and resolution has been demanded as a resist material. As an example of the lithography properties, mask error factor (MEF) can be mentioned.

"MEF" is a parameter that indicates how faithfully mask patterns of different sizes can be reproduced, when mask sizes (line width and space width, hole diameter, or the like) are changed while using the same exposure dose and a fixed pitch (namely, the mask reproducibility).

However, in the formation of a resist pattern using a conventional resist composition, when the mask size (e.g., the hole diameter of a hole pattern, or the line width of a line and space pattern) is changed, the amount of light irradiated on exposed portions is changed. As a result, disadvantages are likely to be caused in that the actual size of the formed pattern is deviated from the mask size, and pattern collapse occurs in the formation of an extremely fine pattern with a narrow pitch. For example, when a hole pattern having a hole diameter of about no more than 100 nm is formed, the circularity of the holes is likely to be deteriorated.

The present invention takes the above circumstances into consideration, with an object of providing a positive resist composition which excels in the resist pattern shape, and a method of forming a resist pattern using the positive resist composition.

Means for Solving the Problems

To achieve the above object, the present invention employs the following constitutions.

Specifically, a first aspect of the present invention is a positive resist composition including a base component (A) which exhibits increased solubility in an alkali developing solution under action of an acid, and an acid generator component (B) which generates an acid upon exposure, wherein the base component (A) includes a structural unit (a0) represented by the general formula (a0-1) shown below and a structural unit (a1) derived from an acrylate ester containing an acid dissociable, dissolution inhibiting group, and the acid generator component (B) includes an acid generator (B1) containing an anion moiety represented by the general formula (I) shown below.

[Chemical Formula 1]

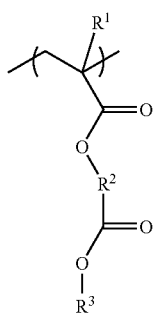

(a0-1)

(In the formula (a0-1), $R^1$ represents a hydrogen atom, a lower alkyl group of 1 to 5 carbon atoms, or a halogenated lower alkyl group of 1 to 5 carbon atoms; $R^2$ represents a bivalent linking group; and $R^3$ represents a cyclic group containing —$SO_2$— within the ring skeleton.)

[Chemical Formula 2]

$$X-Q^1-Y^1-SO_3^-  \quad (I)$$

(In the formula (I), X represents a cyclic group of 3 to 30 carbon atoms which may contain a substituent; $Q^1$ represents a bivalent linking group which contains an oxygen atom; and $Y^1$ represents an alkylene group of 1 to 4 carbon atoms which may contain a substituent, or a fluorinated alkylene group of 1 to 4 carbon atoms which may contain a substituent.)

A second aspect of the present invention is a method of forming a resist pattern, which includes: forming a resist film on a substrate using the positive resist composition of the first aspect of the present invention; exposing the resist film; and developing the resist film with an alkali to form a resist pattern.

In the present description and claims, the term "aliphatic" is a relative concept used in relation to the term "aromatic", and defined as a group, compound or the like that has no aromaticity.

The term "alkyl group" is a concept containing a linear, branched and cyclic monovalent saturated hydrocarbon group, unless another definition is particularly provided. The same definition can also be applied to an alkyl group included in an alkoxy group.

The term "alkylene group" is a concept containing a linear, branched, and cyclic bivalent saturated hydrocarbon group, unless another specific definition is provided.

The term "halogenated alkyl group" means a group in which a part or all of the hydrogen atoms in an alkyl group are substituted with a halogen atom, and examples of the halogen atom include a fluorine atom, a chlorine atom, a bromine atom, and an iodine atom.

The term "fluorinated alkyl group" or "fluorinated alkylene group" means a group in which a part or all of the hydrogen atoms in an alkyl group or alkylene group are substituted with fluorine atoms.

The term "structural unit" means a monomer unit that contributes to the formation of a polymeric compound (resin, polymer, copolymer).

The term "structural unit derived from an acrylate ester" means a structural unit that is formed by the cleavage of the ethylenic double bond of an acrylate ester.

The term "acrylate ester" is a concept containing an acrylate ester in which a hydrogen atom is bonded to a carbon atom at the α-position, and an α-substituted acrylate ester in which a hydrogen atom bonded to the carbon atom at the α-position is substituted with a substituent (an atom or group other than a hydrogen atom). Examples of the substituent bonded to the carbon atom at the α-position include an alkyl group of 1 to 5 carbon atoms, a halogenated alkyl group of 1 to 5 carbon atoms, and a hydroxyalkyl group of 1 to 5 carbon atoms.

Hereinafter, an alkyl group of 1 to 5 carbon atoms and a halogenated alkyl group of 1 to 5 carbon atoms are sometimes referred to as a lower alkyl group and a halogenated lower alkyl group, respectively.

Here, the carbon atom at the α-position of an acrylate ester means the carbon atom to which the carbonyl group is bonded, unless another definition is provided.

The term "exposure" is used as a general concept involving irradiation with any form of radiation.

Effects of the Invention

According to the present invention, there are provided a positive resist composition which excels in the resist pattern shape, and a method of forming a resist pattern using the positive resist composition.

BEST MODE FOR CARRYING OUT THE INVENTION

<<Positive Resist Composition>>

The positive resist composition of the present invention (hereinafter, sometimes referred to as "resist composition" to simplify the description) includes a base component (A) which exhibits increased solubility in an alkali developing solution under action of an acid (hereinafter, referred to as "component (A)"), and an acid generator component (B) which generates an acid upon exposure (hereinafter, referred to as "component (B)").

In the positive resist composition, an acid is generated from the component (B) when radiation is irradiated, and the component (A) increases solubility in an alkali developing solution under action of the acid generated from the component (B) Therefore, in a resist pattern formation, when a selective exposure is conducted on a resist film formed by using the positive resist composition, the exposed portions of the resist film increase in solubility in an alkali developing solution, whereas the unexposed portions do not change solubility in an alkali developing solution. As a result, a resist pattern can be formed by the following developing treatment with alkali.

<Component (A)>

In the present invention, the term "base component" means an organic compound with a film-formation capability.

As the base component, an organic compound having a molecular weight of 500 or more is preferably used.

When a molecular weight of the organic compound is 500 or more, the film-forming capability can be improved, and a nano-level resist pattern can easily be formed.

The "organic compounds having a molecular weight of 500 or more" used as the base component can broadly be separated into non-polymers and polymers.

As the non-polymer, those which have a molecular weight of 500 to less than 4,000 are typically used. Hereinafter, a non-polymer having a molecular weight of 500 to less than 4,000 is referred to as "low molecular weight compound".

As the polymers, those which have a molecular weight of 2,000 or more are typically used. Hereinafter, a polymer having a molecular weight of 2,000 or more is referred to as "polymeric compound". In the case of using a polymer compound, the polystyrene equivalent weight average molecular weight determined using gel permeation chromatography (GPC) shall be used as the "molecular weight". Hereinafter, polymer compounds are sometimes referred to as "resin".

In the present invention, the component (A) includes a polymeric compound (A1) (hereinafter, referred to as "component (A1)") which includes a structural unit (a0) represented by the general formula (a0-1) and a structural unit (a1) derived from an acrylate ester containing an acid dissociable, dissolution inhibiting group.

[Polymeric Compound (A1)]

The component (A1) is a polymeric compound containing the structural unit (a0) and the structural unit (a1).

Also, it is preferable that the component (A1) further include a structural unit (a2) derived from an acrylate ester which has a lactone-containing cyclic group, in addition to the structural units (a0) and (a1).

Also, it is preferable that the component (A1) further include a structural unit (a3) derived from an acrylate ester which has a polar group-containing aliphatic hydrocarbon group, in addition to the structural units (a0) and (a1), or the structural units (a0), (a1) and (a2).

(Structural Unit (a0))

In the above formula (a0-1), $R^1$ represents a hydrogen atom, a lower alkyl group of 1 to 5 carbon atoms, or a halogenated lower alkyl group of 1 to 5 carbon atoms.

The lower alkyl group for $R^1$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated lower alkyl group for $R^1$ is a group in which a part or all of the hydrogen atoms in the aforementioned lower alkyl group are substituted with halogen atoms. Examples of the halogen atom include a fluorine atom, a chlorine atom, an iodine atom, and a bromine atom. Of these, a fluorine atom is preferable.

$R^1$ is preferably a hydrogen atom, a lower alkyl group, or a fluorinated lower alkyl group, and most preferably a hydrogen atom or a methyl group in terms of industrial availability.

In the above formula (a0-1), $R^2$ represents a bivalent linking group.

Suitable examples of $R^2$ include a bivalent hydrocarbon group which may contain a substituent and a bivalent linking group containing a hetero atom.

With Respect to the Bivalent Hydrocarbon Group which may Contain a Substituent

In $R^2$, the expression that a hydrocarbon group "contains a substituent" means that a part or all of the hydrogen atoms within the hydrocarbon group are substituted with groups or atoms other than hydrogen atoms.

The hydrocarbon group may be an aliphatic hydrocarbon group, or may be an aromatic hydrocarbon group. The aliphatic hydrocarbon group means a hydrocarbon group which contains no aromaticity.

The aliphatic hydrocarbon group may be saturated or unsaturated, and is typically preferably saturated.

Specific examples of the aliphatic hydrocarbon group include a linear or branched aliphatic hydrocarbon group, and an aliphatic hydrocarbon group containing a ring within the structure.

The linear or branched aliphatic hydrocarbon group preferably has 1 to 10 carbon atoms, more preferably 1 to 8 carbon atoms, still more preferably 1 to 5 carbon atoms, and most preferably 1 to 2 carbon atoms.

As the linear aliphatic hydrocarbon group, a linear alkylene group is preferable, and specific examples thereof include a methylene group [—$CH_2$—], an ethylene group [—($CH_2$)$_2$—], a trimethylene group [—($CH_2$)$_3$—], a tetramethylene group [—($CH_2$)$_4$—], and a pentamethylene group [—($CH_2$)$_5$—].

The branched aliphatic hydrocarbon group is preferably a branched alkylene group, and specific examples thereof include alkylalkylene groups such as alkylmethylene groups (for example, —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—); alkylethylene groups (for example, —CH($CH_3$)$CH_2$—, —CH($CH_3$)CH($CH_3$)—, —C($CH_3$)$_2$$CH_2$—, —CH($CH_2CH_3$)$CH_2$—, or —CH($CH_2CH_3$)$_2$—$CH_2$—); alkyltrimethylene groups (for example, —CH($CH_3$)$CH_2CH_2$— or —$CH_2$CH($CH_3$)$CH_2$—); and alkyltetramethylene groups (for example, —CH($CH_3$)$CH_2CH_2CH_2$— or —$CH_2$CH($CH_3$)$CH_2CH_2$—). The alkyl group in the alkylalkylene group is preferably a linear alkyl group of 1 to 5 carbon atoms.

The chain-like aliphatic hydrocarbon group may or may not contain a substituent. Examples of the substituent include a fluorine atom, a fluorinated lower alkyl group of 1 to 5 carbon atoms, and an oxygen atom (=O).

Examples of the aliphatic hydrocarbon group containing a ring within the structure include a cyclic aliphatic hydrocarbon group (a group in which two hydrogen atoms have been removed from an aliphatic hydrocarbon ring); and a group in which the above cyclic aliphatic hydrocarbon group is bonded to the terminal of the aforementioned chain-like (linear or branched) aliphatic hydrocarbon group or located in the middle of the aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be a polycyclic group or may be a monocyclic group. The monocyclic group is preferably a group in which two hydrogen atoms have been removed from a monocycloalkane of 3 to 6 carbon atoms, and examples of the monocycloalkane include cyclopentane and cyclohexane.

The polycyclic group is preferably a group in which two hydrogen atoms have been removed from a polycycloalkane of 7 to 12 carbon atoms, and examples of the polycycloalkane include adamantane, norbornane, isobornane, tricyclodecane, and tetracyclododecane.

The cyclic aliphatic hydrocarbon group may or may not contain a substituent. Examples of the substituent include a lower alkyl group of 1 to 5 carbon atoms, a fluorine atom, a fluorinated lower alkyl group of 1 to 5 carbon atoms, and an oxygen atom (=O).

Examples of the aromatic hydrocarbon group include bivalent aromatic hydrocarbon groups in which one hydrogen atom has been further removed from an aromatic hydrocarbon nucleus of a monovalent aromatic hydrocarbon group such as a phenyl group, a biphenyl group, a fluorenyl group, a naphthyl group, an anthryl group and a phenanthryl group; aromatic hydrocarbon groups in which a part of the carbon atoms constituting the ring of the above bivalent aromatic hydrocarbon group are substituted with hetero atoms such as an oxygen atom, a sulfur atom, a nitrogen atom and the like; aromatic hydrocarbon groups in which one hydrogen atom has been further removed from an aromatic hydrocarbon nucleus of an arylalkyl group such as a benzyl group, a phenethyl group, a 1-naphthylmethyl group, a 2-naphthylmethyl group, a 1-naphthylethyl group, and a 2-naphthylethyl group.

The aromatic hydrocarbon group may or may not contain a substituent. Examples of substituents include a lower alkyl group of 1 to 5 carbon atoms, a fluorine atom, a fluorinated lower alkyl group of 1 to 5 carbon atoms, and an oxygen atom (=O).

With Respect to the Bivalent Linking Group Containing a Hetero Atom

In $R^2$, the hetero atom in the "bivalent linking group containing a hetero atom" means an atom other than a carbon atom and hydrogen atom, and examples thereof include an oxygen atom, a nitrogen atom, a sulfur atom, and a halogen atom.

Specific examples of the bivalent linking group containing a hetero atom include —O—, —C(=O)—, —C(=O)—O—, a carbonate linkage (—O—C(=O)—O—), —NH—, —NR$^{04}$— (wherein, R$^{04}$ represents an alkyl group), —NH—C(=O)—, and =N—. Also, a combination of the above "bivalent linking group containing a hetero atom" and a bivalent hydrocarbon group can be used. Examples of the bivalent hydrocarbon group include the same groups as those described above for "bivalent hydrocarbon group which may contain a substituent", and of these, a linear or branched aliphatic hydrocarbon group is preferably used.

$R^2$ may or may not contain an acid dissociable portion within the structure.

The term "acid dissociable portion" means a portion which dissociates under action of an acid generated upon exposure in an organic group. When $R^2$ contains an acid dissociable portion, it is preferable to contain an acid dissociable portion which has a tertiary carbon atom.

In the present invention, the bivalent linking group for $R^2$ is preferably an alkylene group, a bivalent aliphatic cyclic group, or a bivalent linking group containing a hetero group. Of these, an alkylene group is particularly preferable.

If $R^2$ is an alkylene group, the alkylene group preferably has 1 to 10 carbon atoms, more preferably 1 to 6 carbon atoms, still more preferably 1 to 4 carbon atoms, and most preferably 1 to 3 carbon atoms. Specific examples thereof include the same linear alkylene groups and branched alkylene groups as those described above.

When $R^2$ is a bivalent aliphatic cyclic group, examples of the aliphatic cyclic group include the same cyclic aliphatic hydrocarbon groups as those described above in "aliphatic hydrocarbon group containing a ring within the structure".

It is particularly preferable that the aliphatic cyclic group be a group in which two or more hydrogen atoms have been removed from cyclopentane, cyclohexane, norbornane, isobornane, adamantane, tricyclodecane or tetracyclododecane.

When $R^2$ is a bivalent linking group containing a hetero atom, preferable examples of the linking group include —O—, —C(=O)—O—, —C(=O)—, —O—C(=O)—O—, —C(=O)—NH—, —NH— (wherein, H may be substituted with a substituent such as an alkyl group and an acyl group), —S—, —S(=O)$_2$—, —S(=O)$_2$—O—, a group represented by the formula -A-O—B—, and a group represented by the formula -[A-C(=O)—O]$_d$—B—. Herein, A and B each independently represents a bivalent hydrocarbon group which may contain a substituent, and d represents an integer of 0 to 3.

When $R^2$ is —NH—, said H may be substituted with a substituent such as an alkyl group and an acyl group. The substituent (an alkyl group, an acyl group, or the like) preferably has 1 to 10 carbon atoms, more preferably 1 to 8 carbon atoms, and still more preferably 1 to 5 carbon atoms.

In -A-O—B— or -[A-C(=O)—O—]$_d$—B—, A and B each independently represents a bivalent hydrocarbon group which may contain a substituent.

Examples of the bivalent hydrocarbon group which may contain a substituent for A and B include the same groups as those described above as "bivalent hydrocarbon groups which may contain a substituent" for $R^2$.

A is preferably a linear aliphatic hydrocarbon group, more preferably a linear alkylene group, still more preferably a linear alkylene group of 1 to 5 carbon atoms, and particularly preferably a methylene group or an ethylene group.

B is preferably a linear or branched aliphatic hydrocarbon group, and more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

Also, in a group represented by the formula -[A-C(=O)—O—]$_d$—B—, d represents an integer of 0 to 3, more preferably an integer of 0 to 2, still more preferably 0 or 1, and most preferably 1.

In the above formula (a0-1), $R^3$ represents a cyclic group containing —SO$_2$— within the ring skeleton (cyclic skeleton).

The cyclic group for $R^3$ refers to a cyclic group containing a ring which has —SO$_2$— within the ring skeleton, and this ring is counted as the first ring. A cyclic group in which the only ring structure is this ring is referred to as a monocyclic group, and a cyclic group containing other ring structures is referred to as polycyclic group regardless of the structure of the other rings. The cyclic group for $R^3$ may be a monocyclic group or may be a polycyclic group.

It is particularly preferable that $R^3$ include a cyclic group containing —O—$SO_2$— within the ring skeleton, that is, a sultone ring.

The cyclic group for $R^3$ is preferably 3 to 30 carbon atoms, more preferably 4 to 20 carbon atoms, still more preferably 4 to 15 carbon atoms, and particularly preferably 4 to 12 carbon atoms.

Here, the number of carbon atoms described above means the number of carbon atoms constituting the ring skeleton, and does not include the number of carbon atoms included in a substituent.

The cyclic group for $R^3$ may be an aliphatic cyclic group, or may be an aromatic cyclic group.

$R^3$ is preferably an aliphatic cyclic group.

Examples of the aliphatic cyclic group for $R^3$ include groups in which a part of the carbon atoms constituting the cyclic skeleton(s) of the cyclic aliphatic hydrocarbon group described above are substituted with —$SO_2$— or —O—$SO_2$—.

Specific examples of the above monocyclic group include: groups in which one hydrogen atom has been eliminated from a monocycloalkane in which —$CH_2$— constituting the ring skeleton has been substituted with —$SO_2$—; and groups in which one hydrogen atom has been eliminated from a monocycloalkane in which —$CH_2$—$CH_2$— constituting the ring skeleton has been substituted with —O—$SO_2$—. Also, specific examples of the above polycyclic group include: groups in which one hydrogen atom has been eliminated from a polycycloalkane (bicycloalkane, tricycloalkane, tetracycloalkane, or the like) in which —$CH_2$— constituting the ring skeleton has been substituted with —$SO_2$—; and groups in which one hydrogen atom has been eliminated from a polycycloalkane in which —$CH_2$—$CH_2$— constituting the ring skeleton has been substituted with —O—$SO_2$—.

The cyclic group for $R^3$ may contain a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group, and a cyano group. Here, R" represents a hydrogen atom or an alkyl group.

The alkyl group for the substituent is preferably an alkyl group of 1 to 6 carbon atoms. The alkyl group is preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is particularly preferable.

The alkoxy group for the substituent is preferably an alkoxy group of 1 to 6 carbon atoms. The alkoxy group is preferably a linear or branched alkoxy group. Specific examples thereof include groups in which an oxygen atom (—O—) has been bonded to an alkyl group described above as the alkyl group for the substituent.

Examples of the halogen atom for the substituent include a fluorine atom, a chlorine atom, a bromine atom, and an iodine atom. Of these, a fluorine atom is preferable.

Examples of the halogenated alkyl group for the substituent include a group in which a part or all of the hydrogen atoms within an alkyl group described above as the alkyl group for the substituent are substituted with the above halogen atoms. The halogenated alkyl group is preferably a fluorinated alkyl group, and particularly preferably a perfluoroalkyl group.

Each of R" within the above —COOR" and —OC(=O)R" is preferably a hydrogen atom, or a linear, branched, or cyclic alkyl group of 1 to 15 carbon atoms.

In the case that R" is a linear or branched alkyl group, R" preferably has 1 to 10 carbon atoms, more preferably 1 to 5 carbon atoms, and still more preferably a methyl group or an ethyl group.

In the case that R" is a cyclic alkyl group, the number of carbon atoms is preferably 3 to 15, more preferably 4 to 12, and most preferably 5 to 10. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent. Specific examples include groups in which at least one hydrogen atom has been removed from a monocycloalkane such as cyclopentane and cyclohexane; and groups in which at least one hydrogen atom has been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include groups in which at least one hydrogen atom of the alkyl group described above for the substituent has been substituted with hydroxyl group(s).

More specific examples of $R^3$ include groups represented by the general formulae (3-1) to (3-4) shown below.

[Chemical Formula 3]

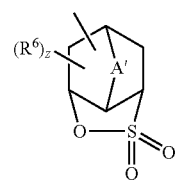

(3-1)

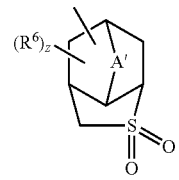

(3-2)

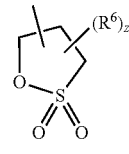

(3-3)

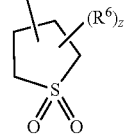

(3-4)

(In the above formulae, A' represents an oxygen atom, a sulfur atom, or an alkylene group of 1 to 5 carbon atoms which may contain an oxygen atom or a sulfur atom; z represents an integer of 0 to 2; $R^6$ represents an alkyl group, an alkoxy group, a halogenated alkyl group, a hydroxyl group, —COOR", —OC(=O)R", a hydroxyalkyl group or a cyano group; and R" represents a hydrogen atom or an alkyl group.)

In the above formulae (3-1) to (3-4), A' represents an oxygen atom, a sulfur atom, or an alkylene group of 1 to 5 carbon atoms which may contain an oxygen atom (—O—) or a sulfur atom (—S—).

The alkylene group of 1 to 5 carbon atoms for A' is preferably a linear or branched alkylene group, and examples thereof include a methylene group, an ethylene group, an n-propylene group, and an isopropylene group.

When the alkylene group for A' contains an oxygen atom or a sulfur atom, a group in which —O— or —S— is located at the terminal of the alkylene group or between two carbon atoms constituting the alkylene group can be mentioned as an example. Specific examples thereof include —O—CH$_2$—, —CH$_2$—O—CH$_2$—, —S—CH$_2$— and —CH$_2$—S—CH$_2$—.

A' is preferably —O— or an alkylene group of 1 to 5 carbon atoms, more preferably an alkylene group of 1 to 5 carbon atoms, and most preferably a methylene group.

z may be any of an integer of 0 to 2, and most preferably 0.

Here, when z is 2, a plurality of R$^2$ may be the same, or may be different from each other.

Examples of the alkyl group, alkoxy group, halogenated alkyl group, —COOR", —OC(=O)R", and a hydroxyalkyl group for R$^6$ include the same as the alkyl group, alkoxy group, halogenated alkyl group, —COOR", —OC(=O)R", and a hydroxyalkyl group, respectively, described above as the substituent which the cyclic group for R$^3$ may contain.

Specific cyclic groups represented by the above general formulae (3-1) to (3-4) are shown below. Here, in the formulae, the term "Ac" represents an acetyl group.

[Chemical Formula 4]

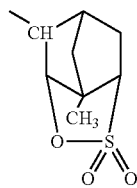
(3-1-1)

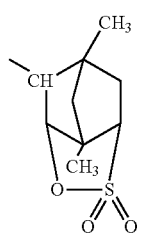
(3-1-2)

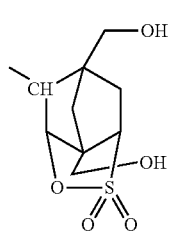
(3-1-3)

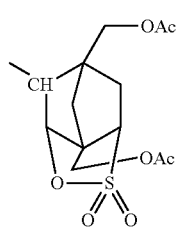
(3-1-4)

-continued

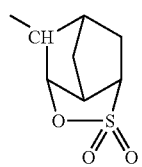
(3-1-5)

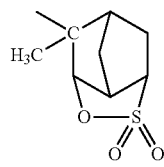
(3-1-6)

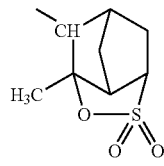
(3-1-7)

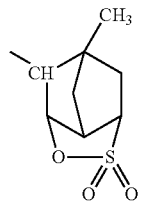
(3-1-8)

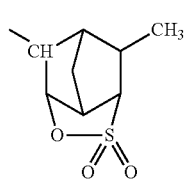
(3-1-9)

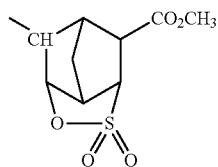
(3-1-10)

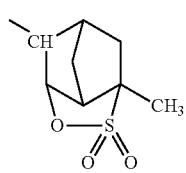
(3-1-11)

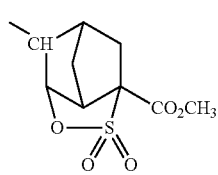
(3-1-12)

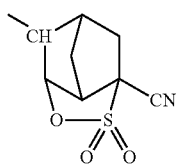 (3-1-13)
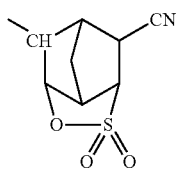 (3-1-14)
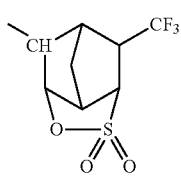 (3-1-15)
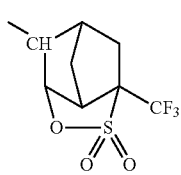 (3-1-16)
[Chemical Formula 5]
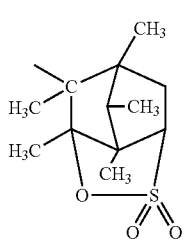 (3-1-17)
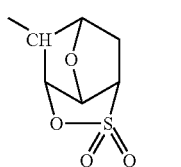 (3-1-18)
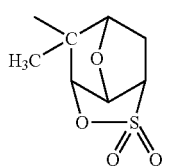 (3-1-19)
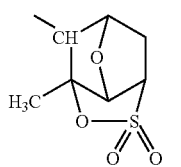 (3-1-20)
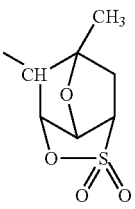 (3-1-21)
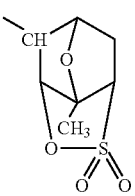 (3-1-22)
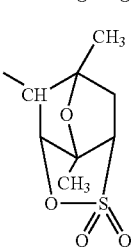 (3-1-23)
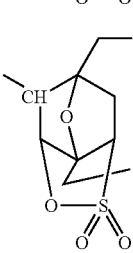 (3-1-24)
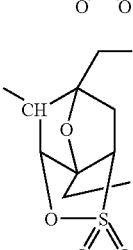 (3-1-25)
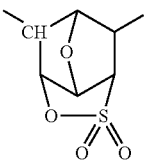 (3-1-26)
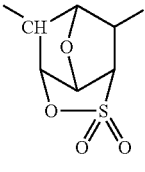 (3-1-27)
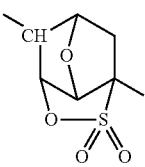 (3-1-28)

-continued

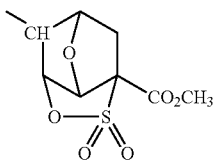
(3-1-29)

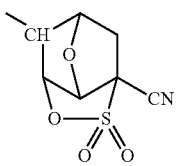
(3-1-30)

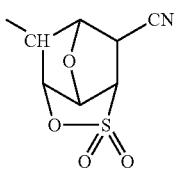
(3-1-31)

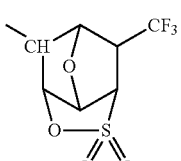
(3-1-32)

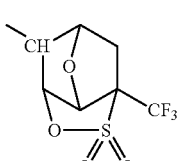
(3-1-33)

[Chemical Formula 6]

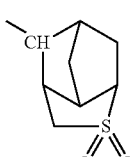
(3-2-1)

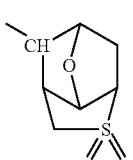
(3-2-2)

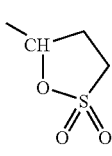
(3-3-1)

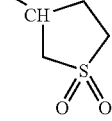
(3-4-1)

Of these, $R^3$ is preferably a group represented by general formula (3-1), (3-1) or (3-4) shown above, and particularly preferably a group represented by general formula (3-1) shown above.

Specifically, $R^3$ is preferably at least one selected from the group consisting of groups represented by formulae (3-1-1), (3-1-18), (3-3-1) and (3-4-1) shown above, and most preferably a group represented by formula (3-1-1).

In the present invention, the structural unit (a0) is particularly preferably a structural unit represented by general formula (a0-1-11) shown below.

[Chemical Formula 7]

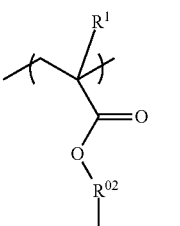
(a0-1-11)

(In the above formula, $R^1$ is as defined above; $R^{02}$ represents a linear or branched alkylene group; and A' is as defined above.)

The linear or branched alkylene group for $R^{02}$ preferably has 1 to 10 carbon atoms, more preferably 1 to 8 carbon atoms, still more preferably 1 to 5 carbon atoms, still more preferably 1 to 3 carbon atoms, and most preferably 1 or 2 carbon atoms.

A' is preferably a methylene group, an oxygen atom (—O—), or an sulfur atom (—S—).

As the structural unit (a0), one type may be used alone, or two or more types may be used in combination.

In the component (A1), the proportion of the structural unit (a0) is preferably 1 to 60 mol %, more preferably 5 to 50 mol %, still more preferably 10 to 45 mol %, and most preferably 20 to 40 mol %, based on the combined total of all structural units constituting the component (A1), because it excels in MEF, the resist pattern shape (for example, rectangularity in case of a line pattern, and circularity in case of a hole pattern), CDU (critical dimension uniformity), LWR (line width roughness) and the like.

(Structural Unit (a1))

Structural unit (a1) is a structural unit other than the above structural unit (a0) and derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) alkali-insoluble prior to dissociation, and then following dissociation under action of an acid, causes the entire component (A1) to change to an alkali-soluble state. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of an acrylate ester having a hydrogen atom bonded to the α-position and a methacrylate ester having a methyl group bonded to the α-position.

Here, the term "tertiary alkyl ester" means a structure in which an ester is formed by substituting the hydrogen atom of the carboxyl group with a chain-like or cyclic alkyl group, and a tertiary carbon atom within the chain-like or cyclic alkyl group is bonded to the oxygen atom at the terminal of the carbonyloxy group (—C(O)—O—). In the tertiary alkyl ester, the bond of the oxygen atom with the tertiary carbon atom is cleaved under action of an acid.

Here, the chain-like or cyclic alkyl group may contain a substituent.

Hereinafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of the tertiary alkyl ester-type acid dissociable, dissolution inhibiting groups include aliphatic branched, acid dissociable, dissolution inhibiting groups and aliphatic cyclic group-containing acid diccociable, dissolution inhibiting groups.

Here, the term "aliphatic branched" means to contain a branched structure having no aromaticity. The "aliphatic branched, acid dissociable, dissolution inhibiting group" is not limited to groups (hydrocarbon groups) composed of carbon atoms and hydrogen atoms, and is preferably a hydrocarbon group. Further, the "hydrocarbon group" may be either saturated or unsaturated, and is preferably saturated.

As the aliphatic branched, acid dissociable, dissolution inhibiting group, a group represented by the formula "—C(R$^{71}$)(R$^{72}$)(R$^{73}$)" can be used. In the formula, R$^{71}$ to R$^{73}$ each independently represents a linear alkyl group of 1 to 5 carbon atoms. The group represented by —C(R$^{71}$)(R$^{72}$)(R$^{73}$) preferably has 4 to 8 carbon atoms, and specific examples thereof include a tert-butyl group, a 2-methyl-2-butyl group, a 2-methyl-2-pentyl group, and a 3-methyl-3-pentyl group. Of these, a tert-butyl group is particularly preferable.

The term "aliphatic cyclic group" means a monocyclic or polycyclic group which has no aromaticity.

The "aliphatic cyclic group" within the structural unit (a1) may or may not contain a substituent. Examples of the substituent include a lower alkyl group of 1 to 5 carbon atoms, a lower alkoxy group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituents is not limited to groups (hydrocarbon groups) composed of carbon atoms and hydrogen atoms, and is preferably a hydrocarbon group. Further, the "hydrocarbon group" may be either saturated or unsaturated, and is preferably saturated. The "aliphatic cyclic group" is preferably a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, in which a lower alkyl group of 1 to 5 carbon atoms, a fluorine atom, or a fluorinated lower alkyl group of 1 to 5 carbon atoms may or may not be included as a substituent. Specific examples thereof include groups in which at least one hydrogen atom has been removed from a monocycloalkane such as cyclopentane and cyclohexane; and groups in which at least one hydrogen atom has been removed from a polycycloalkane such as adamantane, norbornane, isobornane, tricyclodecane and tetracyclododecane. Also, a part of carbon atoms constituting the ring(s) of groups in which at least one hydrogen atom has been removed from a monocycloalkane, or groups in which at least one hydrogen atom has been removed from a polycycloalkane have been substituted with ether oxygen atoms (—O—).

Examples of aliphatic cyclic group-containing acid dissociable, dissolution inhibiting groups include: (i) groups having a tertiary carbon atom on the ring skeleton of a monovalent aliphatic cyclic group; and (ii) groups having a monovalent aliphatic cyclic group and a branched alkylene group containing a tertiary carbon atom bonded to the monovalent aliphatic cyclic group.

Specific examples of "(i) groups having a tertiary carbon atom on the ring skeleton of a monovalent aliphatic cyclic group" include groups represented by the general formulae (1-1) to (1-9) shown below.

Specific examples of "(ii) groups having a monovalent aliphatic cyclic group and a branched alkylene group containing a tertiary carbon atom bonded to the monovalent aliphatic cyclic group" include groups represented by general formulae (2-1) to (2-6) shown below.

[Chemical Formula 8]

(1-1)

(1-2)

(1-3)

(1-4)

(1-5)

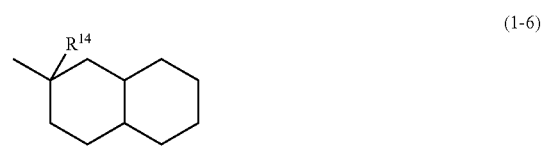

(1-6)

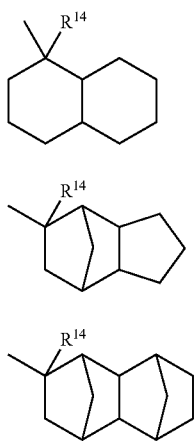

(1-7)

(1-8)

(1-9)

(In the above formulae, $R^{14}$ represents an alkyl group; and g represents an integer of 0 to 8.)

[Chemical Formula 9]

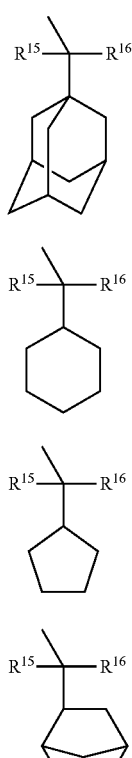

(2-1)

(2-2)

(2-3)

(2-4)

(2-5)

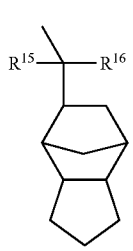

(2-6)

(In the above formulae, $R^{15}$ and $R^{16}$ each independently represents an alkyl group.)

The alkyl group for $R^{14}$ is preferably a linear or branched alkyl group.

The linear alkyl group for $R^{14}$ preferably has 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Of these, a methyl group, an ethyl group or an n-butyl group is preferable, and a methyl group or an ethyl group is more preferable.

The branched alkyl group for $R^{14}$ preferably has 3 to 10 carbon atoms, and more preferably 3 to 5 carbon atoms. Specific examples thereof include an isopropyl group, an isobutyl group, a tert-butyl group, an isopentyl group, and a neopentyl group. Of these, an isopropyl group is most preferable.

g is preferably an integer of 0 to 3, and more preferably an integer of 1 to 3, and still more preferably 1 or 2.

As the alkyl group for $R^{15}$ and $R^{16}$, the same alkyl groups as those described above for $R^{14}$ can be used.

In the above formulae (1-1) to (1-9) and (2-1) to (2-6), a part of the carbon atoms constituting the ring may be substituted with ether oxygen atoms (—O—).

Also, in the above formulae (1-1) to (1-9) and (2-1) to (2-6), a hydrogen atom bonded to a carbon atom constituting the ring may be substituted with a substituent. Examples of the substituent include a lower alkyl group, a fluorine atom, and a fluorinated lower alkyl group.

An "acetal-type acid dissociable, dissolution inhibiting group" generally replaces a hydrogen atom at the terminal of an alkali-soluble group such as a carboxy group and a hydroxyl group, so as to be bonded to an oxygen atom. When an acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of the acetal-type acid dissociable, dissolution inhibiting groups include groups represented by the general formula (p1) shown below.

[Chemical Formula 10]

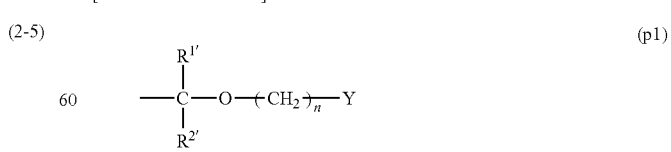

(p1)

(In the formula, $R^{1'}$ and $R^{2'}$ each independently represents a hydrogen atom or a lower alkyl group; n represents an integer of 0 to 3; and Y represents a lower alkyl group or an aliphatic cyclic group.)

In the above formula (p1), n is preferably an integer of 0 to 2, more preferably 0 or 1, and most preferably 0.

As the lower alkyl group for $R^{1\prime}$ and $R^{2\prime}$, the same lower alkyl groups as those described above in $R^1$ can be used. As the lower alkyl group for $R^{1\prime}$ or $R^{2\prime}$, a methyl group or an ethyl group is preferable, and a methyl group is most preferable.

In the present invention, at least one of $R^{1\prime}$ and $R^{2\prime}$ is preferably a hydrogen atom. That is, it is preferable that the acid dissociable, dissolution inhibiting group (p1) be a group represented by the general formula (p1-1) shown below.

[Chemical Formula 11]

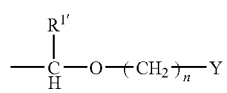

(p1-1)

(In the formula, $R^{1\prime}$, n, and Y are respectively as defined above.)

As the lower alkyl group for Y, the same lower alkyl group as those described above in $R^1$ can be used.

As the aliphatic cyclic group for Y, any of the aliphatic monocyclic or polycyclic groups which have been proposed for conventional ArF resists and the like can be used by being appropriately selected. For example, the same groups as those described above in the "aliphatic cyclic group" can be used.

Further, as the acetal-type, acid dissociable, dissolution inhibiting group, groups represented by general formula (p2) shown below can also be used.

[Chemical Formula 12]

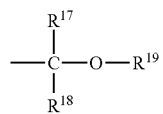

(p2)

(In the above formula, $R^{17}$ and $R^{18}$ each independently represents a linear or branched alkyl group or a hydrogen atom; and $R^{19}$ represents a linear, branched, or cyclic alkyl group. Alternatively, $R^{17}$ and $R^{19}$ each may independently represent a linear or branched alkylene group, in which the terminal of $R^{17}$ and the terminal of $R^{19}$ are bonded to form a ring.)

The alkyl group for $R^{17}$ and $R^{18}$ preferably has 1 to 15 carbon atoms, and may be either linear or branched. Of these, as the alkyl group for $R^{17}$ and $R^{18}$, an ethyl group or a methyl group is more preferable, and a methyl group is most preferable.

It is particularly preferable that either one of $R^{17}$ and $R^{18}$ be a hydrogen atom, and the other be a methyl group.

When $R^{19}$ represents a linear, branched or cyclic alkyl group, it preferably has 1 to 15 carbon atoms, and may be any of linear, branched or cyclic.

When $R^{19}$ represents a linear or branched alkyl group, it preferably has an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Specific examples of the cyclic alkyl group include groups in which one or more hydrogen atoms have been removed from a monocycloalkane or a polycycloalkane such as a bicycloalkane, a tricycloalkane or a tetracycloalkane, in which a fluorine atom or a fluorinated alkyl group may or may not be included as a substituent. Specific examples thereof include groups in which one or more hydrogen atoms have been removed from a monocycloalkane such as cyclopentane and cyclohexane, and a polycycloalkane such as adamantane, norbornane, isobornane, tricyclodecane, and tetracyclododecane. Of these, a group in which one or more hydrogen atoms have been removed from adamantane is preferable.

Also, in the general formula (p2), $R^{17}$ and $R^{19}$ each may independently represent a linear or branched alkylene group (and preferably an alkylene group of 1 to 5 carbon atoms), in which the terminal of IC is bonded to the terminal of $R^{19}$.

In this case, a cyclic group is formed by $R^{17}$, $R^{19}$, the oxygen atom to which $R^{19}$ is bonded, and the carbon atom to which the oxygen atom and $R^{17}$ are bonded. Such a cyclic group is preferably a 4- to 7-membered ring, and more preferably a 4- to 6-membered ring. Specific examples of the cyclic group include a tetrahydropyranyl group and a tetrahydrofuranyl group.

Specific examples of the acetal-type acid dissociable, dissolution inhibiting group include groups represented by the formulae (p3-1) to (p3-12) shown below.

[Chemical Formula 13]

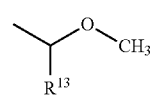

(p3-1)

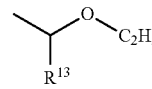

(p3-2)

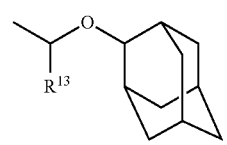

(p3-3)

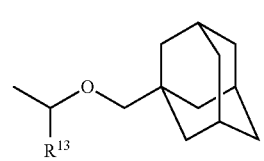

(p3-4)

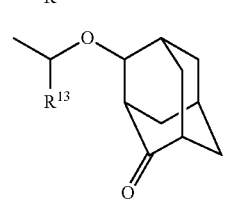

(p3-5)

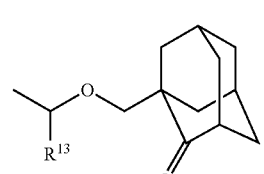

(p3-6)

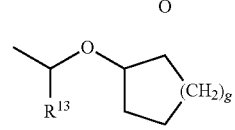

(p3-7)

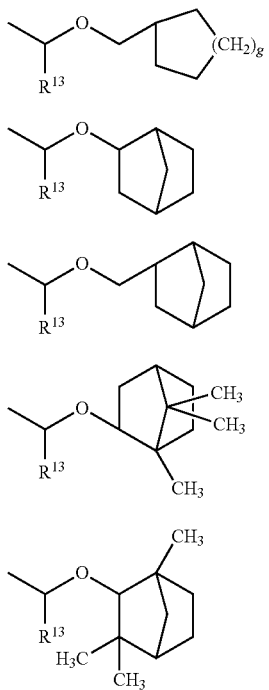

(p3-8)

(p3-9)

(p3-10)

(p3-11)

(p3-12)

(In the formula, $R^{13}$ represents a hydrogen atom or a methyl group; and g is as defined above.)

More specific examples of the structural unit (a1) include a structural unit represented by the general formula (a1-0-1) shown below and a structural unit represented by the general formula (a1-0-2) shown below.

[Chemical Formula 14]

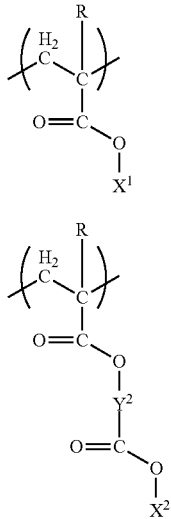

(a1-0-1)

(a1-0-2)

(In the formulae, R represents a hydrogen atom, a lower alkyl group or a halogenated lower alkyl group; $X^1$ represents an acid dissociable, dissolution inhibiting group; $Y^2$ represents a bivalent linking group; and $X^2$ represents an acid dissociable, dissolution inhibiting group.)

In the formula (a1-0-1), R is the same as $R^1$ in the above general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In the general formula (a1-0-2), R is as defined above.

$X^2$ is the same as $X^1$ described above in the general formula (a1-0-1).

Examples of the bivalent linking group for $Y^2$ include the same groups as $R^2$ in the above formula (a0-1).

$Y^2$ is preferably an alkylene group, a bivalent aliphatic cyclic group or a bivalent linking group containing a hetero atom. Of these, $Y^2$ is preferably a bivalent linking group containing a hetero atom, and particularly preferably a linear group containing an oxygen atom as a hetero atom, such as a group containing an ester bond.

Of these, $Y^2$ is preferably a group represented by -A-O—B— or -A-C(=O)—O—B—, and particularly preferably a group represented by —$(CH_2)_x$—C(=O)—O—$(CH_2)_y$—.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by the general formulae (a1-1) to (a1-4) shown below.

[Chemical Formula 15]

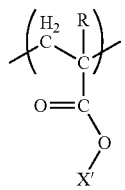

(a1-1)

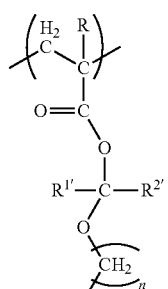

(a1-2)

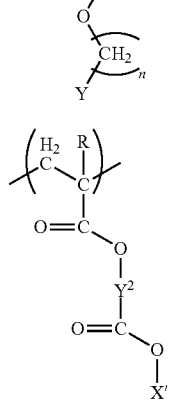

(a1-3)

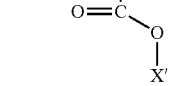

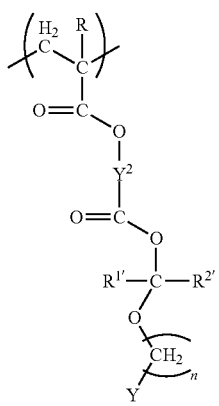
(a1-4)

(In the formula, X' represents a tertiary alkyl ester-type acid dissociable, dissolution inhibiting group; Y represents a lower alkyl group of 1 to 5 carbon atoms, or an aliphatic cyclic group; n represents an integer of 0 to 3; $Y^2$ represents a bivalent linking group; R is as defined above; and $R^{1'}$ and $R^{2'}$ each independently represents a hydrogen atom or a lower alkyl group of 1 to 5 carbon atoms.)

In the above formulae, as X', the same tertiary alkyl ester-type acid dissociable, dissolution inhibiting groups as those described in $X^1$ can be used.

$R^{1'}$, $R^{2'}$, n, and Y are the same as $R^{1'}$, $R^{2'}$, n, and Y, respectively, in the general formula (p1) described above in "acetal-type acid dissociable, dissolution inhibiting group".

$Y^2$ is the same as $Y^2$ in the general formula (a1-0-2).

Specific examples of structural units represented by the general formulae (a1-1) to (a1-4) shown above include the following.

In each of the following formulae, $R^\alpha$ represents a hydrogen atom, a methyl group, or a trifluoromethyl group.

[Chemical Formula 16]

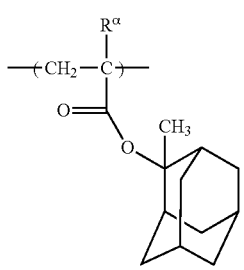
(a1-1-1)

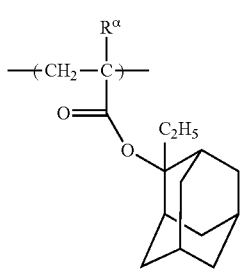
(a1-1-2)

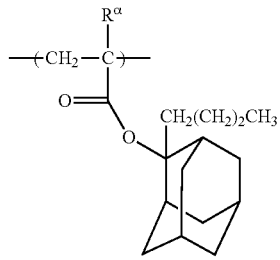
(a1-1-3)

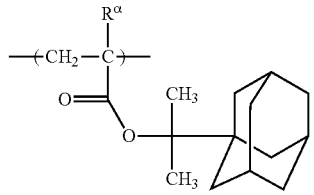
(a1-1-4)

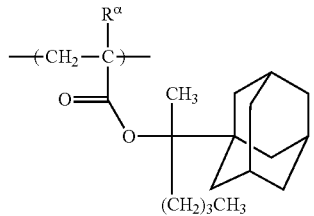
(a1-1-5)

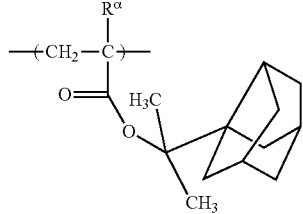
(a1-1-6)

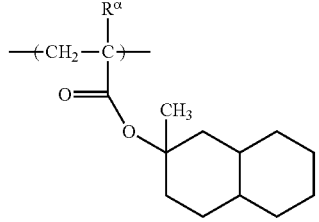
(a1-1-7)

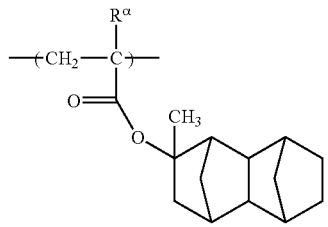
(a1-1-8)

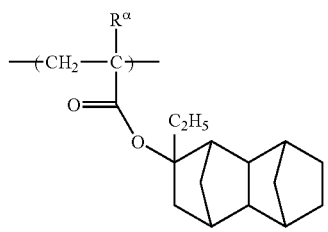
(a1-1-9)

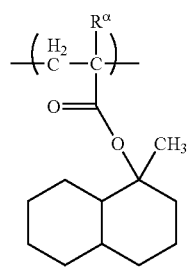 (a1-1-10)
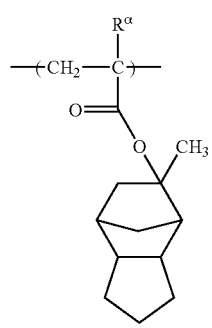 (a1-1-11)
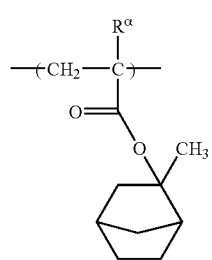 (a1-1-12)
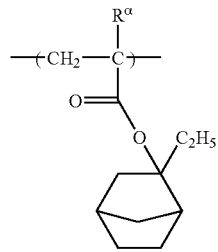 (a1-1-13)
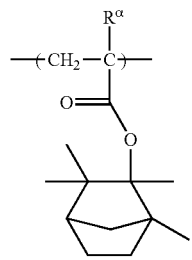 (a1-1-14)
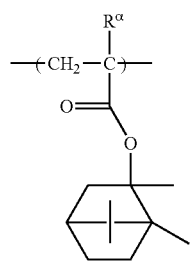 (a1-1-15)
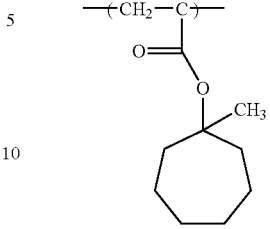 (a1-1-16)
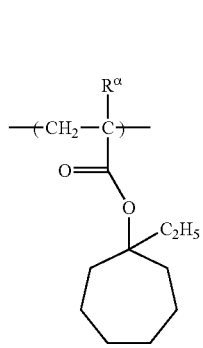 (a1-1-17)
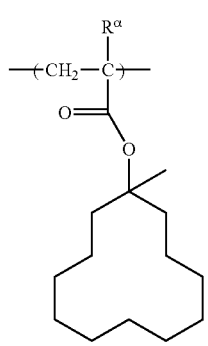 (a1-1-18)
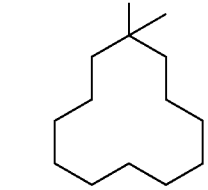 (a1-1-19)
 (a1-1-20)

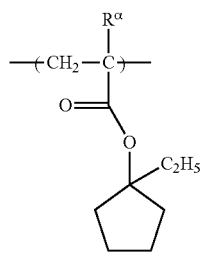
(a1-1-21)
[Chemical Formula 17]
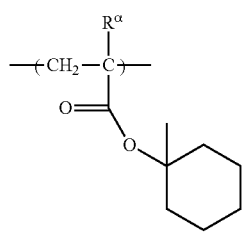
(a1-1-22)
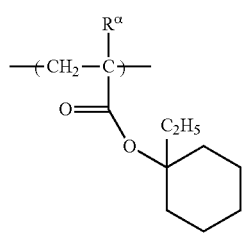
(a1-1-23)
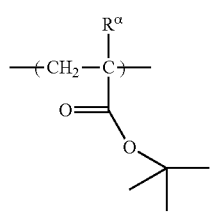
(a1-1-24)
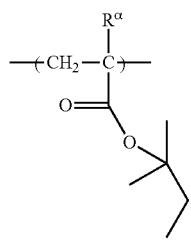
(a1-1-25)
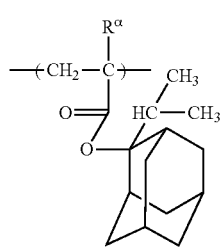
(a1-1-26)
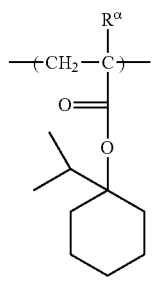
(a1-1-27)
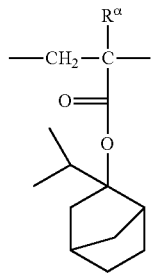
(a1-1-28)
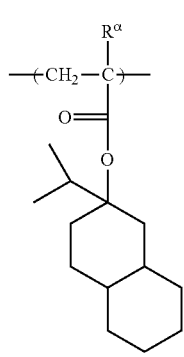
(a1-1-29)
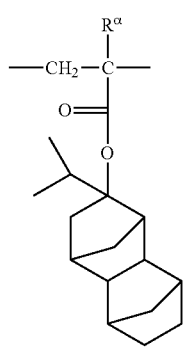
(a1-1-30)
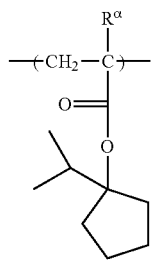
(a1-1-31)

[Chemical Formula 18]
(a1-2-1)
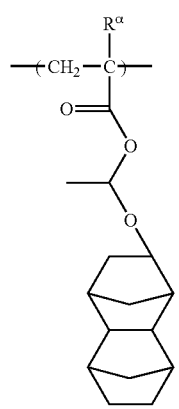
(a1-2-2)
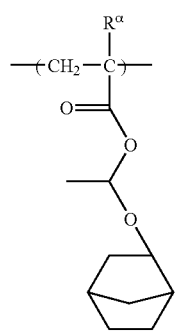
(a1-2-3)
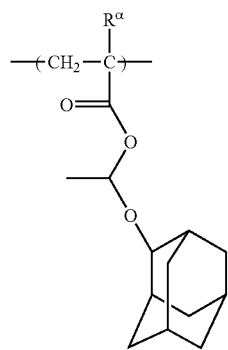
(a1-2-4)
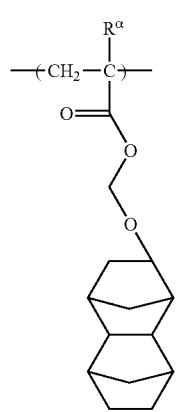
(a1-2-5)
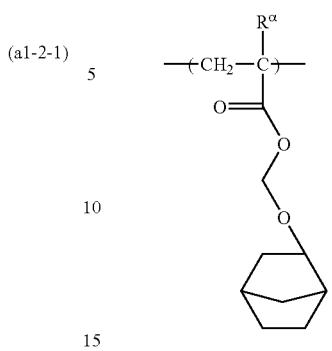
(a1-2-6)
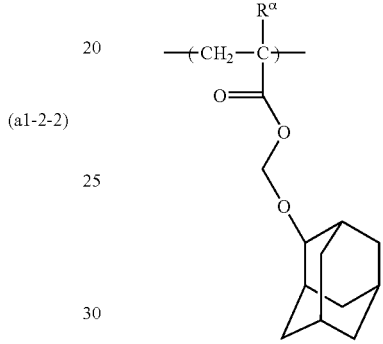
(a1-2-7)
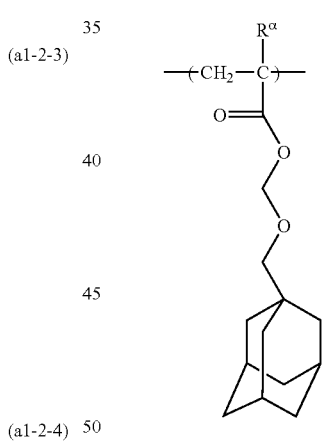
(a1-2-8)
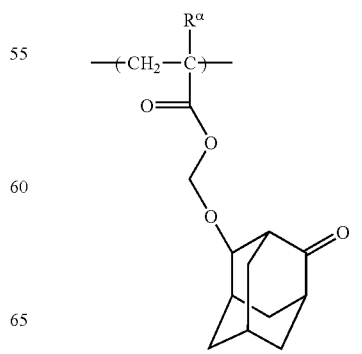

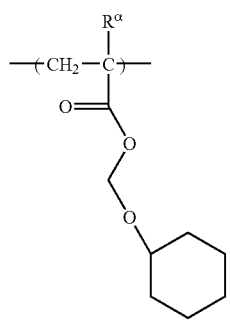
(a1-2-9)
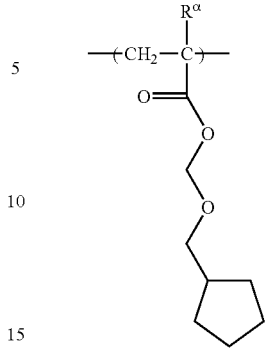
(a1-2-13)
(a1-2-10)
(a1-2-14)
(a1-2-11)
(a1-2-15)
(a1-2-12)
(a1-2-16)
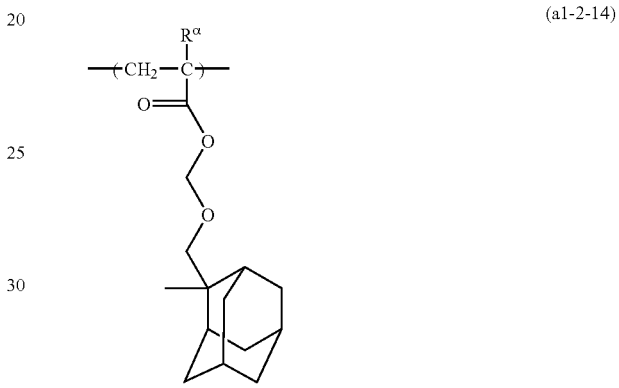
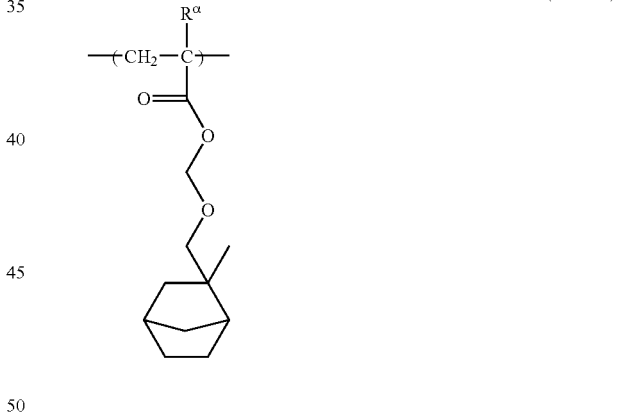
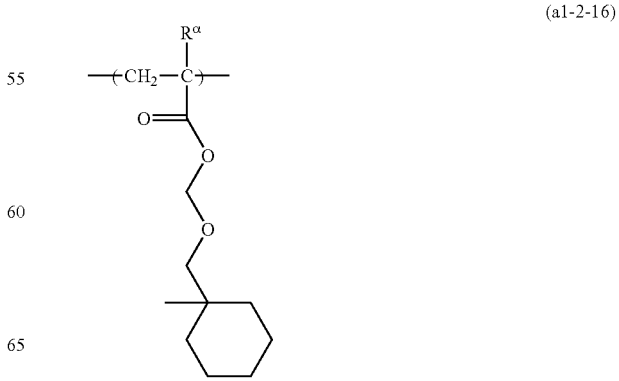

(a1-2-17)
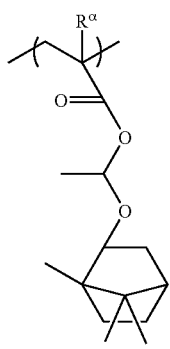
(a1-2-18)
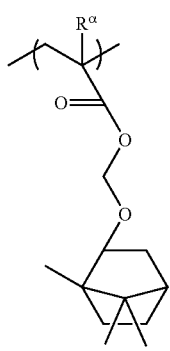
(a1-2-19)
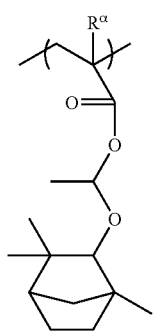
(a1-2-20)
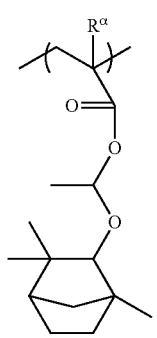
(a1-2-21)
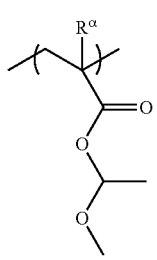
(a1-2-22)
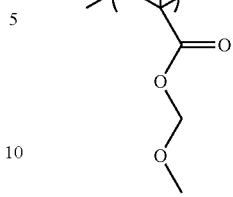
(a1-2-23)
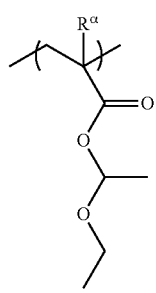
(a1-2-24)
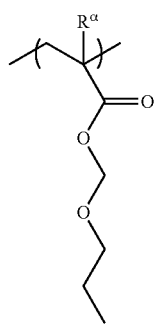
[Chemical Formula 19]
(a1-3-1)
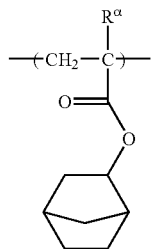

(a1-3-2)
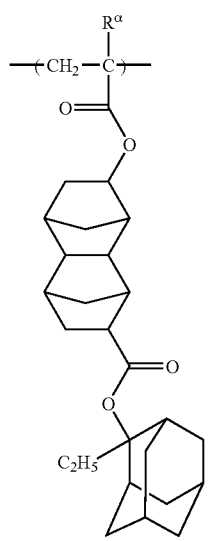
(a1-3-3)
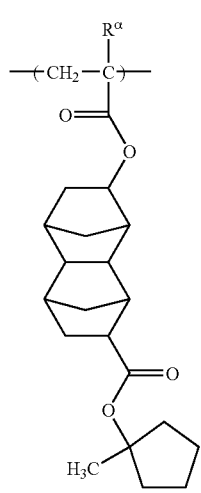
(a1-3-4)
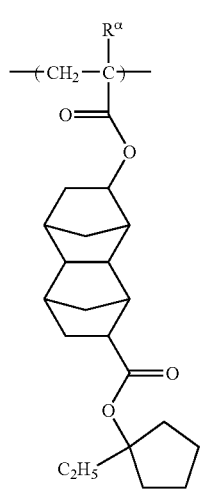
(a1-3-5)
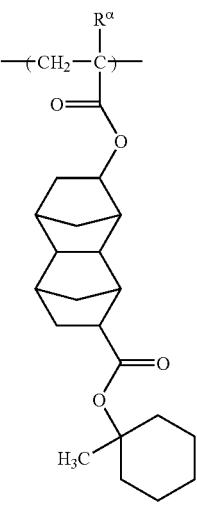
(a1-3-6)
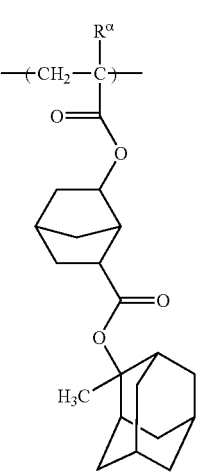
(a1-3-7)

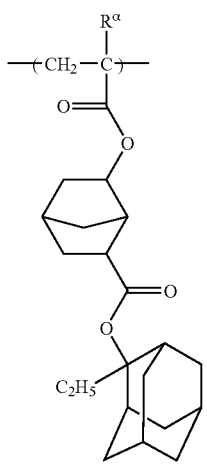 (a1-3-8)
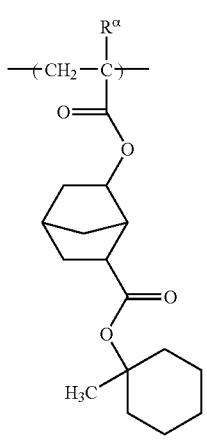 (a1-3-9)
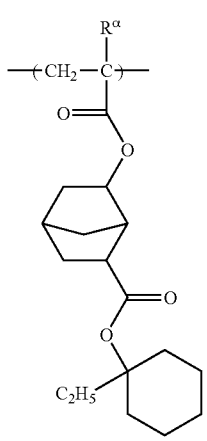 (a1-3-10)
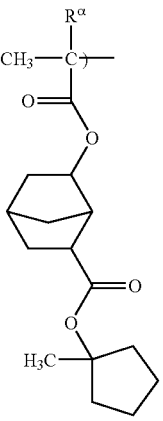 (a1-3-11)
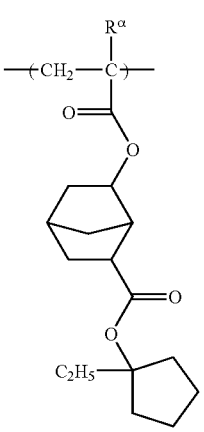 (a1-3-12)
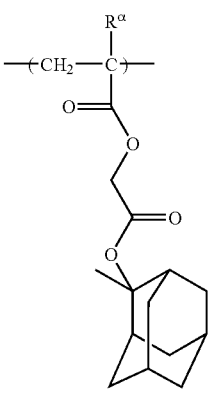 (a1-3-13)
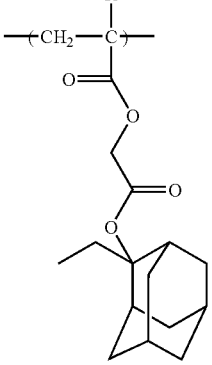 (a1-3-14)

(a1-3-15)
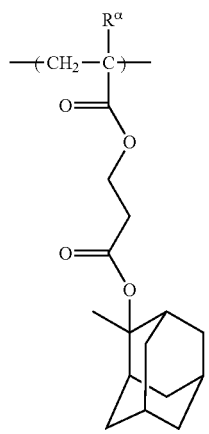
(a1-3-16)
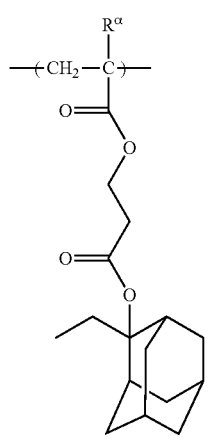
(a1-3-17)
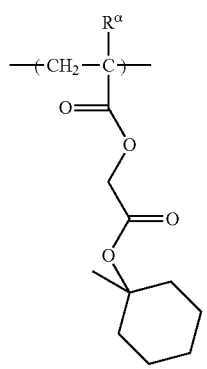
(a1-3-18)
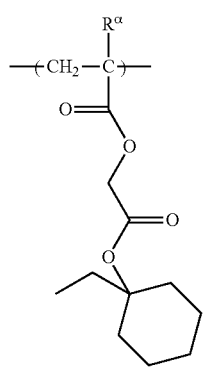
[Chemical Formula 20]
(a1-3-19)
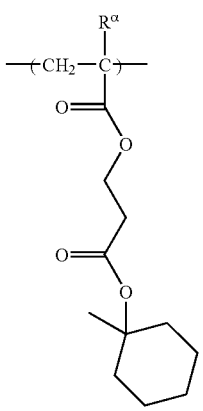
(a1-3-20)
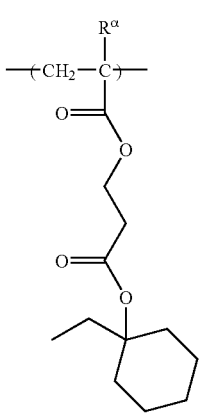
(a1-3-21)
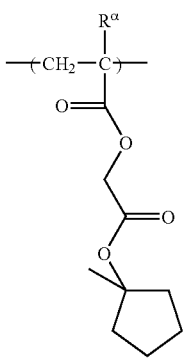
(a1-3-22)
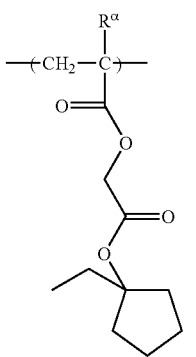

(a1-3-23)
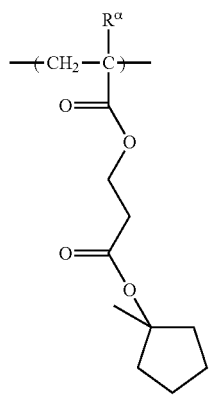
(a1-3-24)
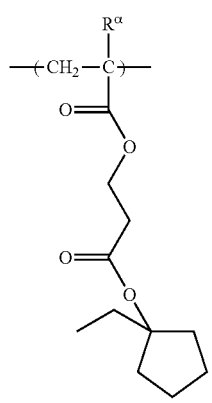
[Chemical Formula 21]
(a1-3-25)
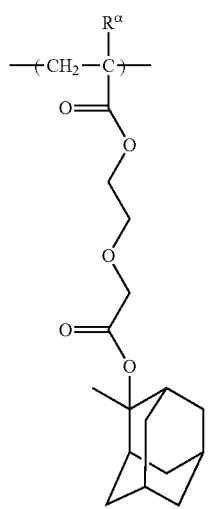
(a1-3-26)
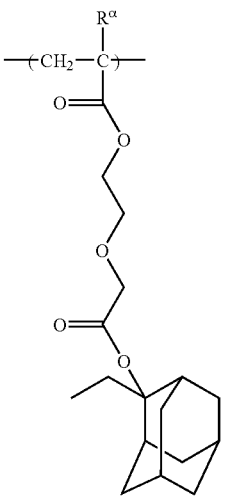
(a1-3-27)
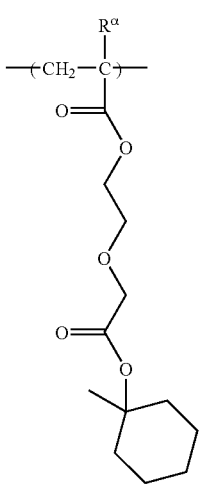
(a1-3-28)
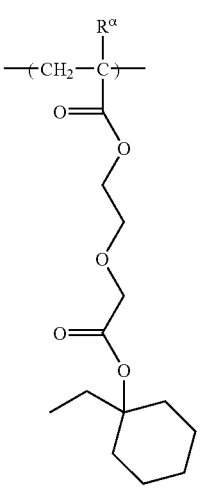

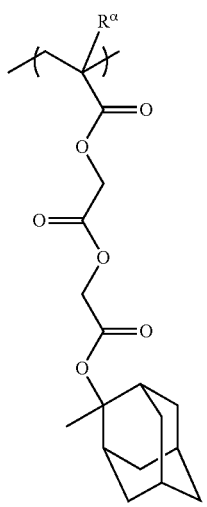 (a1-3-29)
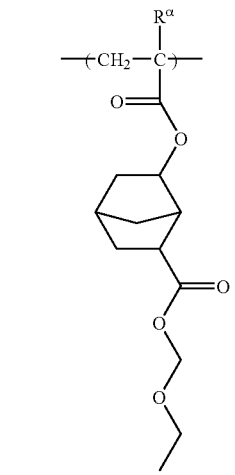 (a1-4-2)
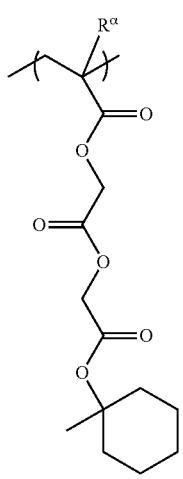 (a1-3-30)
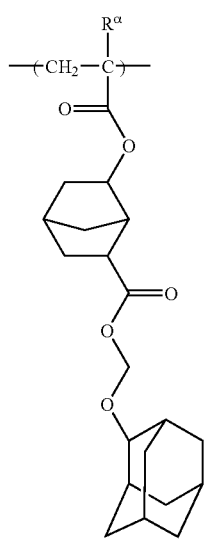 (a1-4-3)
[Chemical Formula 22]
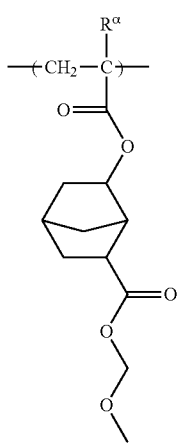 (a1-4-1)
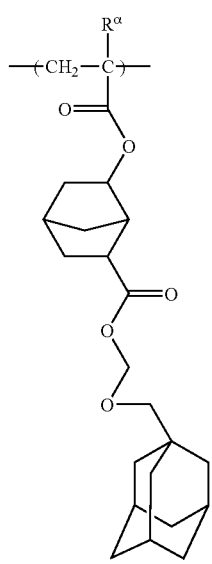 (a1-4-4)

(a1-4-5)
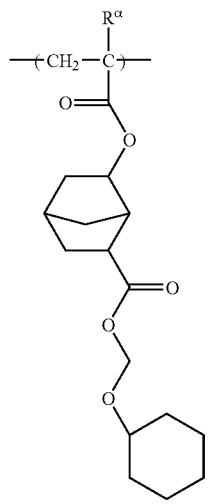
(a1-4-6)
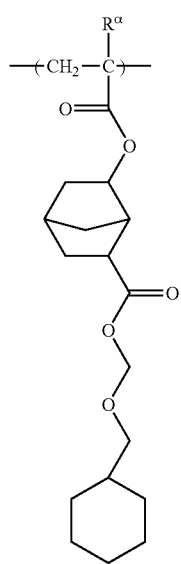
(a1-4-7)
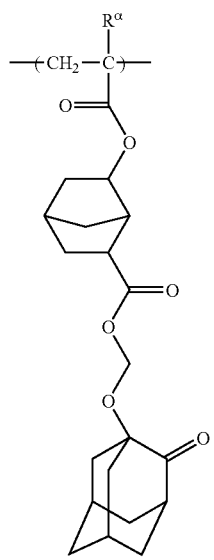
(a1-4-8)
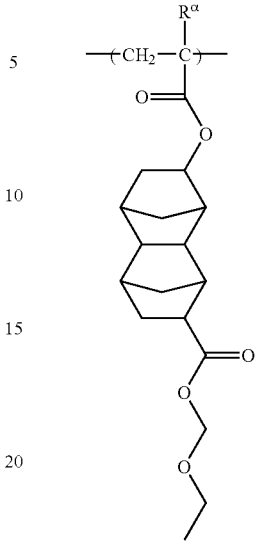
(a1-4-9)
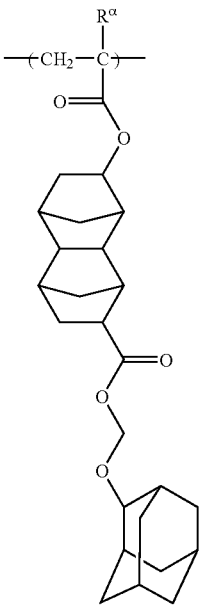

(a1-4-10)
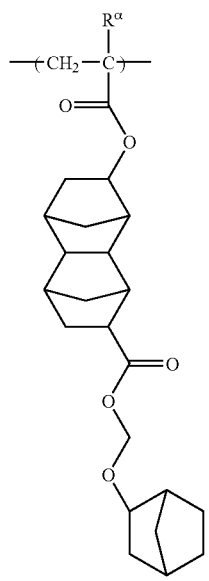
(a1-4-12)
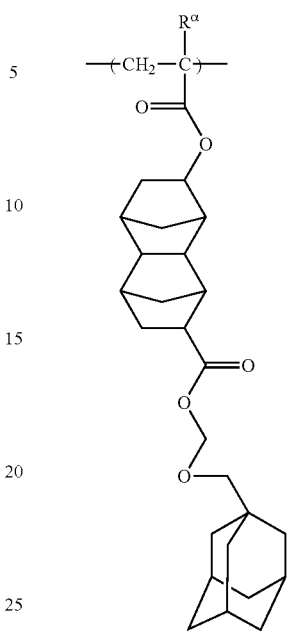
(a1-4-11)
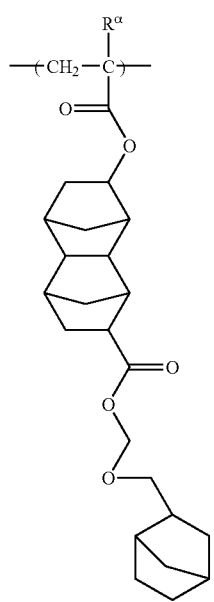
(a1-4-13)
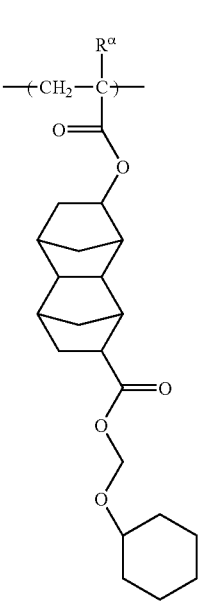

(a1-4-14)

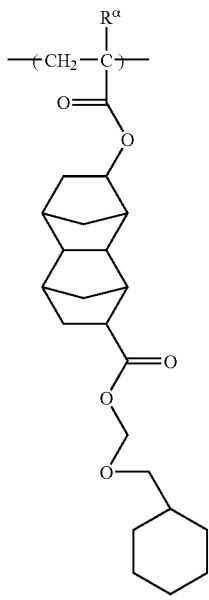

(a1-4-15)

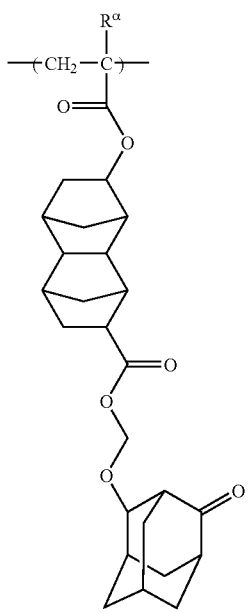

As the structural unit (a1), one type can be used alone, or two or more different types can be used in combination.

In the present invention, it is preferable to contain, as the structural unit (a1), at least one kind selected from the group consisting of a structural unit represented by the general formula (a1-0-11) shown below, a structural unit represented by the general formula (a1-0-12) shown below, and a structural unit represented by the general formula (a1-0-2) shown below, because it excels in lithography properties such as resolution and a resist pattern shape.

[Chemical Formula 23]

(a1-0-11)

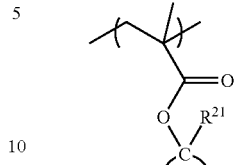

(a1-0-12)

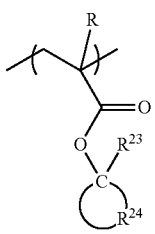

(a1-0-2)

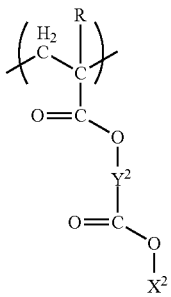

(In the above formulae, R represents a hydrogen atom, a lower alkyl group, or a halogenated lower alkyl group; $R^{21}$ represents an alkyl group; $R^{22}$ represents a group which forms an aliphatic monocyclic group together with the carbon atom to which $R^{22}$ is bonded; $R^{23}$ represents a branched alkyl group; $R^{24}$ represents a group which forms an aliphatic polycyclic group together with the carbon atom to which $R^{24}$ is bonded; $Y^2$ represents a bivalent linking group; and $X^2$ represents an acid dissociable, dissolution inhibiting group.)

In each of the formulae, R, $Y^2$ and $X^2$ are respectively as defined above.

In the formula (a1-0-11), examples of the alkyl group for $R^{21}$ include the same alkyl groups as those for $R^{14}$ in the above formula (1-1) to (1-9). Of these, a methyl group or an ethyl group is preferable, and an ethyl group is most preferable.

Examples of the aliphatic monocyclic group formed by $R^{22}$ and the carbon atom to which $R^{22}$ is bonded include the same aliphatic monocyclic groups as those among the aliphatic cyclic groups described above in the tertiary alkyl ester-type acid dissociable, dissolution inhibiting group. Specific examples thereof include a group in which one or more hydrogen atoms have been removed from a monocycloalkane. The monocycloalkane is preferably a 3 to 11-membered ring, more preferably a 3 to 8-membered ring, still more preferably 4 to 6-membered ring, and particularly preferably a 5 or 6-membered ring.

In the monocycloalkane, a part of the carbon atoms constituting the ring may or may not be substituted with ether oxygen atom (—O—).

Also, the monocycloalkane may contain a lower alkyl group, a fluorine atom or a fluorinated alkyl group as a substituent.

Examples of $R^{22}$ constituting the aliphatic monocyclic group include a linear alkylene group in which an ether oxygen atom (—O—) may be located between the carbon atoms.

Specific examples of the structural unit represented by the formula (a1-0-11) include structural units represented by the above formulae (a1-1-16) to (a1-1-23). Of these, a structural unit represented by the formula (a1-1-02) shown below which includes the structural units represented by the formulae (a1-1-16), (a1-1-17), and (a1-1-20) to (a1-1-23) is preferable. A structural unit represented by the formula (a1-1-02') shown below is also preferable.

In each of the formulae below, h is preferably 1 or 2, and most preferably 2.

[Chemical Formula 24]

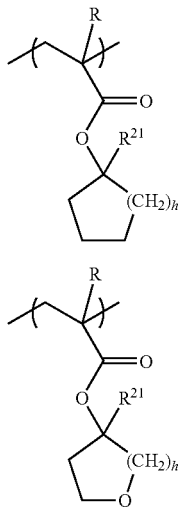

(a1-1-02)

(a1-1-02')

(In the above formulae, R and $R^{21}$ are respectively as defined above; and h represents an integer of 1 to 3.)

In the formula (a1-0-12), examples of the branched alkyl group for $R^{23}$ include the same branched alkyl groups as those described for $R^{14}$ in the above formulae (1-1) to (1-9), and of these, an isopropyl group is most preferable.

Examples of the aliphatic polycyclic group formed by $R^{24}$ and the carbon atom to which $R^{24}$ is bonded include the same aliphatic polycyclic groups as those among the aliphatic cyclic groups described above in the tertiary alkyl ester-type acid dissociable, dissolution inhibiting group.

Specific examples of the structural unit represented by the formula (a1-0-12) include structural units represented by the above formulae (a1-1-26) to (a1-1-31).

As the structural unit represented by the formula (a1-0-2), a structural unit represented by the above formula (a1-3) or (a1-4) can be used, and of these, a structural unit represented by the formula (a1-3) is particularly preferable.

The structural unit represented by the formula (a1-0-2) is particularly preferably a structural unit in which $Y^2$ in the formula is a group represented by -A-O—B— or -A-C(=O)—O—B—.

Preferable examples of such a structural unit include a structural unit represented by the general formula (a1-3-01) shown below, a structural unit represented by the general formula (a1-3-02) shown below, and a structural unit represented by the general formula (a1-3-03) shown below.

[Chemical Formula 25]

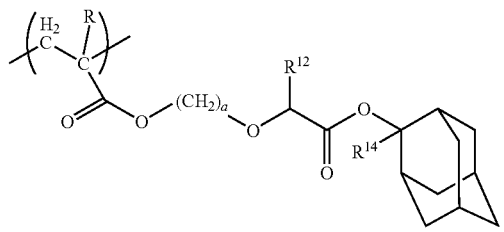

(a1-3-01)

(In the formula, R and $R^{14}$ are respectively as defined above; $R^{12}$ represents a hydrogen atom or a methyl group; and a represents an integer of 1 to 10.)

[Chemical Formula 26]

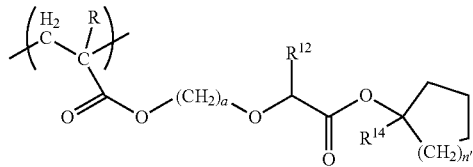

(a1-3-02)

(In the formula, R and $R^{14}$ are respectively as defined above; $R^{12}$ represents a hydrogen atom or a methyl group; a represents an integer of 1 to 10; and n' represents an integer of 0 to 3.)

[Chemical Formula 27]

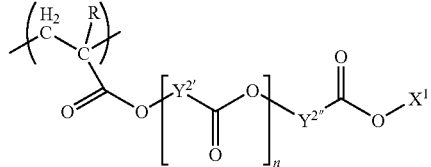

(a1-3-03)

(In the above formula, R is as defined above; $Y^{2'}$ and $Y^{2''}$ each independently represents a bivalent linking group; $X^1$ represents an acid dissociable, dissolution inhibiting group, and n represents an integer of 0 to 3.)

In the formulae (a1-3-01) and (a1-3-02), $R^{12}$ is preferably a hydrogen atom.

a is preferably an integer of 1 to 8, more preferably an integer of 1 to 5, and particularly preferably 1 or 2.

n' is preferably 1 or 2, and most preferably 2.

Specific examples of the structural unit represented by the formula (a1-3-01) include structural units represented by the above formulae (a1-3-25) to (a1-3-26).

Specific examples of the structural unit represented by the formula (a1-3-02) include structural units represented by the above formulae (a1-3-27) to (a1-3-28).

In the formula (a1-3-03), examples of the bivalent linking group for $Y^{2'}$ and $Y^{2''}$ include the same bivalent linking groups as those for $Y^2$ described above in the general formula (a1-3).

$Y^{2'}$ is preferably a bivalent hydrocarbon group which may contain a substituent, more preferably a linear aliphatic hydrocarbon group, and still more preferably a linear alkylene group. Of these, $Y^{2'}$ is particularly preferably a linear alkylene group of 1 to 5 carbon atoms, and most preferably a methylene group or an ethylene group.

$Y^{2"}$ is preferably a bivalent hydrocarbon group which may contain a substituent, more preferably a linear aliphatic hydrocarbon group, and still more preferably a linear alkylene group. Of these, $Y^{2"}$ is particularly preferably a linear alkylene group of 1 to 5 carbon atoms, and most preferably a methylene group or an ethylene group.

Examples of the acid dissociable, dissolution inhibiting group for $X^1$ include the same as those described above. Of these, a tertiary alkyl ester-type acid dissociable, dissolution inhibiting group is preferable, more preferably "(i) a group having a tertiary carbon atom on the ring skeleton of a monovalent aliphatic cyclic group" described above, and particularly preferably a group represented by the above general formula (1-1).

n is an integer of 0 to 3, preferably 0 to 2, more preferably 0 or 1, and most preferably 1.

The structural unit represented by the formula (a1-3-03) is preferably a structural unit represented by the general formula (a1-3-03-1) or (a1-3-03-2) shown below. Of these, a structural unit represented by the formula (a1-3-03-1) is preferable, and particularly preferably a structural unit represented by the above formulae (a1-3-29) to (a1-3-30).

[Chemical Formula 28]

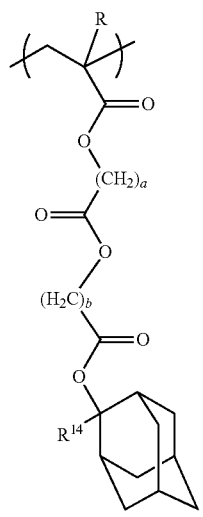

(a1-3-03-1)

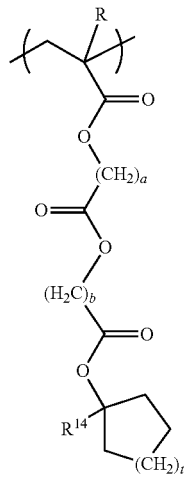

(a1-3-03-2)

(In the formulae, R and $R^{14}$ are respectively as defined above; a represents an integer of 1 to 10; b represents an integer of 1 to 10; and t represents an integer of 0 to 3.)

a is preferably an integer of 1 to 5, and particularly preferably 1 or 2.

b is preferably an integer of 1 to 5, and particularly preferably 1 or 2.

t is preferably an integer of 1 to 3, and particularly preferably 1 or 2.

In the present invention, the component (A1) particularly preferably contains at least two kinds of the structural units (a1). By using two or more kinds of the structural units (a1) in combination, lithography properties can be further improved.

In this case, at least one kind among at least two kinds of the structural units (a1) is preferably at least one kind selected from the group consisting of structural units represented by the above general formula (a1-0-11), structural units represented by the general formula (a1-0-12), and structural units represented by the general formula (a1-0-2).

In this case, at least two kinds of the structural units (a1) may be constituted only by those selected from the group consisting of structural units represented by the above general formula (a1-0-11), structural units represented by the above general formula (a1-0-12), and structural units represented by the above general formula (a1-0-2); or may be constituted by the combination of at least one kind selected from these structural units and a structural unit (a1) which does not correspond with these structural units.

Examples of the structural unit (a1) which does not correspond with these structural units, which can be used in combination with at least one kind selected from structural units represented by the general formula (a1-0-11), structural units represented by the general formula (a1-0-12), and structural units represented by the general formula (a1-0-2), include: structural units represented by the general formula (a1-1-01) shown below which includes the formulae (a1-1-1) to (a1-1-2), and (a1-1-7) to (a1-1-15) described above as specific examples for the general formula (a1-1); structural units represented by the above general formula (a1-2); and structural units represented by the above general formula (a1-4).

The structural unit represented by the general formula (a1-1-01) is particularly preferably a structural unit represented by the general formula (a1-1-101) which includes the formulae (a1-1-1) to (a1-1-2).

[Chemical Formula 29]

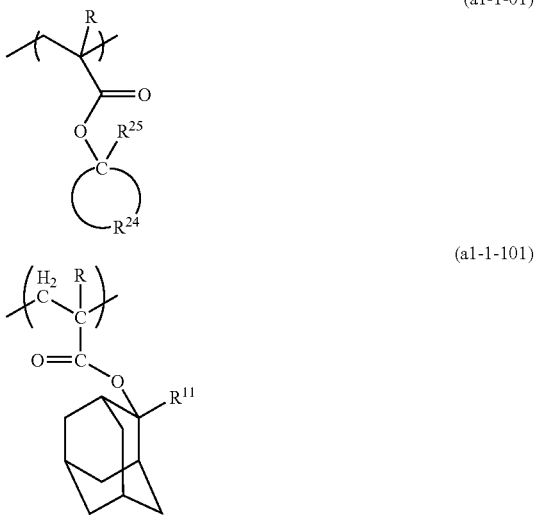

(a1-1-01)

(a1-1-101)

(In the formulae, R is as defined above; $R^{25}$ and $R^{11}$ each independently represents a linear alkyl group of 1 to 5 carbon atoms; and $R^{24}$ is as defined above.)

In the component (A1), the proportion of the structural unit (a1) is preferably 10 to 80 mol %, more preferably 20 to 70 mol %, still more preferably 25 to 60 mol %, and particularly preferably 25 to 50 mol %, based on the combined total of all structural units constituting the component (A1). When this proportion is not less than the lower limit in the above range, then a pattern can be easily formed using a resist composition which includes the structural unit (a1), whereas when the proportion is not more than the upper limit in the above range, a good quantitative balance with the other structural units can be attained.

(Structural Unit (a2))

Structural unit (a2) is a structural unit derived from an acrylate ester which has a lactone-containing cyclic group.

Here, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

In the case of using the component (A1) to form a resist film, the lactone-containing cyclic group of the structural unit (a2) is effective at improving the adhesion between the resist film and a substrate, and improving compatibility with a developing solution containing water.

The structural unit (a2) can be used arbitrarily without any particular restriction.

Specific examples of the lactone-containing monocyclic group include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Furthermore, specific examples of the lactone-containing polycyclic group include groups in which one hydrogen atom has been eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 30]

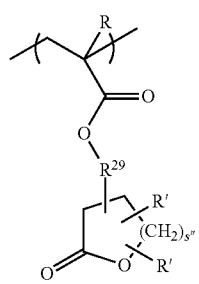

(a2-1)

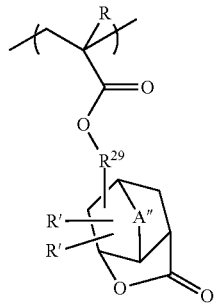

(a2-2)

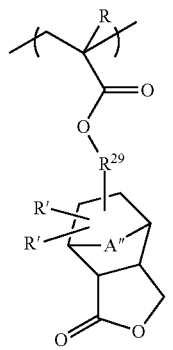

(a2-3)

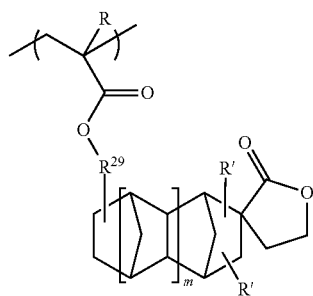

(a2-4)

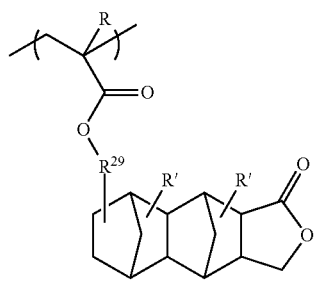

(a2-5)

(In the above formulae, R represents a hydrogen atom, a lower alkyl group or a halogenated lower alkyl group; R' each independently represents a hydrogen atom, an alkyl group of 1 to 5 carbon atoms, an alkoxy group of 1 to 5 carbon atoms, or —COOR", wherein R" represents a hydrogen atom or an alkyl group; $R^{29}$ represents a single bond or a bivalent linking group; s" represents an integer of 0 to 2; A" represents an oxygen atom, a sulfur atom, or an alkylene group of 1 to 5 carbon atoms which may contain an oxygen atom or sulfur atom; and m represents an integer of 0 or 1.)

R in the general formula (a2-1) to (a2-5) is the same as R described above in the structural unit (a1).

Examples of the alkyl group of 1 to 5 carbon atoms, the alkoxy group of 1 to 5 carbon atoms, and —COOR" for R' include the same groups as those described above for the alkyl group, the alkoxy group, and —COOR", respectively, for $R^6$ in the general formula (3-1). In the general formulae (a2-1) to (a2-5), R' is preferably a hydrogen atom in terms of industrial availability.

A" is the same as A' described above in the general formula (3-1).

$R^{29}$ represents a single bond or a bivalent linking group. As the bivalent linking group, the same bivalent linking groups as those described in $R^2$ in the above general formula (a0-1) can be used, and of these, an alkylene group, an ester group (—C(=O)—O—), or a combination thereof is preferably used. The alkylene group as the bivalent linking group for $R^{29}$ is more preferably a linear or branched alkylene group. Specific examples thereof include the same linear alkylene groups and branched alkylene groups as those described above in $R^2$.

s" is preferably an integer of 1 or 2.

Specific examples of structural units represented by the above general formulae (a2-1) and (a2-5) include the following. In each of the following formulae, $R^\alpha$ represents a hydrogen atom, a methyl group, or a trifluoromethyl group.

[Chemical Formula 31]

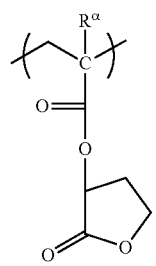
(a2-1-1)

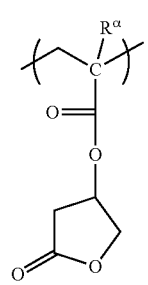
(a2-1-2)

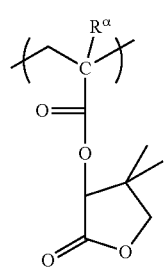
(a2-1-3)

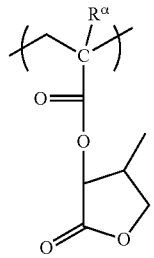
(a2-1-4)

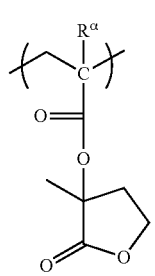
(a2-1-5)

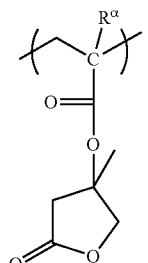
(a2-1-6)

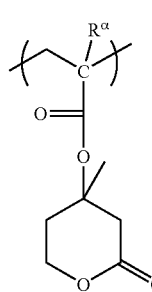
(a2-1-7)

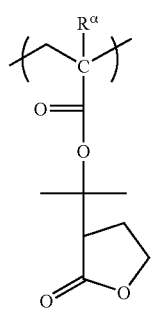
(a2-1-8)

(a2-1-9)
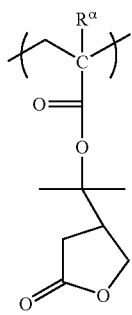
(a2-1-10)
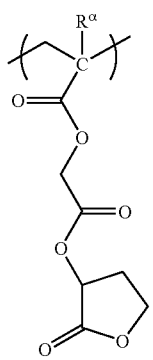
(a2-1-11)
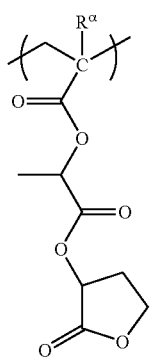
(a2-1-12)
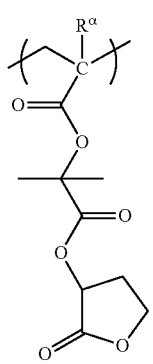
(a2-1-13)
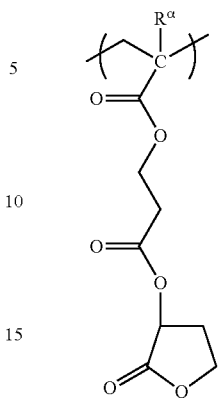
[Chemical Formula 32]
(a2-2-1)
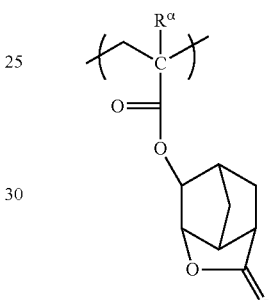
(a2-2-2)
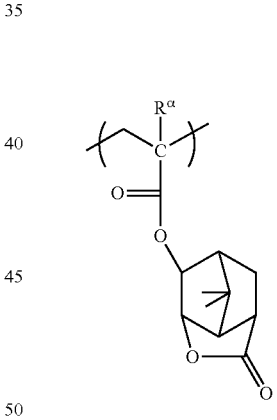
(a2-2-3)
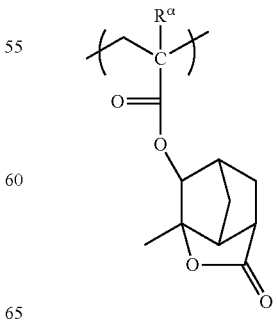

(a2-2-4)
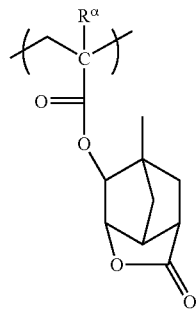
(a2-2-5)
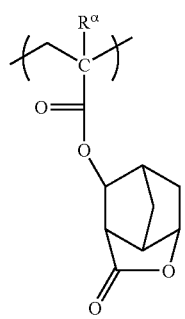
(a2-2-6)
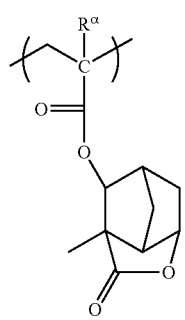
(a2-2-7)
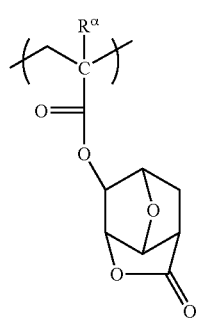
(a2-2-8)
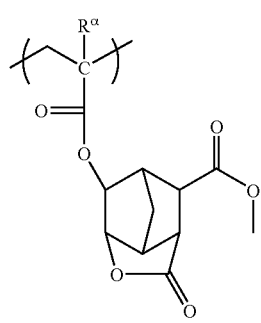
(a2-2-9)
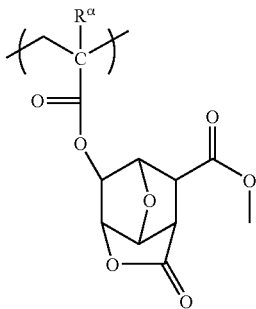
(a2-2-10)
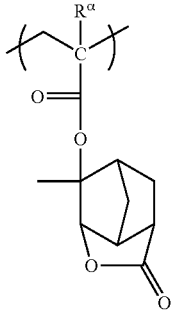
(a2-2-11)
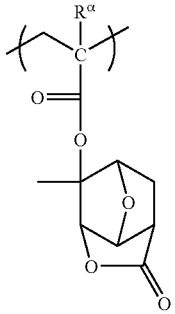
(a2-2-12)
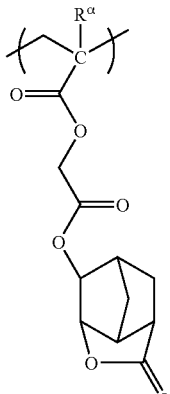

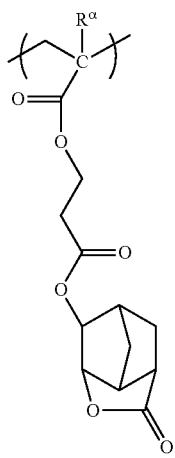
(a2-2-13)
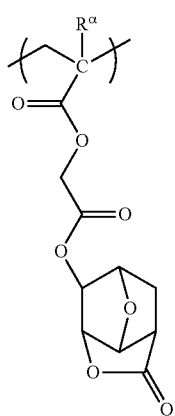
(a2-2-14)
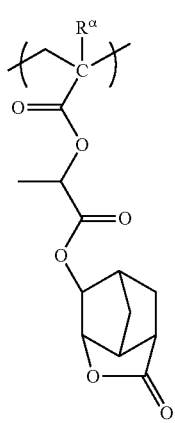
(a2-2-15)
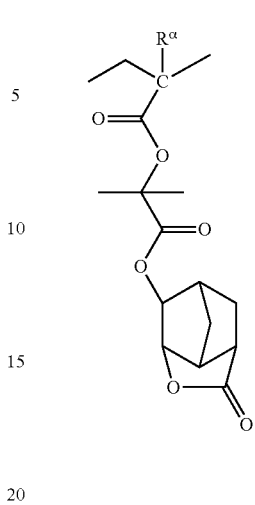
(a2-2-16)
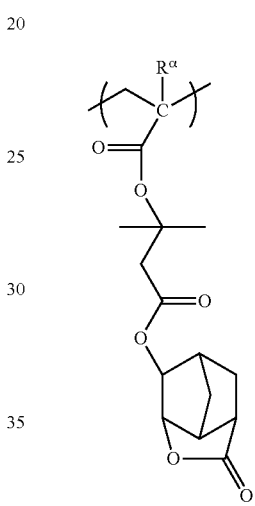
(a2-2-17)
[Chemical Formula 33]
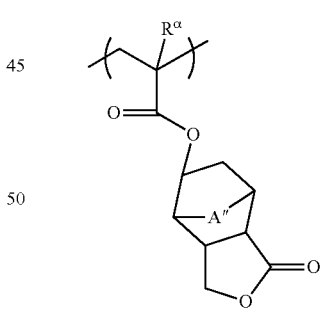
(a2-3-1)
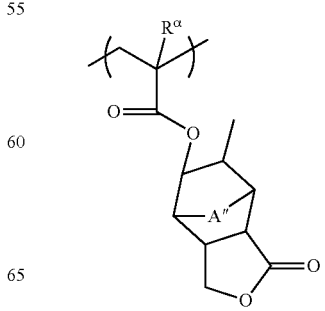
(a2-3-2)

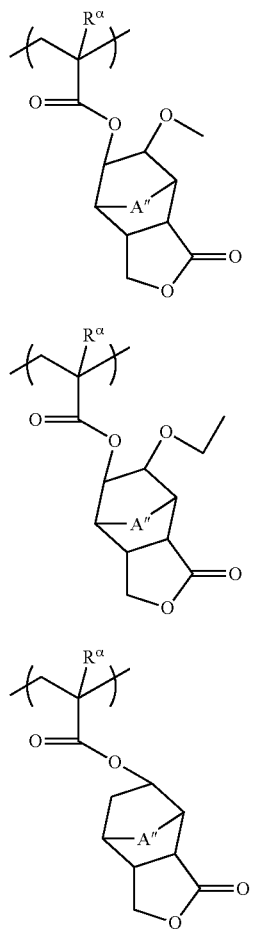
(a2-3-3)
(a2-3-4)
(a2-3-5)
[Chemical Formula 34]
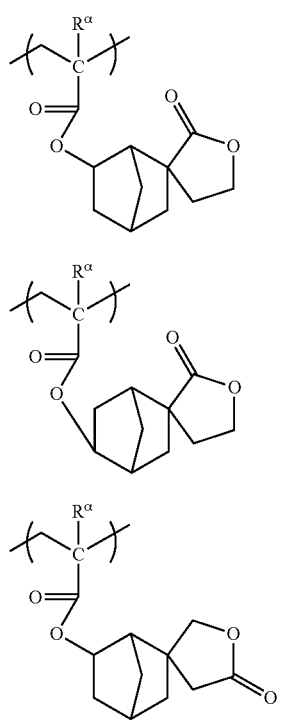
(a2-4-1)
(a2-4-2)
(a2-4-3)
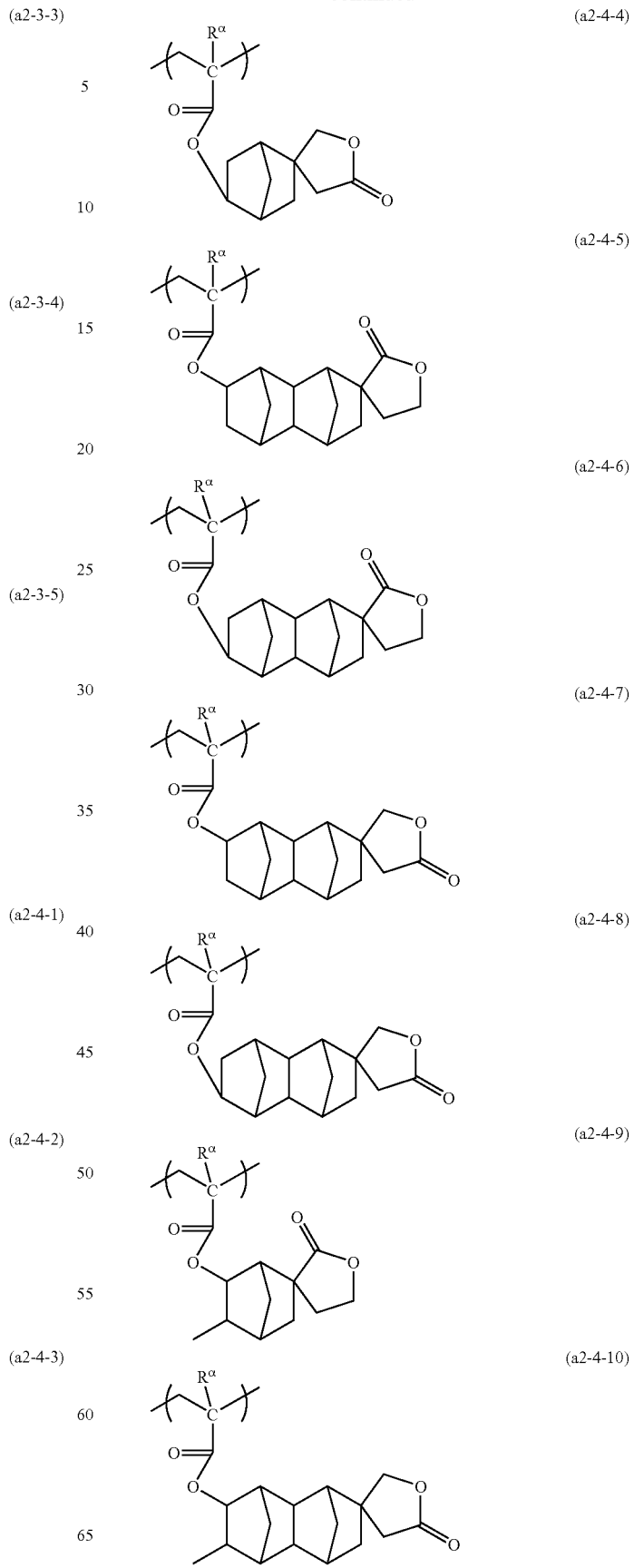
(a2-4-4)
(a2-4-5)
(a2-4-6)
(a2-4-7)
(a2-4-8)
(a2-4-9)
(a2-4-10)

(a2-4-11)
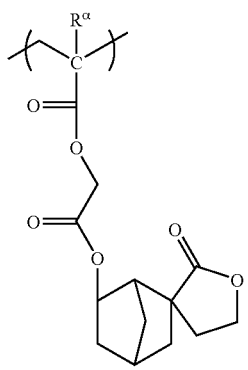
(a2-4-12)
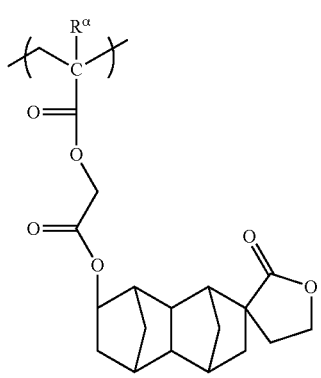
[Chemical Formula 35]
(a2-5-1)
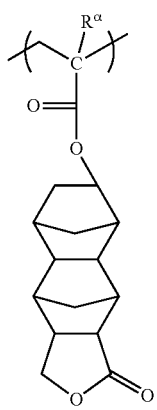
(a2-5-2)
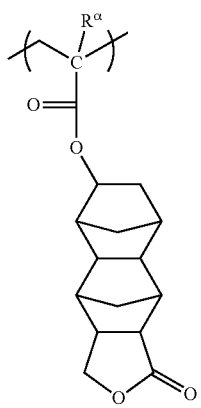
(a2-5-3)
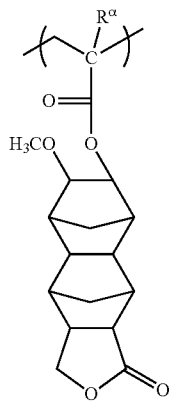
(a2-5-4)
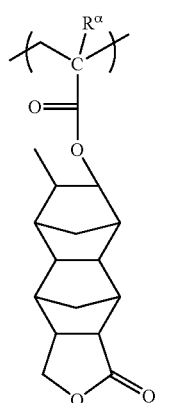
(a2-5-5)
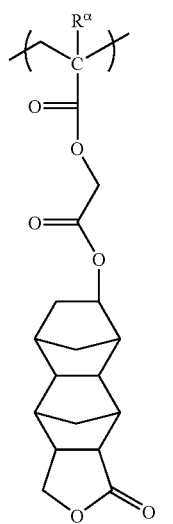

-continued (a2-5-6)

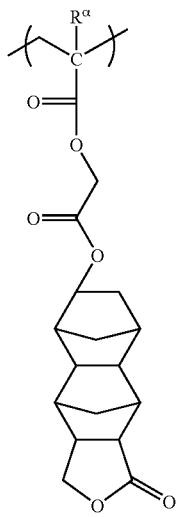

In the component (A1), as the structural unit (a2), one type may be used alone, or two or more types may be used in combination.

In the present invention, the component (A1) particularly preferably includes, as the structural unit (a2), at least one kind selected from the group consisting of structural units represented by the above general formula (a2-1) and structural units represented by the above general formula (a2-2).

In the component (A1), the proportion of the structural unit (a2) is preferably 1 to 50 mol %, more preferably 5 to 50 mol %, and still more preferably 10 to 45 mol %, based on the combined total of all structural units constituting the component (A1), because it excels in the adhesion between a resist film formed using a positive resist composition containing the component (A1) and a support such as a substrate, and also excels in the compatibility with a developing solution. Also, when the proportion is within the above range, MEF, CDU, and the pattern shape can be further improved.

Furthermore, in the component (A1), the total proportion of the structural unit (a0) and the structural unit (a2) (if the component (A1) does not contain the structural unit (a2), the proportion of the structural unit (a0) only) is preferably 1 to 70 mol %, more preferably 5 to 70 mol %, still more preferably 10 to 65 mol %, and most preferably 20 to 65 mol %, based on the combined total of all structural units constituting the component (A1), because it excels in various lithography properties. When the proportion is within the above range, MEF, CDU, and the pattern shape can be further improved.

If the component (A1) contains both of the structural units (a0) and (a2), the proportion of the structural units (a0) and (a2) in the component (A1) is preferably the following. That is, the proportion of the structural unit (a0) is preferably 1 to 40 mol %, more preferably 10 to 35 mol %, and most preferably 15 to 30 mol %, and the proportion of the structural unit (a2) is preferably 1 to 45 mol %, more preferably 10 to 45 mol %, and most preferably 20 to 45 mol %.

(Structural Unit (a3))

Structural unit (a3) is a structural unit derived from an acrylate ester which has a polar group-containing aliphatic hydrocarbon group.

If the component (A1) includes the structural unit (a3), the hydrophilicity of the component (A) can be improved, and hence, the compatibility of the component (A) with the developing solution can be improved. As a result, the solubility of the exposed portions in an alkali developing solution can be improved, which contributes to favorable improvements in the resolution.

Examples of the polar group include a hydroxyl group, a cyano group, a carboxyl group, and a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of structural units proposed as resins in resist compositions for ArF excimer lasers and the like. The polycyclic group preferably has 7 to 30 carbon atoms.

Of these, a structural unit derived from an acrylate ester having the polycyclic aliphatic group which contains a hydroxyl group, cyano group, a carboxyl group, or a hydroxyalkyl group in which a part of the hydrogen atoms within an alkyl group has been substituted with fluorine atoms is more preferable. Examples of the polycyclic group include groups in which two or more hydrogen atoms have been removed from a bicycloalkane, a tricycloalkane, a tetracycloalkane, or the like. Specific examples include a group in which two or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by the general formula (a3-1), (a3-2), or (a3-3) shown below is preferable, when the hydrocarbon group is a polycyclic group.

[Chemical Formula 36]

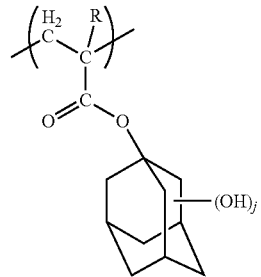

(a3-1)

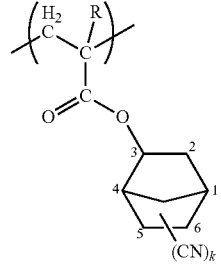

(a3-2)

-continued

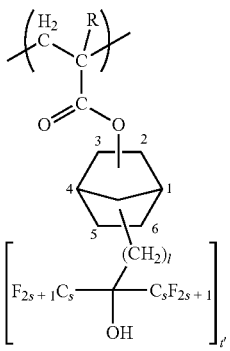
(a3-3)

(In the formulae, R is as defined above; j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j be 2, a structural unit in which the hydroxyl groups are bonded to the 3-position and 5-position of the adamantyl group is preferable. In the case that j be 1, a structural unit in which the hydroxyl group is bonded to the 3-position of the adamantyl group is preferable.

Of these, j is preferably 1, and a structural unit in which the hydroxyl group is bonded to the 3-position of adamantyl group is particularly preferable.

In the general formula (a3-2), k is preferably 1. In the general formula (a3-2), a cyano group is preferably bonded to the 5-position or 6-position of the norbornyl group.

In the general formula (a3-3), t' is preferably 1. l is preferably 1. s is preferably 1. Further, in the general formula (a3-3), it is preferable that a 2-norbonyl group or 3-norbonyl group be bonded to the terminal of the carboxyl group of the acrylic acid. It is preferable that a fluorinated alkyl alcohol within brackets [ ] in the formula (a3-3) be bonded to the 5-position or 6-position of the norbornyl group.

As the structural unit (a3), one type can be used alone, or two or more types can be used in combination.

In the component (A1), the proportion of the structural unit (a3) is preferably 5 to 50 mol %, more preferably 5 to 40 mol %, and still more preferably 5 to 25 mol %, based on the combined total of all structural units constituting the component (A1). When this proportion is not less than the lower limit in the above range, then the effect made by containing the structural unit (a3) can be sufficiently obtained. When the proportion is not more than the upper limit in the above range, a good quantitative balance with the other structural units can be attained.

(Other Structural Units)

The copolymer (A1) may also have a structural unit (hereinafter, referred to as structural unit (a4)) which is different from the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

The structural unit (a4) is preferably, for example, a structural unit derived from an acrylate ester containing a non-acid dissociable aliphatic polycyclic group. Examples of the polycyclic group include the same groups as those described above in the structural unit (a1), and any of the multitude of conventional polycyclic groups used within the resin component of resist compositions for ArF excimer lasers or KrF excimer lasers (and preferably for ArF excimer lasers) can be used.

In particular, at least one group selected from amongst a tricyclodecyl group, an adamantyl group, a tetracyclododecyl group, an isobornyl group, and a norbornyl group are preferable in terms of industrial availability and the like. These polycyclic groups may contain a linear or branched alkyl group of 1 to 5 carbon atoms as a substituent.

Specific examples of the structural unit (a4) include a structural unit represented by the general formulae (a-4-1) to (a-4-5) shown below.

[Chemical Formula 37]

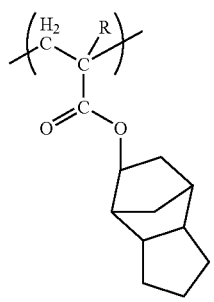
(a4-1)

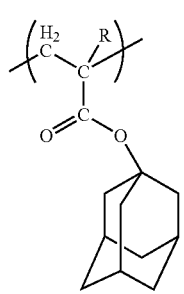
(a4-2)

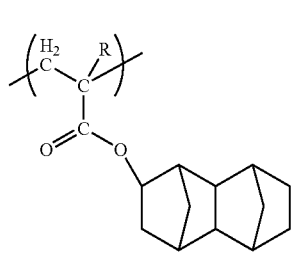
(a4-3)

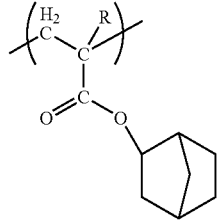
(a4-4)

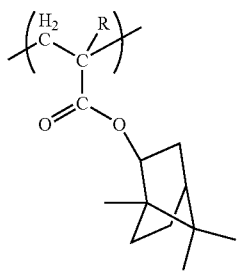

(a4-5)

(In the Formulae, R is as Defined Above.)

When the structural unit (a4) is included in the component (A1), the proportion of the structural unit (a4) is preferably within the range of 1 to 30 mol %, and more preferably 10 to 20 mol %, based on the combined total of all the structural units that constitute the component (A1).

The component (A1) is a copolymer containing the structural units (a0) and (a1).

Examples of the copolymer include a copolymer consisting of the above structural units (a0) and (a1); a copolymer consisting of the above structural units (a0), (a1) and (a3); a copolymer consisting of the above structural units (a0), (a1) and (a2); and a copolymer consisting of the above structural units (a0), (a1), (a2) and (a3).

In the present invention, it is particularly preferable that these copolymers contain, as the structural unit (a1), at least one kind selected from the group consisting of a structural unit represented by the above general formula (a1-0-11), a structural unit represented by the general formula (a1-0-12), and a structural unit represented by the above general formula (a1-1-01).

Also, as described above, it is preferable that the above copolymer contain at least two kinds of the structural unit (a1). Of the at least two kinds, it is preferable that at least one kind be a structural unit selected from the group consisting of structural units represented by the above general formula (a1-0-11) and structural units represented by the above general formula (a1-0-12), and it is more preferable that all of the at least two kinds be structural units selected from the above group.

Further, in the present invention, it is also preferable that the above copolymer contain, as the structural unit (a1), at least one kind selected from the group consisting of structural units represented by the above general formula (a1-3-03-1), structural units represented by the above general formula (a1-0-12), and structural units represented by the above general formula (a1-1-01). In such a copolymer, it is preferable to contain at least two kinds of structural units (a1), and it is particularly preferable to contain a structural unit represented by the above general formula (a1-3-03-1) as one of the at least two kinds.

The weight average molecular weight (Mw) (the polystyrene equivalent value determined by gel permeation chromatography) of the component (A1) is not particularly limited, and is preferably 2,000 to 50,000, more preferably 3,000 to 30,000, and most preferably 5,000 to 20,000. By ensuring that the weight average molecular weight of the component (A1) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Further, the dispersity (Mw/Mn) is preferably within a range from 1.0 to 5.0, more preferably from 1.0 to 3.0, and most preferably from 1.2 to 2.5. Herein, Mn means the number average molecular weight.

As the component (A1) in the component (A), one kind can be used alone, or two or more kinds can be used in combination.

The proportion of the component (A1) in the component (A) is preferably 25% by weight or more, more preferably 50% by weight or more, still more preferably 75% by weight or more, and may be 100% by weight, based on the total weight of the component (A). When the proportion of the component (A1) is 25% by weight or more, effects such as lithography properties can be improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: non-uniform irregularities within the line side walls).

The monomer which corresponds with each of the structural units may be a commercially available compound, or may be synthesized by using a conventional method.

For example, examples of the monomer which corresponds with the structural unit (a0) include compounds represented by the general formula (a0-1-0) shown below (hereinafter, referred to as "compound (a0-1-0)").

[Chemical Formula 38]

(a0-1-0)

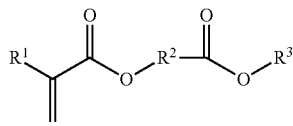

(In the formula (a0-1-0), R$^1$ to R$^3$ are respectively as defined above.)

There are no particular restrictions on the manufacturing method of the compound (a0-1-0), and it can be manufactured by using a conventional method.

For example, the compound (X-2) represented by the general formula (X-2) shown below is added to a solution in which the compound (X-1) represented by the general formula (X-1) shown below is dissolved in a reaction solvent, and then reacted, thereby obtaining the compound (a0-1-0).

Examples of the base include inorganic bases such as sodium hydroxide, K$_2$CO$_3$, and Cs$_2$CO$_3$; and organic bases such as triethylamine, 2-dimethylaminopyridine (DMAP), and pyridine. Examples of condensing agents include carbodiimide reagents such as ethyldiisopropylaminocarbodiimide (EDCI) hydrochloride, dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

Also, an acid may be used if necessary. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids may be used alone, or in a combination of two or more.

[Chemical Formula 39]

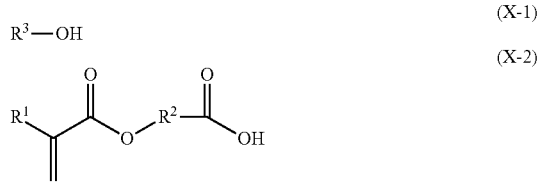

The resist composition of the present invention may include, as the component (A), a base component (hereinafter, referred to as "component (A2)") which exhibits increased solubility in an alkali developing solution under action of an acid and does not correspond with the component (A1).

There is no particular restriction on the component (A2), and any of the multitude of conventional base components used for chemically-amplified positive resist composition (for example, base resins for ArF excimer lasers or KrF excimer lasers (and preferably for ArF excimer lasers)), arbitrarily selected, can be used. Examples of the base resin for ArF excimer lasers include those which contains the aforementioned structural unit (a1) as an indispensable structural unit, and arbitrarily contains the aforementioned structural units (a2) to (a4). Also, the component (A2) may contain a non-polymer (low molecular weight compound) having a molecular weight of 500 to less than 4,000.

As the component (A2), one type may be used alone, or two or more types may be used in combination.

In the resist composition of the present invention, the content of the component (A) may be adjusted according to the thickness of the resist film to be formed.

<Component (B)>

In the present invention, the component (B) includes the acid generator (B1) (hereinafter, referred to as component (B1)) containing an anion moiety represented by the general formula (I) shown below.

[Chemical Formula 40]

(In the formula (I), X represents a cyclic group of 3 to 30 carbon atoms which may contain a substituent; $Q^1$ represents a bivalent linking group which contains an oxygen atom; $Y^1$ represents an alkylene group of 1 to 4 carbon atoms which may contain a substituent, or a fluorinated alkylene group of 1 to 4 carbon atoms which may contain a substituent.)

With Respect to the Anion Moiety of the Component (B1)

In the above formula (I), X represents a cyclic group of 3 to 30 carbon atoms which may contain a substituent.

The cyclic group for X may be an aromatic hydrocarbon group, or may be an aliphatic hydrocarbon group (aliphatic cyclic group).

The aromatic hydrocarbon group is a hydrocarbon group containing an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of the carbon atoms described above does not include the number of carbon atoms within the substituent group.

Specific examples of the aromatic hydrocarbon group include aryl groups in which one hydrogen atom has been removed from an aromatic hydrocarbon ring such as a phenyl group, a biphenyl group, a fluorenyl group, a naphthyl group, an anthryl group, and a phenanthryl group; and arylalkyl groups such as a benzyl group, a phenethyl group, a 1-naphthylmethyl group, a 2-naphthylmethyl group, a 1-naphthylethyl group, and a 2-naphthylethyl group. The number of carbon atoms of the alkyl chain in the arylalkyl group is preferably 1 to 4, more preferably 1 or 2, and still more preferably 1.

Of these, the aromatic hydrocarbon group is preferably a naphthyl group which may contain a substituent or a phenyl group which may contain a substituent.

The aromatic hydrocarbon group may contain a substituent. For example, a part of the carbon atoms which constitutes an aromatic ring included in the aromatic hydrocarbon group may be substituted with a hetero atom, or a part of the hydrogen atoms bonded to an aromatic ring included in the aromatic hydrocarbon group may be substituted with a substituent.

Examples of the former case include a heteroaryl group in which a part of the carbon atoms which constitutes the ring of the aryl group described above is substituted with a hetero atom such as an oxygen atom, a sulfur atom, and a nitrogen atom; and a heteroarylalkyl group in which a part of the carbon atoms which constitutes the aromatic hydrocarbon ring of the arylalkyl group described above is substituted with the hetero atom.

On the other hand, examples of the substituents in the aromatic hydrocarbon group in the latter case include an alkyl group, an alkoxy group, a halogen atom, a halogenated alkyl group, a hydroxyl group, and an oxygen atom (=O).

The alkyl group for the substituent in the aromatic hydrocarbon group is preferably an alkyl group of 1 to 5 carbon atoms, and most preferably a methyl group, an ethyl group, a propyl group, an n-butyl group, and a tert-butyl group.

The alkoxy group for the substituent in the aromatic hydrocarbon group is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent in the aromatic hydrocarbon group include a fluorine atom, a chlorine atom, a bromine atom, and an iodine atom. Of these, a fluorine atom is preferable.

Examples of the halogenated alkyl group for the substituent in the aromatic hydrocarbon group include groups in which a part of or all of the hydrogen atoms of the above alkyl group are substituted with the halogen atoms.

The aliphatic hydrocarbon group (aliphatic cyclic group) for X may be a saturated aliphatic hydrocarbon group, or may be an unsaturated aliphatic hydrocarbon group.

The aliphatic cyclic group for X may be a group in which a part of the carbon groups which constitute the aliphatic cyclic group have been substituted with a substituent containing a hetero atom (that is, a substituent may be included in the ring structure); or may be a group in which a part or all of the hydrogen atoms which constitute the aliphatic cyclic group have been substituted with a substituent containing a hetero atom.

There are no particular restrictions on the "hetero atom" for X, as long as it is an atom other than a carbon atom and a hydrogen atom. Examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may be an atom/group consisting of the hetero atom, or a group containing a group or an atom other than the hetero atom.

As the substituents which are substituted for a part of carbon atoms which constitute the above aliphatic hydrocarbon group, for example, the group of —O—, —(=O)—O—, —C(=O)—, —O—C(=O)—O—, —C(=O)—NH—, —NH— (wherein H may be substituted with a substituent such as an alkyl group and an acyl group), —S—, —S(=O)$_2$—, or —S(=O)$_2$—O— can be used.

Specific examples of the substituents which are substituted for a part or all of the hydrogen atoms include an alkoxy group, a halogen atom, a halogenated alkyl group, a hydroxyl group, an oxygen atom, and a cyano group.

The alkoxy group for the substituent is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom. Of these, a fluorine atom is preferable.

Examples of the halogenated alkyl group for the substituent include a group in which a part or all of the hydrogen atom in an alkyl group of 1 to 5 carbon atoms, such as a methyl group, an ethyl group, a propyl group, an n-propyl group, an n-butyl group, and a tert-butyl group, are substituted with the halogen atoms.

The aliphatic cyclic group for X may be a monocyclic group or a polycyclic group. The aliphatic cyclic group for X preferably has 3 to 30 carbon atoms, more preferably 5 to 30 carbon atoms, still more preferably 5 to 20 carbon atoms, still more preferably 6 to 15 carbon atoms, and particularly preferably 6 to 12 carbon atoms.

Examples thereof include groups in which one or more of hydrogen atoms have been removed from a monocycloalkane; and groups in which one or more of hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane and cyclohexane; and groups in which at least one hydrogen atom has been removed from a polycycloalkane such as adamantane, norbornane, isobornane, tricyclodecane or tetracyclododecane.

If the aliphatic cyclic group does not contain a substituent containing a hetero atom in the ring structure, the aliphatic cyclic group is preferably a polycyclic group, more preferably groups in which one or more hydrogen atoms have been removed from a polycycloalkane, and most preferably groups in which one or more hydrogen atoms have been removed from an adamantane.

If the aliphatic cyclic group contains a substituent containing a hetero atom in the ring structure, the substituent containing a hetero atom is preferably —O—, —C(=O)—O—, —S—, —S(=O)$_2$—, or —S(=O)$_2$—O—. Specific examples of the aliphatic cyclic group include groups represented by the formula (L1) to (L5), and (S1) to (S4) shown below.

[Chemical Formula 41]

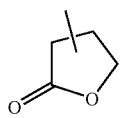
(L1)

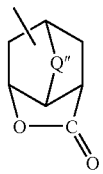
(L2)

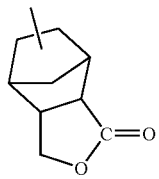
(L3)

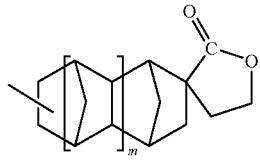
(L4)

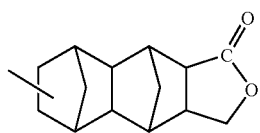
(L5)

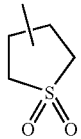
(S1)

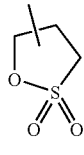
(S2)

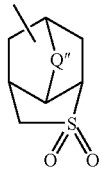
(S3)

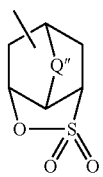
(S4)

(In the above formulae, Q" represents an alkylene group of 1 to 5 carbon atoms, —O—, —S—, —O—R$^{94}$—, or —S—R$^{95}$—, wherein R$^{94}$ and R$^{95}$ each independently represents an alkylene group of 1 to 5 carbon atoms; and m represents an integer of 0 or 1.)

In the above formulae, the alkylene group for Q", $R^{94}$ and $R^{95}$ is preferably a linear or branched alkylene group, and preferably has 1 to 12 carbon atoms, more preferably 1 to 5 carbon atoms, and particularly preferably 1 to 3 carbon atoms.

Specific examples of the alkylene group include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, and —$CH(CH_2CH_3)CH_2$—; a trimethylene group (n-propylene group) [—$CH_2CH_2CH_2$—]; an alkyltrimethylene group such as —$CH(CH_3)CH_2CH_2$— and —$CH_2CH(CH_3)CH_2$—; a tetramethylene group [—$CH_2CH_2CH_2CH_2$—]; an alkyltetramethylene group such as —$CH(CH_3)CH_2CH_2CH_2$— and —$CH_2CH(CH_3)CH_2CH_2$—; and a pentamethylene group [—$CH_2CH_2CH_2CH_2CH_2$—].

These aliphatic cyclic group may be a group in which a part of hydrogen atoms bonded to the carbon atoms constituting the ring structure are substituted with substitutents. Examples of the substituent include an alkyl group, an alkoxy group, a halogen atom, a halogenated alkyl group, a hydroxyl group, and an oxygen atom (=O).

The aforementioned alkyl group is preferably an alkyl group of 1 to 5 carbon atoms, and particularly preferably a methyl group, an ethyl group, a propyl group, an n-butyl group, or a tert-butyl group.

Examples of the aforementioned alkoxy group, halogen atom, and halogenated alkyl group, respectively, include the same as those described above as the substitutent which are substituted for a part or all of the hydrogen atoms.

In the present invention, X is preferably a group containing a skeleton similar to $R^3$ in the structural unit (a0) of the component (A1), because lithography properties and the resist pattern shape can be further improved. Of these, a group containing a polar portion is particularly preferable.

Examples of the group containing a polar portion include groups in which a part of the carbon atoms constituting the aliphatic cyclic group for X are substituted with substituents containing a hetero atom, that is, —O—, —C(=O)—O—, —C(=O)—, —C(=O)—NH—, —NH— (wherein, H may be substituted with a substituent such as an alkyl group and an acyl group), —S—, —S(=O)$_2$—, and —S(=O)$_2$—O—.

Of these, X is preferably an aliphatic cyclic group which may contain a substituent, and more preferably a polycyclic aliphatic cyclic group which may contain a substituent.

Specifically, the polycyclic aliphatic cyclic group is preferably a group in which one or more hydrogen atoms have been removed from the above polycycloalkane, a group represented by the formulae (L1) to (L5), or a group represented by the formulae (S1) to (S4), more preferably a group represented by the formulae (L1) to (L5) or a group represented by the formula (S1) to (S4), particularly preferably a group represented by the formula (S1) to (S4), and most preferably a group represented by the formula (S3) to (S4).

In the above formula (I), $Q^1$ represents a bivalent linking group containing an oxygen atom.

$Q^1$ may contain an atom other than an oxygen atom. Examples of the atom other than an oxygen atom include a carbon atom, a hydrogen atom, a sulfur atom, and a nitrogen atom.

Examples of the bivalent linking group containing an oxygen atom include: non-hydrocarbon-based oxygen atom-containing linking groups such as an oxygen atom (ether linkage; —O—), an ester linkage (—C(=O)—O—), an amide linkage (—C(=O)—NH—), a carbonyl group (—C(=O)—), and carbonate linkage (—O—C(=O)—O—); and combined groups of the non-hydrocarbon-based oxygen-containing linking group with an alkylene group.

Examples of the above combined groups include a group of —$R^{91}$—O—, a group of —$R^{92}$—O—C(=O)—, and a group of —C(=O)—O—$R^{93}$—O—C(=O)— (wherein, $R^{91}$ to $R^{93}$ each independently represents an alkylene group).

Examples of the alkylene group for $R^{91}$ to $R^{93}$ include the same alkylene groups as those above for Q", $R^{94}$ and $R^{95}$.

$Q^1$ is preferably an ester linkage, a bivalent linking group containing an ester linkage, or a bivalent linking group containing an ether linkage, more preferably an ester linkage, —$R^{91}$—O—, —$R^{92}$—O—C(=O)—, or —C(=O)—O—$R^{93}$—O—C(=O)—, and most preferably an ester linkage.

In the above formula (I), $Y^1$ represents an alkylene group of 1 to 4 carbon atoms which may contain a substituent, or a fluorinated alkylene group of 1 to 4 carbon atoms which may contain a substituent.

As the alkylene group for $Y^1$, alkylene groups of 1 to 4 carbon atoms among the alkylene groups described above in $Q^1$ can be used.

Also, as the fluorinated alkylene group for $Y^1$, groups in which a part or all of the hydrogen atoms in the above alkylene group are substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, and —$C(CF_3)(CF_2CF_3)$—; —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, and —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

Of these, $Y^1$ is preferably a fluorinated alkylene group, and particularly preferably a fluorinated alkylene group in which a carbon atom bonded to the adjacent sulfur atom is fluorinated. In the component (B1), if a carbon atom bonded to the adjacent sulfur atom is fluorinated in $Y^1$, an acid which exhibits a high acidity is generated upon exposure. Accordingly, the resist pattern shape can be further excellent, and lithography properties can be further improved.

Examples of such fluororinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, and —$CF(CF_2CF_3)CF_2$—; —$CH_2CF_2$—, —$CH_2CH_2CF_2$—, and —$CH_2CF_2CF_2$—; and —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$—, or —$CH_2CF_2CF_2$— is preferable, —$CF_2$—, —$CF_2CF_2$—, or —$CF_2CF_2CF_2$— is more preferable, and —$CF_2$— is still more preferable.

The alkylene group or fluorinated alkylene group may contain a substituent. The expression that the alkylene group or fluorinated alkylene group "contain a substituent" means that a part or all of hydrogen atoms or fluorine atoms in the alkylene group or fluorinated alkylene group are substituted with groups other than hydrogen atoms and fluorine atoms.

Examples of the substituent which may be included in the alkylene group or fluorinated alkylene group include an alkyl group of 1 to 4 carbon atoms, an alkoxy group of 1 to 4 carbon atoms, and hydroxyl group.

With Respect to the Cation Moiety of the Component (B1)

There are no particular restrictions on the cation moiety of the component (B1), and those which have conventionally been known as cation moieties for onium salt-based acid generators can be used by being arbitrarily selected.

As such a cation moiety, an organic cation is generally used. The organic cation is preferably a sulfonium ion or an iodonium ion, and particularly preferably a sulfonium ion.

Specific examples of the cation moiety include cation moieties represented by the general formula (Ib-1) or (Ib-2) shown below.

[Chemical Formula 42]

(In the above formulae, $R^{11'}$ to $R^{13'}$ each independently represents an aryl group which may contain a substituent, or an alkyl group which may contain a substituent; at least one of $R^{11'}$ to $R^{13'}$ represents the above aryl group which may contain a substituent; and two of $R^{11'}$ to $R^{13'}$ may be bonded each other together with the sulfur ion in the formula to form a ring. $R^{15'}$ and $R^{16'}$ each independently represents an aryl group which may contain a substituent, or an alkyl group which may contain a substituent; at least one of $R^{15'}$ and $R^{16'}$ represents the above aryl group which may contain a substituent.)

In the formula (Ib-1), there is no particular restriction on the aryl group for $R^{11'}$ to $R^{13'}$, and examples thereof include non-substituted aryl groups of 6 to 20 carbon atoms; and substituted aryl groups in which a part or all of hydrogen atoms in the above non-substituted aryl groups are substituted with an alkyl group, an alkoxy group, an alkoxyalkyloxy group, an alkoxycarbonylalkyloxy group, a halogen atom, a hydroxyl group, or the like.

The non-substituted aryl group is preferably an aryl group of 6 to 10 carbon atoms, because it can be synthesized inexpensively. Specific examples thereof include a phenyl group and a naphthyl group.

The alkyl group for the substituent in the substituted aryl group is preferably an alkyl group of 1 to 5 carbon atoms, and most preferably a methyl group, an ethyl group, a propyl group, an n-butyl group, and a tert-butyl group.

The alkoxy group for the substituent group in the substituted aryl group is preferably an alkoxy group of 1 to 5 carbon atoms, and most preferably a methoxy group, an ethoxy group, an n-propoxy group, an iso-propoxy group, an n-butoxy group, or a tert-butoxy group.

The halogen atom for the substituent in the substituted aryl group is preferably a fluorine atom.

Examples of the alkoxyalkyloxy group for the substituent in the substituted aryl group include groups represented by the following formula.

—O—C($R^{47}$)($R^{48}$)—O—$R^{49}$    General formula (In the formula, $R^{47}$ and $R^{48}$ each independently represents a hydrogen atom, or a linear or branched alkyl group; and $R^{49}$ represents an alkyl group.)

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

At least one of $R^{47}$ and $R^{48}$ is preferably a hydrogen atom. Particularly, it is preferable that one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched, or cyclic.

The linear or branched alkyl group for $R^{49}$ preferably has 1 to 5 carbon atoms, and examples thereof include a methyl group, an ethyl group, a propyl group, an n-butyl group, and a tert-butyl group.

The cyclic alkyl group for $R^{49}$ preferably has 4 to 15 carbon atoms, more preferably has 4 to 12 carbon atoms, and most preferably 5 to 10 carbon atoms. Specific examples of the cyclic alkyl group for $R^{49}$ include groups in which one or more hydrogen atoms have been removed from a monocycloalkane or a polycycloalkane such as a bicycloalkane, tricycloalkane or tetracycloalkane, in which an alkyl group of 1 to 5 carbon atoms, a fluorine atom, or a fluorinated alkyl group of 1 to 5 carbon atoms may or may not be included as a substituent. Specific examples of monocycloalkanes include cyclopentane and cyclohexane. Specific examples of polycycloalkanes include adamantane, norbornane, isobornane, tricyclodecane, and tetracyclododecane. Of these, a group in which one or more hydrogen atoms have been removed from adamantane is preferable.

Examples of the alkoxycarbonylalkyloxy group for the substituent in the substituted aryl group include groups represented by the following formula.

—O—$R^{50}$—C(=O)—O—$R^{51}$    General formula (In the formula, $R^{50}$ represents a linear or branched alkylene group; and $R^{51}$ represents a tertiary alkyl group.)

The linear or branched alkylene group for $R^{50}$ preferably has 1 to 5 carbon atoms, and examples thereof include a methylene group, an ethylene group, a trimethylene group, a tetramethylene group, and a 1,1-dimethylethylene group.

Examples of the tertiary alkyl group for $R^{51}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, and a 1-(1-adamantyl)-1-methylpentyl group; a 1-(1-cyclopentyl)-1-methylethyl group, a 1-(1-cyclopentyl)-1-methylpropyl group, a 1-(1-cyclopentyl)-1-methylbutyl group, and a 1-(1-cyclopentyl)-1-methylpentyl group; and a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group, and a tert-hexyl group.

The aryl group for $R^{11'}$ to $R^{13'}$ each is preferably a phenyl group which may contain a substituent. That is, the cation moiety represented by the formula (Ib-1) is preferably a cation moiety containing a triphenylsulfonium skeleton.

There is no particular restriction on the alkyl group for $R^{11'}$ to $R^{13'}$, and examples thereof include a linear, branched, or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group. Of these, a methyl group is preferable, because it excels in resolution, and can be synthesized inexpensively.

In the case that two of $R^{11\prime}$ to $R^{13\prime}$ are mutually bonded to form a ring together with the sulfur atom in the formula, it is preferable to form a 3- to 10-membered ring including the sulfur ion, and it is more preferable to form a 5- to 7-membered ring including the sulfur ion.

In the case that two of $R^{11\prime}$ to $R^{13\prime}$ are mutually bonded to form a ring together with the sulfur atom, the other one of $R^{11\prime}$ to $R^{13\prime}$ is preferably an aryl group. As the aryl group, the same aryl groups as those for $R^{11\prime}$ to $R^{13\prime}$ can be used.

Specific examples of the cation moiety represented by the formula (Ib-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium, and 1-(4-methylphenyl)tetrahydrothiopyranium.

The cation moiety represented by the formula (Ib-1) is preferably a cation moiety containing a triphenylsulfonium skeleton such as a cation moiety represented by the formulae (Ib'-1-1) to (Ib'-1-8) shown below.

In the formula (Ib'-1-4), $R^8$ represents an alkyl group of 1 to 5 carbon atoms. The alkyl group for $R^8$ is preferably a linear or branched alkyl group, and particularly preferably a methyl group or an n-butyl group.

[Chemical Formula 43]

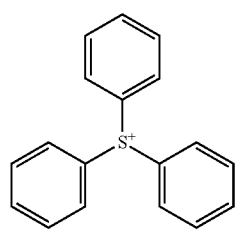
(Ib'-1-1)

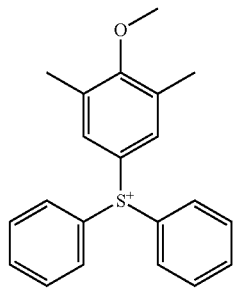
(Ib'-1-2)

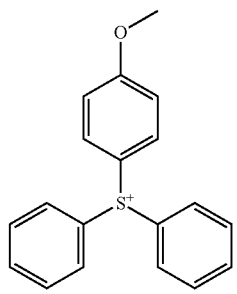
(Ib'-1-3)

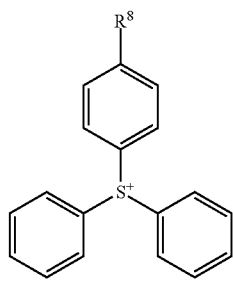
(Ib'-1-4)

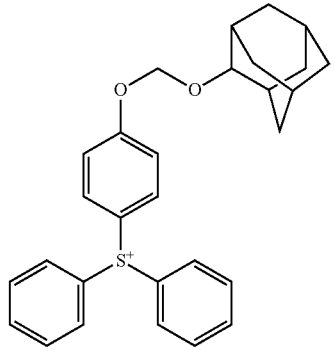
(Ib'-1-5)

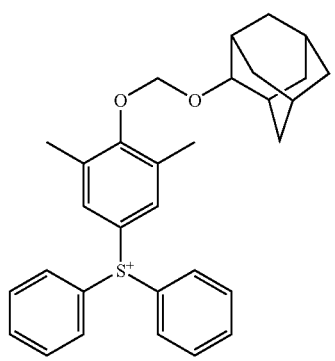
(Ib'-1-6)

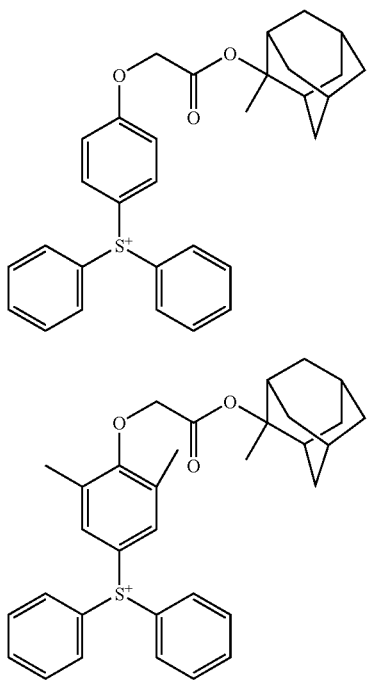

(Ib'-1-7)

(Ib'-1-8)

In the formula (Ib-2), $R^{15\prime}$ and $R^{16\prime}$ each independently represents an aryl group or an alkyl group. At least one of $R^{15\prime}$ and $R^{16\prime}$ represents an aryl group, and both of $R^{15\prime}$ and $R^{16\prime}$ are preferably aryl groups.

As the aryl group for $R^{15\prime}$ and $R^{16\prime}$, the same aryl groups as those for $R^{11\prime}$ to $R^{13\prime}$ above can be used.

As the alkyl group for $R^{15\prime}$ and $R^{16\prime}$, the same alkyl groups as those for $R^{11\prime}$ to $R^{13\prime}$ above can be used.

Of these, it is most preferable that both of $R^{15\prime}$ and $R^{16\prime}$ be phenyl groups.

Specific examples of the cation moiety represented by the formula (Ib-2) include diphenyliodonium and bis(4-tert-butylphenyl)iodonium.

As the cation moiety of the component (B1), a cation moiety represented by the formulae (Ib'-1-9) to (Ib'-1-10) shown below is also preferable.

In the formulae (Ib'-1-9) and (Ib'-1-10) shown below, $R^4$ and $R^{10}$ each independently represents a phenyl group which may contain a substituent, a naphthyl group which may contain a substituent, an alkyl group of 1 to 5 carbon atoms, an alkoxy group of 1 to 5 carbon atoms, or a hydroxyl group.

u represents an integer of 1 to 3, and is most preferably 1 or 2.

[Chemical Formula 44]

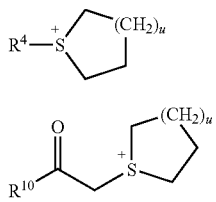

(Ib'-1-9)

(Ib'-1-10)

Also, the component (B1) may contain the same cation moiety as the cation moiety of the component (B2) described later.

In the present invention, however, the component (B1) is different from the component (B2).

In the present invention, the component (B1) is preferably a compound represented by the general formula (b1-1) or (b1-2) shown below.

[Chemical Formula 45]

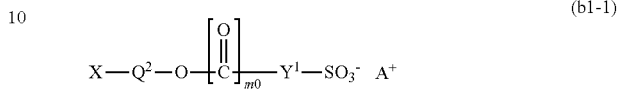

(b1-1)

(In the formula (b1-1), X and $Y^1$ are respectively as defined above; $Q^2$ represents a single bond or an alkylene group; m0 represents an integer of 0 or 1; and $A^+$ represents an organic cation.)

In the formula (b1-1), X is preferably an aliphatic cyclic group which may contain a substituent, a linear aliphatic hydrocarbon group which may contain a substituent, or an aromatic hydrocarbon group which may contain a substituent. Of these, X is particularly preferably an aliphatic cyclic group which contain a substituent having a hetero atom within the ring structure.

Examples of the alkylene group for $Q^2$ include the same alkylene groups as those described above for $Q^1$.

$Q^2$ is particularly preferably a single bond or a methylene group. Of these, if X is an aliphatic cyclic group which may contain a substituent, $Q^2$ is preferably a single bond, whereas if X is an aromatic hydrocarbon group, $Q^2$ is preferably a methylene group.

m0 may be either 0 or 1. If X is an aliphatic cyclic group which may contain a substituent, m0 is preferably 1, whereas if X is an aromatic hydrocarbon group which may contain a substituent or a linear aliphatic hydrocarbon group which may contain a substituent, m0 is preferably 0.

Examples of the organic cation for $A^+$ include the same organic cations as those described above for the cation moiety of the component (B1), and of these, a cation moiety represented by the above general formula (Ib-1) is most preferable.

[Chemical Formula 46]

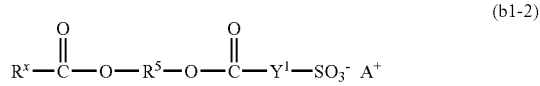

(b1-2)

(In the formula (b1-2), $Y^1$ and $A^+$ are respectively as defined above; $R^x$ represents an aliphatic group which may contain a substituent (exclusive of a nitrogen atom); and $R^5$ represents an alkylene group.)

In the formula, $R^x$ represents an aliphatic group which may contain a substituent (wherein, the substituent does not include a nitrogen atom), and specific examples thereof include the same aliphatic cyclic groups which may contain a substituent as those described above in the explanation of X in the above formula (b1-1), exclusive of aliphatic cyclic groups which contains a nitrogen atom or a substituent containing a nitrogen atom.

As $R^5$, the same alkylene groups as those described above in the explanation of $Q^2$ in the formula (b1-1) can be used.

The component (B1) is particularly preferably a compound represented by the general formulae (b1-1-1) to (b1-1-5) shown below, or a compound represented by the general formulae (b1-2-1) to (b1-2-3) shown below.

[Chemical Formula 47]

(b1-1-1)
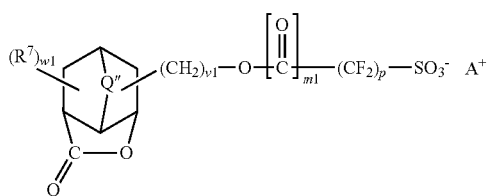

(b1-1-2)
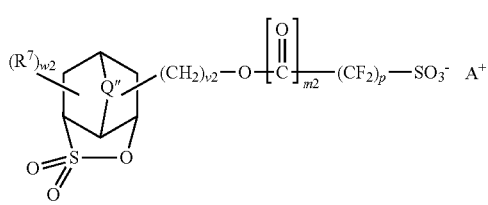

(b1-1-3)
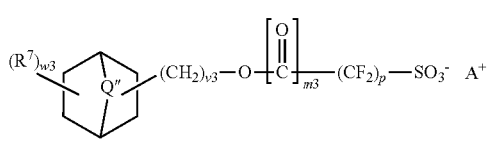

(b1-1-4)
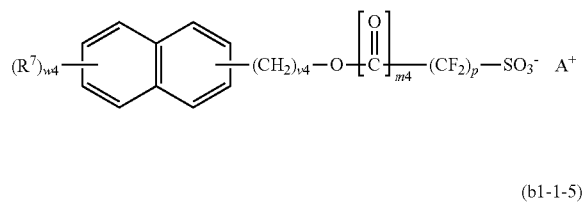

(b1-1-5)
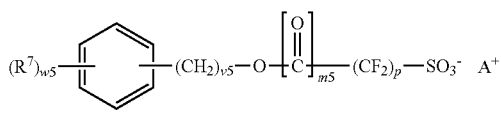

(In the formulae, Q" is as defined above; $R^7$ represents a substituent, w1 to w5 each independently represents an integer of 0 to 3; v1 to v5 each independently represents an integer of 0 to 5; m1 to m5 each independently represents an integer of 0 or 1; p represents an integer of 1 to 3; and $A^+$ represents an organic cation.)

As the substituent for $R^7$, substituents which an aliphatic hydrocarbon group may contain or substituents which an aromatic hydrocarbon group may contain, described above in X, can be used.

Each of the symbols (w1 to w5) attached at the bottom right of $R^7$ is an integer of two or more, a plurality of $R^7$ within the compound may be the same, or may be different from one another.

v1 to v5 each independently represents an integer of 0 to 3, and most preferably 0.

w1 to w5 each independently represents an integer of 0 to 2, and most preferably 0.

p is preferably 1 or 2, and most preferably 1.

$A^+$ represents an organic cation, and examples thereof include the same organic cations as those described above for the cation moiety of the component (B1).

[Chemical Formula 48]

(b1-2-1)
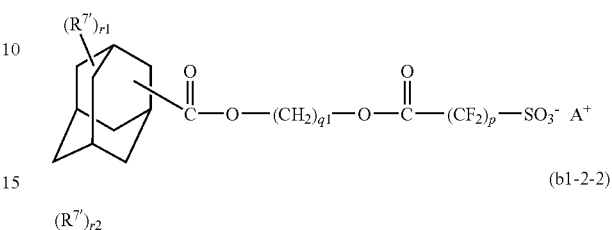

(b1-2-2)
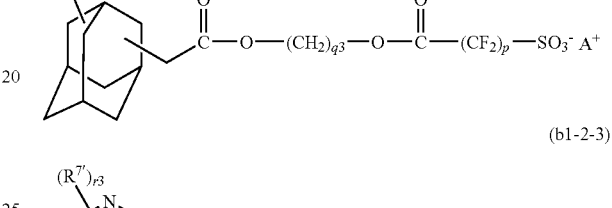

(b1-2-3)
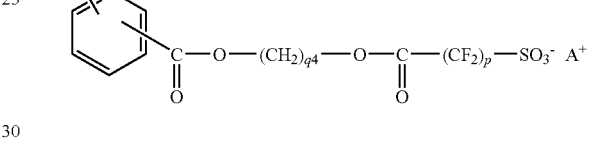

(In the above formulae, $A^+$ and p are respectively as defined above; $R^{7\prime}$ represents a substituent; r1 to r3 each independently represents an integer of 0 to 3; q1, q3, and q4 each independently represents an integer of 1 to 12.)

Examples of the substituent for $R^{7\prime}$ include the same substituents as those described above for $R^7$.

If each of the symbols (r1 and r3) attached at the bottom right of $R^{7\prime}$ is an integer of two or more, a plurality of $R^{7\prime}$ within the compound may be the same, or may be different from one another.

It is preferable that r1 to r3 each be independently an integer of 0 to 2, and more preferably 0 or 1.

It is preferable that q1, q3, and q4 each be independently an integer of 1 to 5, and more preferably an integer of 1 to 3.

Also, as the component (B1), a compound represented by general formula (b1-3-1) shown below or a compound represented by general formula (b1-4-1) shown below is particularly preferable.

[Chemical Formula 49]

(b1-3-1)
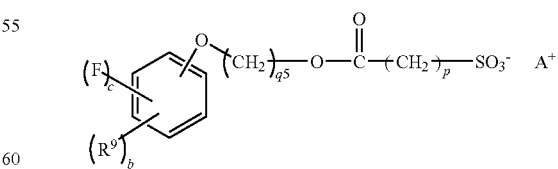

(In the formula, $A^+$ and p are respectively as defined above; q5 represents an integer of 0 to 5; $R^9$ represents an alkyl group, an alkoxy group, a halogen atom (exclusive of a fluorine atom), a halogenated alkyl group, a hydroxyl group, an oxygen atom (=O), —COOR", —OC(=O)R", a hydroxyalkyl group or a cyano group; b represents an integer of 0 to 2; c represents an integer of 1 to 5; and $1 \leq b \leq c \leq 5$.)

In the formula (b1-3-1), p is preferably 1 or 2, and most preferably 1.

q5 is preferably 1 to 4, more preferably 1 or 2, and most preferably 2.

Examples of the alkyl group, alkoxy group, halogen atom (exclusive of a fluorine atom), and halogenated alkyl group for $R^9$ include the same atoms and groups as those described in the explanation of the substituent which the cyclic group for X may contain.

R" in —COOR" and —OC(=O)R" for $R^9$ is the same as R" in the structural unit (a2) above.

Examples of the hydroxyalkyl group for $R^9$ include groups in which at least one of the hydrogen atoms of the alkyl group for $R^9$ above have been substituted with hydroxyl groups.

b is most preferably 0.

c is preferably 2 to 5, and most preferably 5.

In this regard, however, b and c meet the proviso of $1 \leq b+c \leq 5$.

[Chemical Formula 50]

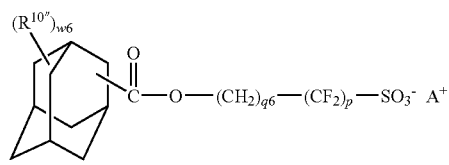

(b1-4-1)

(In the formula, $A^+$ and p are respectively as defined above; q6 represents an integer of 1 to 12; w6 represents an integer of 0 to 3; and $R^{10"}$ represents a substituent.)

In the above formula (b1-4-1), examples of the substituent for $R^{10"}$ include an alkyl group, an alkoxy group, a halogen atom, a halogenated alkyl group, a hydroxyl group, an oxygen atom (=O), and a cyano group.

The aforementioned alkyl group is preferably an alkyl group of 1 to 5 carbon atoms, and particularly preferably a methyl group, an ethyl group, a propyl group, an n-butyl group, or a tert-butyl group.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which a part or all of the hydrogen atom in an alkyl group of 1 to 5 carbon atoms, such as a methyl group, an ethyl group, a propyl group, an n-propyl group, an n-butyl group, and a tert-butyl group, are substituted with the halogen atoms.

If the symbol (w6) attached at the bottom right of $R^{10"}$ is an integer of two or more, a plurality of $R^{10"}$ within the compound may be the same, or may be different from one another.

p is preferably 1 or 2, and most preferably 1.

q6 is preferably 1 to 5, more preferably 1 to 3, and most preferably 1.

w6 is preferably an integer of 0 to 2, more preferably 0 or 1, and still more preferably 0.

As the component (B1), one kind may be used alone, or two or more kinds may be used in combination.

In the present invention, it is preferable to use a compound represented by the above general formula (b1-1) as the component (B1).

In the component (B), the proportion of the component (B1) is preferably 30% or more by weight, based on the total weight of the component (B), more preferably 50% or more by weight, still more preferably 70% or more by weight, still more preferably 80% or more by weight, particularly preferably 90% or more by weight, and may be 100% by weight. When the proportion of the component (B1) is 30% or more by weight, the effects of the present invention can be improved.

The component (B1) can be manufactured by using a conventional method. For example, a compound represented by the above general formula (b1-1), a compound represented by the above general formula (b1-2), a compound represented by the above general formula (b1-3-1), and a compound represented by the above general formula (b1-4-1) can respectively be manufactured by the following manner.

[Method of Manufacturing Compound Represented by General Formula (b1-1)]

The compound (b1-1) represented by the general formula (b1-1) can be manufactured by reacting a compound (b0-1) represented by the general formula (b0-1) shown below and a compound (b0-2) represented by the general formula (b0-2) shown below.

[Chemical Formula 51]

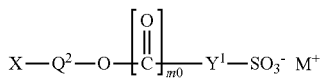

(b0-1)

(b0-2)

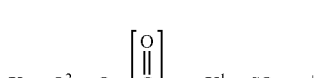

(b1-1)

In the formulae (b0-1) and (b0-2), X, $Q^2$, m0, $Y^1$, and $A^+$ are respectively the same as X, $Q^2$, m0, $Y^1$, and $A^+$ in the above formula (b1-1).

$M^+$ represents an alkali metal ion. Examples of the alkali metal ion for $M^+$ include a sodium ion, a lithium ion, and a potassium ion. Of these, a sodium ion or a lithium ion is preferable.

$Z^-$ represents a non-nucleophilic ion.

Examples of the non-nucleophilic ion include $BF_4^-$, $AsF_6^-$, $SbF_6^-$, $PF_6^-$, $ClO_4^-$, halogen ions such as a bromine ion and a chlorine ion, and an ion which is capable of forming an acid exhibiting a lower acidity than the compound (b0-1).

As the ion which is capable of forming an acid exhibiting a lower acidity than the compound (b0-1) for $Z^-$, sulfonate ions such as a p-toluenesulfonate ion, a methanesulfonate ion, and a benzenesulfonate ion can be used.

The compound (b0-1) or (b0-2) may be a commercially available compound, or may be synthesized by using a conventional method.

There is no particular restriction on the method of manufacturing the compound (b0-1). For example, a compound represented by the general formula (b0-1-11) shown below is reacted within an aqueous solution of an alkali metal hydroxide such as a sodium hydroxide or a lithium hydroxide in a solvent such as a tetrahydrofuran or water, thereby obtaining a compound represented by the general formula (b0-1-12)

shown below, and then the compound represented by the general formula (b0-1-12) is condensed with an alcohol represented by the general formula (b0-1-13) shown below in the presence of an acid catalyst in an organic solvent such as benzene or dichloroethane, thereby obtaining a compound represented by the general formula (b0-1) in which m0 is 1 (that is, a compound represented by the general formula (b0-1-1) shown below).

[Chemical Formula 52]

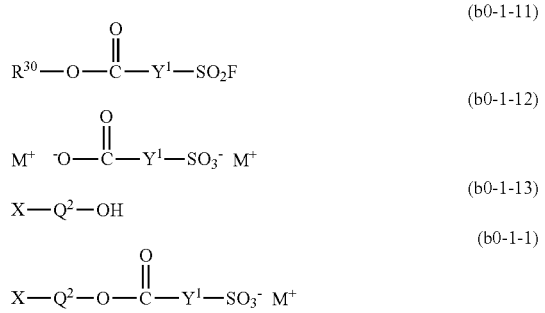

(In the formulae, $R^{30}$ represents an alkyl group of 1 to 5 carbon atoms; and X, $Q^2$, $Y^1$, and $M^+$ are respectively the same as X, $Q^2$, $Y^1$, and $M^+$ in the formula (b0-1).)

Also, for example, a compound represented by the general formula (b0-1-01) shown below and a compound represented by the general formula (b0-1-02) shown below are reacted in an organic solvent such as anhydrous diglyme, thereby obtaining a compound represented by the general formula (b0-1-03) shown below, and then the compound represented by the general formula (b0-1-03) is reacted with an alkali metal hydroxide such as a sodium hydroxide or a lithium hydroxide in an organic solvent such as tetrahydrofuran, acetone, and methyl ethyl ketone, thereby obtaining a compound represented by the general formula (b0-1) in which m0 is 0 (that is, a compound represented by the general formula (b0-1-0) shown below).

The halogen atom for $X_h$ in the formula (b0-1-02) is preferably a bromine atom or a chlorine atom.

[Chemical Formula 53]

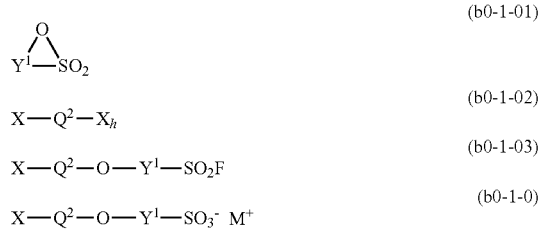

(In the formulae, X, $Q^2$, and $M^+$ are respectively the same as X, $Q^2$, $Y^1$, and $M^+$ in the formula (b0-1); and $X_h$ represents a halogen atom.)

The compound (b0-2) can be manufactured, for example, by introducing an acid dissociable, dissolution inhibiting group into an onium salt containing a cation moiety of an onium salt-based acid generator conventionally suggested as an acid generator for a chemically amplified resist.

There are no particular restrictions on the method of introducing an acid dissociable, dissolution inhibiting group, and conventional methods can be used. For example, a method can be used in which an onium salt containing a hydrophilic group such as a hydroxyl group and a carboxyl group within the cation moiety is prepared, and then the hydrogen atom of the hydrophilic group is substituted with an acid dissociable, dissolution inhibiting group.

The reaction of the compound (b0-1) with the compound (b0-2) can be performed, for example, by dissolving these compounds in a solvent such as water, dichloromethane, acetonitrile, methanol, chloroform, or methylene chloride, and stirring the solution thus obtained.

The reaction temperature is preferably 0 to 150° C., and more preferably 0 to 100° C. Typically, the reaction time is preferably 0.5 to 10 hours, and more preferably 1 to 5 hours, although it is different according to the reactivity of the compound (b0-1) and the compound (b0-2), the reaction temperature, and the like.

The amount of the compound (b0-2) used in the above reaction is usually 0.5 to 2 mol, relative to 1 mol of the compound (b0-1).

After the reaction, the compound (b1-1) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

The structure of the compound (b1-1) obtained by the above method can be confirmed by a general organic analysis method such as a $^1$H-nuclear magnetic resonance (NMR) spectrum method, a $^{13}$C-NMR spectrum method, a $^{19}$F-NMR spectrum method, an infrared resonance (IR) spectrum method, a mass spectrometry (MS) method, an element analysis method, and an X-ray crystallographic analysis method.

[Method of Manufacturing Compound Represented by General Formula (b1-2)]

The compound (b1-2) represented by general formula (b1-2) can be manufactured by reacting a compound (b0-01) represented by general formula (b0-01) shown below and a compound (b0-02) represented by general formula (b0-02) shown below.

In the formulae, examples of the non-nucleophilic ion for $Z^-$ include $BF_4^-$, $AsF_6^-$, $SbF_6^-$, $PF_6^-$, $ClO_4^-$, halogen ions such as a bromine ion and a chlorine ion, and an ion which is capable of forming an acid exhibiting a lower acidity than the compound (b0-01).

As the ion which is capable of forming an acid exhibiting a lower acidity than the compound (b0-01) for $Z^-$, sulfonate ions such as a p-toluenesulfonate ion, a methanesulfonate ion, and a benzenesulfonate ion can be used.

[Chemical Formula 54]

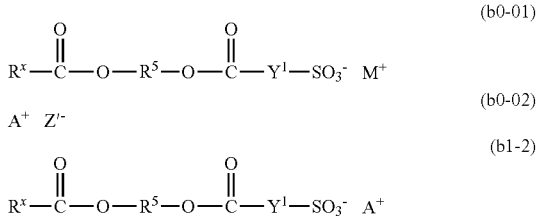

(In the formulae, $R^X$, $R^5$, $Y^1$, $M^+$, and $A^+$ are, respectively, as defined above; and $Z'^-$ represents a non-nucleophilic ion.)

The compound represented by the general formula (b0-01) can be manufactured, for example, by reacting a compound (4-3) represented by the general formula (4-3) shown below and a compound (5-1) represented by the general formula (5-1) shown below.

[Chemical Formula 55]

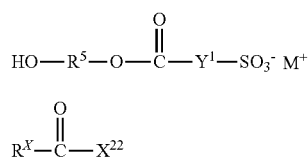

(In the above formulae, $R^X$, $R^5$, $Y^1$, and $M^+$ are respectively as defined above; and $X^{22}$ represents a halogen atom.)

Examples of the halogen atom for $X^{22}$ include a bromine atom, a chlorine atom, an iodine atom, and a fluorine atom. Of these, a bromine atom or a chlorine atom is preferable because it excels in reactivity, and a chlorine atom is particularly preferable.

As each of the compounds (4-3) and (5-1), a commercially available compound may be used, or each of the compounds may be synthesized to be used.

Examples of the preferable synthesis method for the compound (4-3) include a method in which a compound (4-1) represented by the general formula (4-1) shown below is reacted with a compound (4-2) represented by the general formula (4-2) shown below, thereby obtaining the compound (4-3).

[Chemical Formula 56]

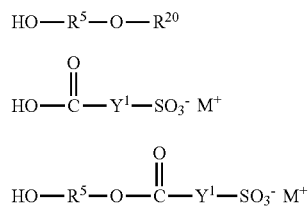

(In the above formulae, $R^5$, $Y^1$, and $M^+$ are respectively as defined above; $R^{20}$ represents an aliphatic group which may contain an aromatic group as a substituent.

In the above formula (4-1), $R^{20}$ represents an aliphatic group which may contain an aromatic group as a substituent.

The aliphatic group may be either a saturated aliphatic group or an unsaturated aliphatic group. Also, the aliphatic group may be linear, branched, or cyclic, or may be a combination thereof.

The aliphatic group may be either an aliphatic hydrocarbon group consisting of carbon atoms and hydrogen atoms, a group in which a part of the carbon atoms which constitute the above aliphatic hydrocarbon group are substituted with substituents containing a hetero atom, or a group in which a part or all of the hydrogen atoms which constitute the above aliphatic hydrocarbon group are substituted with substituents containing a hetero atom.

The hetero atom is not particularly restricted, as long as it is an atom other than a carbon atom and a hydrogen atom, and examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may be an atom/group consisting of a hetero atom, or may be a group containing a group or an atom other than the hetero atom.

As the substituents which are substituted for a part of carbon atoms which constitute the above aliphatic hydrocarbon group, for example, —O—, —(=O)—O—, —C(=O)—, —O—C(=O)—O—, —C(=O)—NH—, —NH— (wherein H may be substituted with a substitutent such as an alkyl group and an acyl group), —S—, —S(=O)$_2$—, or —S(=O)$_2$—O— can be used. If the aliphatic group contains a cyclic group, the above substituents may be contained in a ring structure of the cyclic group.

Specific examples of the substituents which are substituted for a part or all of the hydrogen atoms which constitute the above aliphatic hydrocarbon group include an alkoxy group, a halogen atom, a halogenated alkyl group, a hydroxyl group, an oxygen atom (=O), —COOR$^{96}$, —OC(=O)R$^{97}$, and a cyano group.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which a part or all of the hydrogen atom in an alkyl group of 1 to 5 carbon atoms, such as a methyl group, an ethyl group, a propyl group, an n-butyl group, and a tert-butyl group, are substituted with the halogen atoms.

$R^{96}$ and $R^{97}$ each independently represents a hydrogen atom, or a linear, branched or cyclic alkyl group of 1 to 15 carbon atoms.

When the alkyl group for $R^{96}$ and $R^{97}$ is linear or branched, the alkyl group preferably has 1 to 10 carbon atoms, more preferably 1 to 5 carbon atoms, and still more preferably 1 or 2. Specific examples thereof include the same linear or branched monovalent saturated hydrocarbon groups as those described below.

When the alkyl group for $R^{96}$ and $R^{97}$ is cyclic, the cyclic alkyl group may be monocyclic or polycyclic. The cyclic alkyl group preferably has 3 to 15 carbon atoms, more preferably 4 to 12 carbon atoms, and still more preferably 5 to 10 carbon atoms. Specific examples thereof include the same cyclic monovalent saturated hydrocarbon groups as those described below.

The aliphatic hydrocarbon group is preferably a linear or branched saturated hydrocarbon group of 1 to 30 carbon atoms, a linear or branched monovalent unsaturated hydrocarbon group of 2 to 10 carbon atoms, or a cyclic aliphatic hydrocarbon group (aliphatic cyclic group) of 3 to 30 carbon atoms.

The linear saturated hydrocarbon group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The unsaturated hydrocarbon group preferably has 2 to 5 carbon atoms, more preferably 2 to 4 carbon atoms, and still more preferably 3 carbon atoms. Examples of the linear monovalent unsaturated hydrocarbon group include a vinyl group, a propenyl group (allyl group) and a butynyl group. Examples of the branched monovalent unsaturated hydrocarbon group include a 1-methylpropenyl group and a 2-methylpropenyl group.

Of these, the unsaturated hydrocarbon group is particularly preferably a propenyl group.

The aliphatic cyclic group may be a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples thereof include groups in which one or more of hydrogen atoms have been removed from a monocycloalkane; and groups in which one or more of hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane and cyclohexane; and groups in which at least one hydrogen atom has been removed from a polycycloalkane such as adamantane, norbornane, isobornane, tricyclodecane or tetracyclododecane.

In the above formula (4-1), the above aliphatic group for $R^{20}$ may contain an aromatic group as a substituent.

Examples of the aromatic group include aryl groups in which one hydrogen atom has been eliminated from an aromatic hydrocarbon ring, such as a phenyl group, a biphenyl group, a fluorenyl group, a napthyl group, an anthryl group, and phenanthryl group; and heteroaryl groups in which a part of the carbon atoms which constitutes the ring(s) of the abovementioned aryl groups are substituted with heteroatoms such as an oxygen atom, a sulfur atom, and a nitrogen atom.

These aromatic groups may contain a substituent such as an alkyl group of 1 to 10 carbon atoms, a halogenated alkyl group, alkoxy group, a hydroxyl group, and a halogen atom. The alkyl group or halogenated alkyl group as the substituent preferably has 1 to 8 carbon atoms, and more preferably 1 to 4 carbon atoms. Also, the halogenated alkyl group for the substituent is preferably a fluorinated alkyl group. Examples of the halogen atom include a fluorine atom, a chlorine atom, an iodine atom, and a bromine atom. Of these, a fluorine atom is preferable.

Here, if $R^{20}$ within the compound (4-1) is an aromatic group, that is, if the oxygen atom adjacent to $R^{20}$ is directly bonded to the aromatic ring without involving an aliphatic group, the reaction of the compound (4-1) with the compound (4-2) does not make progress, and thus the compound (4-3) cannot be obtained.

As the compounds (4-1) and (4-2), a commercially available compound may be used, or the compounds (4-1) and (4-2) may be synthesized by using a conventional method.

For example, the compound (4-2) can be obtained by a method including steps of: heating a compound (0-1) represented by the general formula (0-1) shown below in the presence of an alkali, followed by neutralization, thereby obtaining a compound (0-2) represented by the general formula (0-2) shown below (hereinafter, referred to as "salt formation step"); and heating the above compound (0-2) in the presence of an acid which exhibits acidity stronger than the compound (4-2), thereby obtaining the compound (4-2) (hereinafter, referred to as "carboxylic acid-formation step").

[Chemical Formula 57]

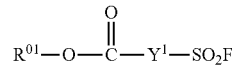
(0-1)

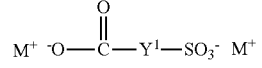
(0-2)

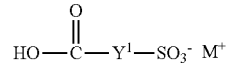
(4-2)

(In the formula, $R^{01}$ represents an alkyl group; and $Y^1$ and $M^+$ are respectively as defined above.)

The alkyl group for $R^{01}$ is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group, and a neopentyl group.

Of these, an alkyl group of 1 to 4 carbon atoms is preferable, and a methyl group is most preferable.

As the compound (0-1), a commercially available compound can be used.

The salt formation step can be performed, for example, by dissolving the compound (0-1) in a solvent, adding an alkali to the resulting solution, and heating it.

The solvent is not particularly restricted as long as it can dissolve the compound (0-1), and examples thereof include water and tetrahydrofuran.

As the alkali, an alkali corresponding to M in the formula (0-2) is used, and examples thereof include alkali metal hydroxides such as sodium hydroxide, potassium hydroxide, and lithium hydroxide.

The amount of the alkali used is preferably 1 to 5 mol, and more preferably 2 to 4 mol, relative to 1 mol of the compound (0-1).

The heating temperature is preferably approximately 20 to 120° C., and more preferably approximately 50 to 100° C. The heating time is typically preferably 0.5 to 12 hours, and more preferably 1 to 5 hours, although it differs depending on conditions such as the heating temperature.

The neutralization after the above heating treatment can be performed by adding an acid such as hydrochloric acid, sulfuric acid, or p-toluenesulfonic acid to the reaction solution after the above heating treatment.

Here, it is preferable that the neutralization be performed so that the reaction solution after addition of the acid has a pH of 6 to 8 (25° C.). Also, the temperature of the reaction solution in the neutralization treatment is preferably 20 to 30° C., and more preferably 23 to 27° C.

After the reaction, the compound (0-2) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

In the carboxylic acid-formation step, the compound (4-2) can be obtained by heating the compound (0-2) obtained by the above salt formation step in the presence of an acid which exhibits acidity stronger than the compound (4-2).

The expression "an acid which exhibits acidity stronger than the compound (4-2)" means an acid which has a value of pKa (25° C.) smaller than —COOH within the compound (4-2). Hereinafter, "an acid which exhibits acidity stronger than the compound (1-2)" is sometimes referred to "strong acid" to simplify the description. By using the strong acid, —COO$^-$M$^+$ within the compound (0-2) is changed to —COOH, thereby obtaining the compound (4-2).

As the strong acid, any of acids which have a value of pKa smaller than pKa of —COOH within the compound (4-2), arbitrarily selected from conventional acids, may be used. pKa of —COOH within the compound (4-2) can be determined by using a conventional titration method.

Specific examples of the strong acid include sulfonic acids such as aryl sulfonic acid and alkyl sulfonic acid, sulfuric acid, and hydrochloric acid. Examples of the aryl sulfonic acid include p-toluenesulfonic acid. Examples of the alkyl sulfonic acid include methane sulfonic acid and trifluoromethane sulfonic acid. The strong acid is particularly preferably p-toluenesulfonic acid, because it can be easily dissolved in an organic solvent and can be easily purified.

The carboxylic acid-formation step can be performed, for example, by dissolving the compound (0-2) in a solvent, adding an acid thereto, and heating the resulting solution.

The solvent is not particularly restricted as long as it can dissolve the compound (0-2), and examples thereof include acetonitrile and methyl ethyl ketone.

The amount of the strong acid used is preferably 0.5 to 3 mol, and more preferably 1 to 2 mol, relative to 1 mol of the compound (0-2).

The heating temperature is preferably approximately 20 to 150° C., and more preferably approximately 50 to 120° C. The heating time is typically preferably 0.5 to 12 hours, and more preferably 1 to 5 hours, although it differs depending on conditions such as the heating temperature.

After the reaction, the compound (4-2) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

There are no particular restrictions on the method of reacting the compounds (4-3) and (5-1), and examples thereof include a method of contacting the compound (4-3) with the compound (5-1) in a reaction solvent. This method can be performed, for example, by adding the compound (5-1) to the solution in which the compound (4-3) is dissolved in a reaction solvent in the presence of a base.

There are no particular restrictions on the reaction solvent as long as it can dissolve the compounds (4-3) and (5-1) as the materials, and examples of the reaction solvent include tetrahydrofuran (THF), acetone, dimethylformamide (DMF), dimethylacetoamide, dimethylsulfoxide (DMSO), and acetonitrile.

Examples of the base include organic bases such as triethylamine, 4-dimethylaminopyridine (DMAP), and pyridine; and inorganic bases such as sodium hydroxide, K$_2$CO$_3$, and Cs$_2$CO$_3$.

The additive amount of the compound (5-1) is preferably 1 to 3 equivalent, and more preferably 1 to 2 equivalent, based on the compound (4-3).

The reaction temperature is preferably −20 to 40° C., and more preferably 0 to 30° C. The reaction time is typically preferably 1 to 120 hours, and more preferably 1 to 48 hours, although it is different according to the reactivity of the compound (4-3) and the compound (5-1), the reaction temperature, and the like.

The reaction of the compounds (b0-01) and (b0-2) can be performed using conventional salt substitution methods. For example, the compounds (b0-01) and (b0-02) can be reacted by dissolving the compounds in a solvent such as water, dichloromethane, acetonitrile, methanol, or chloroform and then stirring them.

The reaction temperature is preferably 0 to 150° C., and more preferably 0 to 100° C. Typically, the reaction time is preferably 0.5 to 10 hours, and more preferably 1 to 5 hours, although it is different according to the reactivity of the compound (b0-1) and the compound (b0-02), the reaction temperature, and the like.

After the reaction, the compound (b1-2) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

The structure of the compound (b1-2) obtained by the above method can be confirmed by a general organic analysis method such as a $^1$H-nuclear magnetic resonance (NMR) spectrum method, a $^{13}$C-NMR spectrum method, a $^{19}$F-NMR spectrum method, an infrared resonance (IR) spectrum method, a mass spectrometry (MS) method, an element analysis method, and an X-ray crystallographic analysis method.

[Method of Manufacturing Compound Represented by General Formula (b1-3-1)]

The compound (b1-3-1) represented by the formula (b1-3-1) can be manufactured by reacting the compound (I-5) represented by the general formula (I-5) shown below with the compound (b0-2) represented by the general formula (b0-2) shown below.

[Chemical Formula 58]

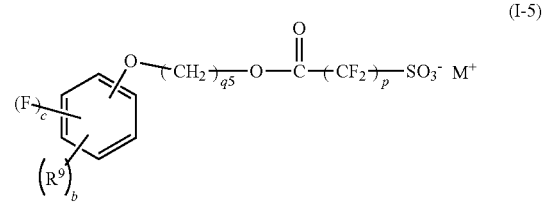

(I-5)

A$^+$ Z$^-$ (b0-2)

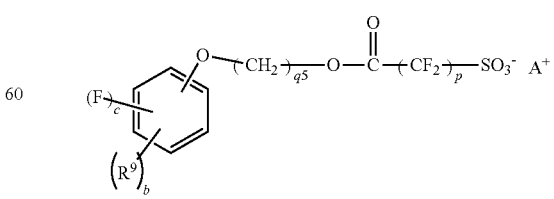

(b1-3-1)

(In the formulae, R$^9$, b, c, q5 and p are respectively the same as R$^9$, b, c, q5 and p in the above formula (b1-3-1); M$^+$ is as defined above; and Z⁻ and A⁺ are respectively the same as Z⁻ and A⁺ in the above formula (b0-2).)

The compound (I-5) or (b0-2) may be a commercially available compound, or may be synthesized by using a conventional method.

There are no particular restrictions on the manufacturing method of the compound (I-5), and for example, the compound (I-5) can be manufactured by condensing the compound (4-2) represented by the general formula (4-2) shown below and the compound (I-4) represented by the general formula (I-4) shown below in the presence of an acidic catalyst.

[Chemical Formula 59]

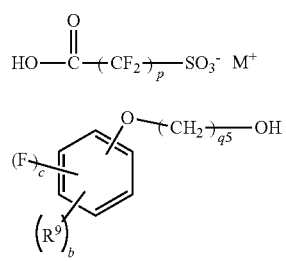

(4-2)

(I-4)

The compound (4-2) is the same as the compound (4-2) used in the synthesis of the above compound (4-3).

In the above general formula (I-4), $R^9$, b, c and q5 are respectively the same as $R^9$, b, q5 and c in the above formula (b1-3-1).

Each of the compounds (4-2) and (I-4) may be a commercially available compound, or may be a compound obtained by a synthesis.

The dehydration/condensation reaction of the compound (4-2) and the compound (I-4) can be performed, for example, by dissolving the compounds (4-2) and (I-4) in an aprotic organic solvent such as dichloroethane, benzene, toluene, ethylbenzene, chlorobenzene, acetonitrile, and N,N-dimethylformamide, and then stirring the solution in the presence of an acidic catalyst.

In the dehydration/condensation reaction described above, it is preferable to use an aromatic-based organic solvent such as toluene, xylene, or chlorobenzene as the organic solvent, because it improves the yield, purity and the like of the compound (I-5) obtained.

The reaction temperature of the dehydration/condensation reaction is preferably 20° C. to 200° C., and more preferably 50° C. to 150° C. The reaction time is typically preferably 1 to 30 hours, and more preferably 3 to 30 hours, although it is different according to the reactivity of the compound (4-2) and the compound (I-4), the reaction temperature, and the like.

There are no particular restrictions on the amount of the compound (4-2) in the dehydration/condensation reaction. Typically, the amount is preferably approximately 0.2 mol to 3 mol, more preferably approximately 0.5 to 2 mol, and most preferably approximately 0.75 to 1.5 mol, relative to 1 mol of the compound (I-4).

Examples of the acidic catalyst include an organic acid such as p-toluenesulfonic acid; and an inorganic acid such as sulfuric acid, hydrochloric acid, or the like. One type of these acidic catalysts may be used alone, or two or more types may be used in combination.

The amount of the acidic catalyst in the dehydration/condensation reaction may be a catalyst amount, and usually approximately within the range of 0.001 to 5 mol, relative to 1 mol of the compound (I-4).

The dehydration/condensation reaction may be performed while removing water thus generated in the reaction by using a dean-stark apparatus or the like. This enables the reaction time to be shortened.

Also, in the dehydration/condensation reaction, a dehydration agent such as 1,1'-carbonyldiimidazole or N,N'-dicyclohexylcarbodiimide may be concomitantly used.

In the case of using the dehydration agent, the amount of the dehydration agent is usually preferably within the range of 0.2 to 5 mol, and more preferably within the range of 0.5 to 3 mol, relative to 1 mol of the compound (I-4).

The reaction of the compound (I-5) with the compound (b0-2) can be performed, for example, by dissolving these compounds in a solvent such as water, dichloromethane, acetonitrile, methanol, chloroform, or methylene chloride, and stirring the solution thus obtained.

The reaction temperature is preferably 0 to 150° C., and more preferably 0 to 100° C. Typically, the reaction time is preferably 0.5 to 10 hours, and more preferably 1 to 5 hours, although it is different according to the reactivity of the compound (I-5) and the compound (b0-2), the reaction temperature, and the like.

It is typically preferable that the amount of the compound (b0-2) used in the above reaction be approximately within the range of 0.5 to 2 mol, relative to 1 mol of the compound (I-5).

After the reaction, the compound (b1-3) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

[Method of Manufacturing Compound Represented by General Formula (b1-4-1)]

The compound (b1-4-1) represented by the formula (b1-4-1) can be manufactured by reacting the compound (I-6) represented by the general formula (I-6) shown below with the compound (b0-2) represented by the general formula (b0-2) shown below.

[Chemical Formula 60]

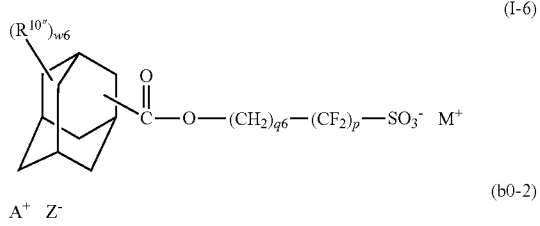

(I-6)

(b0-2)

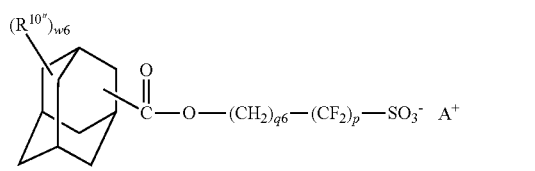

(b1-4-1)

(In the formulae, p, q6, w6, and $R^{10''}$ are respectively the same as p, q6, w6, and $R^{10''}$ in the above formula (b1-4-1); M⁺ is as defined above; and Z⁻ and A⁺ are respectively the same as Z⁻ and A⁺ in the above formula (b0-2).)

The compound (I-6) or (b0-2) may be a commercially available compound, or may be synthesized by using a conventional method.

There are no particular restrictions on the manufacturing method of the compound (I-6), and the compound (I-6) can be manufactured by using a conventional manufacturing method.

The reaction of the compound (I-6) with the compound (b0-2) can be performed, for example, by dissolving these compounds in a solvent such as water, dichloromethane, acetonitrile, methanol, chloroform, or methylene chloride, and stirring the solution thus obtained.

The reaction temperature is preferably 0 to 150° C., and more preferably 0 to 100° C. Typically, the reaction time is preferably 0.5 to 10 hours, and more preferably 1 to 5 hours, although it is different according to the reactivity of the compound (I-6) and the compound (b0-2), the reaction temperature, and the like.

It is typically preferable that the amount of the compound (b0-2) used in the above reaction be approximately within the range of 0.5 to 2 mol, relative to 1 mol of the compound (I-6).

After the reaction, the compound (b1-4) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

The structure of the compound obtained by the above method can be confirmed by a general organic analysis method such as a $^1$H-nuclear magnetic resonance (NMR) spectrum method, a $^{13}$C-NMR spectrum method, a $^{19}$F-NMR spectrum method, an infrared resonance (IR) spectrum method, a mass spectrometry (MS) method, an element analysis method, and an X-ray crystallographic analysis method.

[Component (B2)]

The resist composition of the present invention may include an acid generator (hereinafter, referred to as "component (B2)") other than the above component (B1) as the component (B), if required.

As the component (B2), there is no particular limitations as long as it is an acid generator other than the component (B1), and any of the known acid generators used in conventional chemically-amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by the general formula (b-1) or (b-2) shown below can be used.

[Chemical Formula 61]

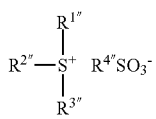

(b-1)

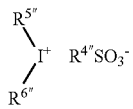

(b-2)

(In the formula (b-1), $R^{1\prime\prime\prime}$ to $R^{3\prime\prime\prime}$ each independently represents an aryl group which may contain a substituent, or an alkyl group which may contain a substituent; at least one of $R^{1\prime\prime\prime}$ to $R^{3\prime\prime\prime}$ represents an aryl group; and two of $R^{1\prime\prime\prime}$ to $R^{3\prime\prime\prime}$ may be bonded to each other to form a ring together with the sulfur atom within the formula. In the formula (b-2), $R^{5\prime\prime\prime}$ and $R^{6\prime\prime\prime}$ each independently represents an aryl group which may contain a substituent, or an alkyl group which may contain a substituent; and at least one of $R^{5\prime\prime\prime}$ and $R^{6\prime\prime\prime}$ represents an aryl group. In the formulae (b-1) and (b-2), $R^{4\prime\prime\prime}$ represents a linear, branched, or cyclic alkyl group or a linear, branched, or cyclic fluorinated alkyl group.)

In the formula (b-1), $R^{1\prime\prime\prime}$ to $R^{3\prime\prime\prime}$ are respectively the same as $R^{11\prime}$ to $R^{13\prime}$ in the above formula (Ib-1).

In the formula (b-2), $R^{5\prime\prime\prime}$ and $R^{6\prime\prime\prime}$ are respectively the same as $R^{15\prime}$ and $R^{16\prime}$ in the above formula (Ib-2).

Also, an onium salt-based acid generator can be used in which the cation moiety in the above general formula (b-1) or (b-2) is replaced by a cation moiety represented by the above formulae (Ib'-1-9) to (Ib'-1-10).

In the formula (b-1), $R^{4\prime\prime\prime}$ represents a linear, branched or cyclic alkyl group, or a linear, branched or cyclic fluorinated alkyl group.

The number of carbon atoms within the linear or branched alkyl group for $R^{4\prime\prime\prime}$ is preferably 1 to 10, more preferably 1 to 8, and most preferably 1 to 4.

Examples of the cyclic alkyl group for $R^{4\prime\prime\prime}$ include the same cyclic groups as those described above in $R^{1\prime\prime\prime}$. The number of carbon atoms within the cyclic alkyl group for $R^{4\prime\prime\prime}$ is preferably 4 to 15, more preferably 4 to 10, and most preferably 6 to 10.

The number of carbon atoms within the fluorinated alkyl group is preferably 1 to 10, more preferably 1 to 8, and most preferably 1 to 4.

Furthermore, the fluorination rate of the fluorinated alkyl group (proportion of fluorine atoms in the alkyl group) is preferably within a range from 10 to 100%, more preferably from 50 to 100%, and those wherein all hydrogen atoms are substituted with fluorine atoms (perfluoroalkyl groups) are particularly preferable, because the strength of the acid increases.

$R^{4\prime\prime\prime}$ is most preferably a linear or cyclic alkyl group, or a linear or cyclic fluorinated alkyl group.

$R^{4\prime\prime\prime}$ in the general formula (b-2) is the same as those described for $R^{4\prime\prime\prime}$ in the general formula (b-1) shown above.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate, n-octanesulfonate, 1-adamantane sulfonate, or 2-norbornane sulfonate; a sulfonate such as d-camphar-10-sulfonate, benzene sulfonate, perfluorobenzene sulfonate, or p-toluene sulfonate.

Further, an onium salt-based acid generator in which the anion moiety in the general formula (b-1) or (b-2) is substituted with an anion moiety represented by the general formula (b-3) or (b-4) shown below can also be used. Here, the cation moiety is the same as those described in the general formula (b-1) or (b-2).

[Chemical Formula 62]

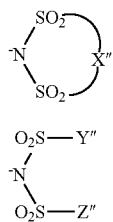

(b-3)

(b-4)

(In the formula, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group for X" is 2 to 6, preferably 3 to 5, and most preferably 3.

Y" and Z" each independently represents a linear or branched alkyl group in which at least one hydrogen atom is substituted with a fluorine atom. The number of carbon atoms in the alkyl group for Y" and Z" is 1 to 10, preferably 1 to 7, and more preferably 1 to 3.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The proportion of fluorine atoms in the alkylene group or alkyl group, that is, the fluorination rate is preferably within the range of 70 to 100%, and more preferably 90 to 100%. A perfluoroalkylene group or a perfluoroalkyl group wherein all hydrogen atoms are substituted with fluorine atoms is most preferable.

Furthermore, a sulfonium salt that contains a cation moiety represented by the general formula (b-5) or (b-6) shown below can be used as an onium salt-based acid generator.

[Chemical Formula 63]

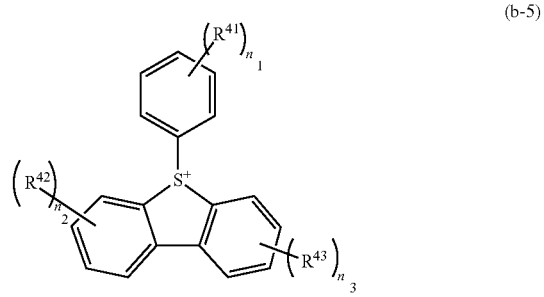

(b-5)

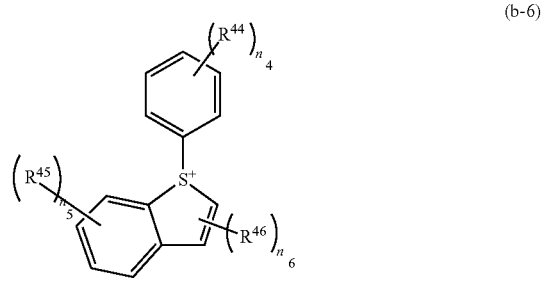

(b-6)

(In the formulae, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.)

The alkyl group for $R^{41}$ to $R^{46}$ is preferably an alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ in the formulae (b-5) and (b-6) is preferably a group in which one or more hydrogen atoms in the alkyl group for $R^{41}$ to $R^{46}$ are substituted with hydroxyl groups, and examples thereof include a hydroxymethyl group, a hydroxyethyl group, and a hydroxypropyl group.

When the subscripts $n_1$ to $n_6$ attached at the bottom right of $R^{41}$ to $R^{46}$ represent an integer of 2 or more, a plurality of $R^{41}$ to $R^{46}$ may be the same or different.

$n_1$ is preferably 0 to 2, more preferably 0 or 1, and still more preferably 0.

It is preferable that $n_2$ and $n_3$ each be independently 0 or 1, and it is more preferable that they be 0.

$n_4$ is preferably 0 to 2, and more preferably 0 or 1.

$n_5$ is preferably 0 or 1, and more preferably 0.

$n_6$ is preferably 0 or 1, and more preferably 1.

There is no particular restriction on an anion moiety of a sulfonium salt that contains the cation moiety represented by the general formula (b-5) or (b-6), and anion moieties for onium salt-based acid generators which have been proposed may be used as the anion moieties. Examples of the anion moieties include a fluorinated alkylsulfonate ion such as the anion moiety ($R^{4''}SO_3^-$) of the onium salt-based acid generator represented by the general formula (b-1) or (b-2); and an anion moiety represented by the general formula (b-3) or (b-4). Of these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly preferable. Specific examples thereof include a trifluoromethylsulfonate ion, a heptafluoro-n-propylsulfonate ion, and a nonafluoro-n-butylsulfonate ion.

In the present specification, the term "oxime sulfonate-based acid generator" means a compound which has at least one of the groups represented by the general formula (B-1) shown below, and has a property that generates an acid upon exposure to radiation. These kinds of oxime sulfonate-based acid generators are widely used for a chemically-amplified resist composition, so any oxime sulfonate-based acid generator, arbitrarily selected from these, can be used.

[Chemical Formula 64]

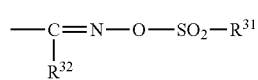

(B-1)

(in the general formula (B-1), $R^{31}$ and $R^{32}$ each independently represents an organic group.)

The organic group for $R^{31}$ and $R^{32}$ is a group containing carbon atoms, and may further contain atoms other than carbon atoms (for example, a hydrogen atom, an oxygen atom, a nitrogen atom, a sulfur atom or a halogen atom (a fluorine atom, a chlorine atom or the like)).

The organic group for $R^{31}$ is preferably a linear, branched or cyclic alkyl group or an aryl group. The alkyl group or aryl group may contain a substituent. There is no particular restriction on the substituent, and examples thereof include a fluorine atom, and a linear, branched or cyclic alkyl group of 1 to 6 carbon atoms. Here, the term "containing a substituent" means that a part or all of hydrogen atoms in the alkyl group or aryl group are substituted with substituent groups.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group as the organic group for $R^{31}$ is particularly preferably an alkyl group which is partially or completely halogenated (hereinafter, sometimes referred to as a halogenated alkyl group). Here, a partially halogenated alkyl group means an alkyl group in which a part of the hydrogen atoms are substituted with halogen atoms, and a completely halogenated alkyl group represents an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, the halogenated alkyl group is preferably a fluorinated alkyl group.

The aryl group as the organic group for $R^{31}$ preferably has 4 to 20 carbon atoms, more preferably 4 to 10 carbon atoms, and most preferably 6 to 10 carbon atoms. The aryl group as the organic group for $R^{31}$ is particularly preferably an aryl group which is partially or completely halogenated. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

$R^{31}$ is particularly preferably an alkyl group of 1 to 4 carbon atoms containing no substituent, or a fluorinated alkyl group of 1 to 4 carbon atoms.

The organic group for $R^{32}$ is preferably a linear, branched or cyclic alkyl group, an aryl group, or a cyano group. As the alkyl group or the aryl group for $R^{32}$, the same alkyl groups or aryl groups as those described above for $R^{31}$ can be used.

$R^{32}$ is particularly preferably a cyano group, an alkyl group of 1 to 8 carbon atoms containing no substituent, or a fluorinated alkyl group of 1 to 8 carbon atoms.

Preferred examples of the oxime sulfonate-based acid generator include compounds represented by the general formula (B-2) or (B-3) shown below.

[Chemical Formula 65]

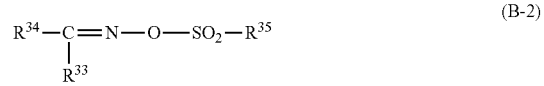

(B-2)

(In the general formula (B-2), $R^{33}$ represents a cyano group, an alkyl group containing no substituent, or a halogenated alkyl group; $R^{34}$ represents an aryl group; and $R^{35}$ represents an alkyl group containing no substituent or a halogenated alkyl group.)

[Chemical Formula 66]

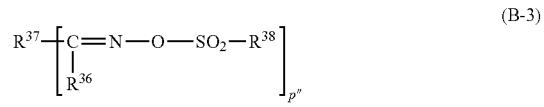

(B-3)

(In the general formula (B-3), $R^{36}$ represents a cyano group, an alkyl group containing no substituent, or a halogenated alkyl group; $R^{37}$ represents a bivalent or trivalent aromatic hydrocarbon group; $R^{38}$ represents an alkyl group containing no substituent, or a halogenated alkyl group; and p" represents an integer of 2 or 3.)

In the general formula (B-2), the alkyl group containing no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with heteroatoms such as an oxygen atom, a sulfur atom, and a nitrogen atom. Of these, a fluorenyl group is preferable.

The aryl group for $R^{34}$ may contain a substituent such as an alkyl group, a halogenated alkyl group and an alkoxy group of 1 to 10 carbon atoms. The alkyl group or halogenated alkyl group for the aforementioned substituent preferably has 1 to 8 carbon atoms, and more preferably 1 to 4 carbon atoms. Also, the halogenated alkyl group for the substituent is preferably a fluorinated alkyl group.

The alkyl group containing no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), as the alkyl group containing no substituent or the halogenated alkyl group for $R^{36}$, the same alkyl groups containing no substituent or halogenated alkyl groups as those described above for $R^{33}$ can be used.

Examples of the bivalent or trivalent aromatic hydrocarbon group for $R^{37}$ include aryl groups for $R^{34}$ in which one or two hydrogen atoms are further removed.

As the alkyl group containing no substituent or the halogenated alkyl group for $R^{38}$, the same alkyl groups containing no substituent or halogenated alkyl groups as those described above in $R^{35}$ can be used.

p" is preferably 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

Also, oxime sulfonate-based acid generators disclosed in Japanese Unexamined Patent Application, First Publication No. Hei 9-208554 ([Formula 18] and [Formula 19] in paragraphs [0012] to [0014]), and International Publication WO 2004/074242 (Examples 1 to 40 on pages 65 to 85) can be preferably used.

Further, suitable examples thereof include the following.

[Chemical Formula 67]

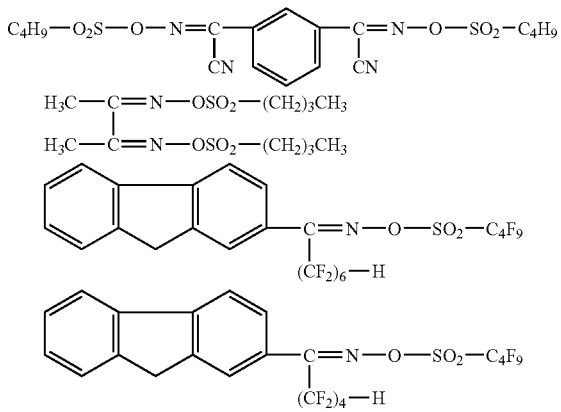

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei 11-035551, Japanese Unexamined Patent Application, First Publication No. Hei 11-035552, and Japanese Unexamined Patent Application, First Publication No. Hei 11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei 11-322707.

As the component (B2), one kind selected from the above acid generators may be used alone, or two or more kinds may be used in combination.

The total amount of the entire component (B) in the positive resist composition of the present invention is preferably within the range of 0.5 to 50 parts by weight, and more preferably 1 to 40 parts by weight, relative to 100 parts by weight of the component (A). When the amount is within the range, a pattern can be sufficiently formed. Also, a uniform solution and excellent storage stability can be obtained. Therefore, an amount within the above range is preferable.

<Optional Components>

[Component (D)]

The positive resist composition of the present invention preferably further includes a nitrogen-containing organic compound component (D) (hereinafter, referred to as "component (D)") as an optional component.

As the component (D), there are no particular limitations as long as it functions as an acid diffusion control agent, i.e., a quencher which traps the acid generated from the component (B) upon exposure. Since a multitude of these components (D) have already been proposed, any of these known compounds can be arbitrarily used. Of these, an aliphatic amine, particularly a secondary aliphatic amine or tertiary aliphatic amine is preferred.

Here, the aliphatic amine means an amine containing at least one aliphatic group, and the aliphatic group preferably has 1 to 20 carbon atoms.

Examples of the aliphatic amine include an amine (alkylamine or alkylalcoholamine) wherein at least one of the hydrogen atoms of $NH_3$ is substituted with an alkyl or hydroxyalkyl group having 20 or less carbon atoms; and a cyclic amine.

Specific examples of the alkylamines or alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, tri-n-octanolamine, stearyl diethanolamine, and lauryl diethanolamine. Of these, a trialkylamine and/or an alkylalcoholamine is/are preferable.

Examples of the cyclic amine include a heterocyclic compound containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Also, as the component (D), an aromatic amine can be used. Examples of the aromatic amine include aniline, pyridine, 4-dimethylaminopyridine, pyrol, indole, pyrazole, and imidazole, and derivatives thereof; diphenylamine, triphenylamine, and tribenzylamine.

These may be used either alone, or in combination of two or more different compounds.

In the present invention, of these, it is preferable to use a trialkylamine as the component (D).

The component (D) is typically used in a quantity within the range of 0.01 to 5.0 parts by weight, relative to 100 parts by weight of the component (A). When the quantity is within the above range, the resist pattern shape, the post exposure stability of the latent image formed by the pattern-wise exposure of the resist layer, and the like are improved.

[Component (E)]

In the positive resist composition of the present invention, in order to prevent any deterioration in sensitivity, and improve the resist pattern shape and the post exposure stability of the latent image formed by the pattern-wise exposure of the resist layer, at least one compound (E) selected from the group consisting of organic carboxylic acids and phosphorus oxo acids or derivatives thereof (hereinafter, referred to as component (E)) can also be added as an optional component.

Suitable examples of organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

As the component (E), an organic carboxylic acid is preferable, and salicylic acid is particularly preferable.

The component (E) is used in a quantity within the range of 0.01 to 5.0 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

[Component (S)]

The positive resist composition of the present invention can be prepared by dissolving materials in an organic solvent (hereinafter, referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether and monobutyl ether) and monophenyl ether of the above polyhydric alcohols or the above compounds having ester bonds (of these, propylene glycol monomethyl ether acetate (PGMEA) or propylene glycol monomethyl ether (PGME) is preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene.

These organic solvents may be used either alone, or may be used as a mixed solvent of two or more different solvents.

Of these, γ-butyrolactone, PGMEA, PGME, or ethyl lactate (EL) is preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within a range of 1:9 to 9:1, and more preferably 2:8 to 8:2.

More specifically, in the case of using EL as the polar solvent, the mass ratio PGMEA:EL is preferably within a range of 1:9 to 9:1, and more preferably 2:8 to 8:2. Furthermore, in those cases of using PGME as the polar solvent, the mass ratio PGMEA:PGME is preferably within a range of 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within a range from 70:30 to 95:5.

There is no particular restriction on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 1 to 20% by weight, and preferably 2 to 15% by weight.

The positive resist composition of the present invention is a novel resist composition which has not been known conventionally.

The positive resist composition of the present invention excels in the resist pattern shape formed therefrom (for example, circularity of the holes when a hole pattern is formed, and rectangularity in the cross-section of the lines when a line and space pattern is formed).

Also, according to the positive resist composition of the present invention, lithography properties such as satisfactory sensitivity, exposure margin (EL margin), mask reproducibility (for example, mask error factor (MEF)), critical dimension uniformity (CDU), and line width roughness (LWR) are favorable.

Here, "EL margin" is the range of the exposure dose at which a resist pattern can be formed with a size within a predetermined range of variation from a target size, when exposure is conducted by changing the exposure dose, i.e., the range of the exposure dose at which a resist pattern faithful to the mask pattern can be formed.

"LWR" is a phenomenon in which the line width of a line pattern becomes uneven (non-uniform) when a resist pattern is formed using a resist composition, and improvement in the level of LWR becomes an important issue as pattern miniaturization progresses.

Furthermore, according to the positive resist composition of the present invention, a resist film having excellent adhesion with a support such as a substrate can be formed.

Although the reason why the above effects can be attained is not clear, it can be speculated about as follows.

In the positive resist composition of the present invention, the polymeric compound (A1) which includes the structural unit (a0) represented by the above general formula (a0-1) and the structural unit (a1) derived from an acrylate ester containing an acid dissociable, dissolution inhibiting group, and the acid generator (B1) containing an anion moiety represented by the above general formula (I) are used.

The anion moiety of the component (B1) contains a structure in which a cyclic group (X) of 3 to 30 carbon atoms which may contain a substituent is bonded to the skeleton of "—$Y^1$—$SO_3^-$" via a bivalent linking group containing an oxygen atom ($Q^1$-). Therefore, the anion moiety of the component (B1) has a high polarity and a sterically-bulky structure, when compared with fluorinated alkylsulfonate ions and the like conventionally used as the anion moiety of onium salt-based acid generators. Because of the sterically-bulky structure and the intermolecular interaction caused by such a high polarity, the diffusion of the anion moiety in the resist film can chemically and physically be suppressed, when compared with anion moieties of conventional acid generators such as nonafluorobutane sulfonate.

Moreover, in the component (A1), the structural unit (a0) includes a cyclic group containing —$SO_2$—, which has a high polarity, at the terminal of the side chain. Furthermore, the side chain portion of the structural unit (a0) is relatively long, and is also relatively long when compared with the side chain portions of other structural units. Therefore, the cyclic group within the structural unit (a0) of the component (A1) has high compatibility with the high-polarity portion and cyclic group within the anion moiety of the component (B1), and interaction can be easily caused between them. Accordingly, the component (B1) tends to be distributed more uniformly in a resist film.

For these reasons, it is speculated that the above effects can be attained.

Also, according to the positive resist composition of the present invention, it is thought that high resolution can be attained, and lithography properties such as exposure margin (EL margin) and mask error factor (MEF) can be improved.

<<Method of Forming Resist Pattern>>

The method of forming a resist pattern of the present invention includes: forming a resist film on a substrate using the positive resist composition of the present invention described above, exposing the resist film, and developing the resist film to form a resist pattern.

The method of forming a resist pattern of the present invention can be performed, for example, in the following manner.

Firstly, the positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Following selective exposure of the formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, post exposure baking (PEB) is conducted under temperature conditions of 80 to 150° C. for 40 to 120 seconds, preferably 60 to 90 seconds. Subsequently, a developing treatment is conducted using an alkali developing solution such as 0.1 to 10% by weight aqueous solution of tetramethylammonium hydroxide (TMAH), a water rinse treatment is preferably conducted with pure water, and then a drying treatment is performed. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. For example, substrates for electronic components, and such substrates having prescribed wiring patterns formed thereon can be used. Specific examples thereof include a silicon wafer; a substrate made of a metal such as copper, chromium, iron and aluminum; and a substrate made of glass. As materials for the wiring pattern, for example, copper, aluminum, nickel and gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic anti-reflection film (organic BARC) can be used.

There is no particular restriction on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. The resist composition is effective for KrF excimer lasers, ArF excimer lasers, EB and EUV, and particularly effective for ArF excimer lasers.

The exposure of the resist film may be a usual exposure (dry exposure) conducted in air or an inactive gas such as nitrogen gas, or may be an immersion exposure (liquid immersion lithography).

Here, the immersion exposure method is a method in which the region between the resist film and the lens at the lowermost point of the exposure apparatus is pre-filled with a solvent (immersion solvent) that has a larger refractive index than the refractive index of air, and then, maintaining such a condition, the exposure (immersion lithography) is conducted.

The immersion solvent is preferably a solvent that has a refractive index larger than the refractive index of air but smaller than the refractive index of the resist film used in the exposure process. There is no restriction on the refractive index of the immersion solvent, as long as the solvent has a refractive index within the above range.

Examples of the solvent which has a refractive index larger than that of air but smaller than that of the resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all hydrogen atoms of the alkyl groups are substituted with fluorine atoms. Examples of the perfluoroalkyl compounds include perfluoroalkylether compounds and perfluoroalkylamine compounds.

Specific examples of the perfluoroalkylether compounds include a perfluoro(2-butyl-tetrahydrofuran) (boiling point: 102° C.), and specific examples of the perfluoroalkylamine compounds include a perfluorotributylamine (boiling point: 174° C.).

As the immersion solvent, water is preferably used in terms of cost, safety, environmental friendliness, and versatility.

EXAMPLES

Next, the present invention will be described in more detail with reference to examples, but the scope of the present invention is not limited to the following examples.

In the present examples, a unit (compound) represented by formula (1) is described as "compound (1)", and units (compounds) represented by other formulae are also described in the same manner.

<Synthesis (1) of Polymer Compound (A1)>

In the present examples, each of polymer compounds 1 to 3 used as the polymer compound (A1) was synthesized according to the "polymer synthesis examples" described below.

Monomer Synthesis Example 1

Synthesis of Compound (1)

The compound (1) used in "Polymer Synthesis Example 1" described below was synthesized in the following procedure.

300 ml of a THF solution containing 20 g (105.14 mmol) of the alcohol (1) shown below, 30.23 g (157.71 mmol) of ethyldiisopropylaminocarbodiimide (EDCI) hydrochloride, and 0.6 g (5 mmol) of dimethylaminopyridine (DMAP) were added to a 500 ml three-neck flask under a nitrogen atmosphere. 16.67 g (115.66 mmol) of the precursor (1) shown below was added thereto upon cooling in ice (0° C.), and stirred for 12 hours at room temperature.

After conducting thin-layer chromatography (TLC) to confirm that the raw materials had been consumed, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N-HClaq in this order. Thereafter, the solvent was distilled off under reduced pressure, and the resulting product was dried, thereby obtaining the compound (1).

[Chemical Formula 68]

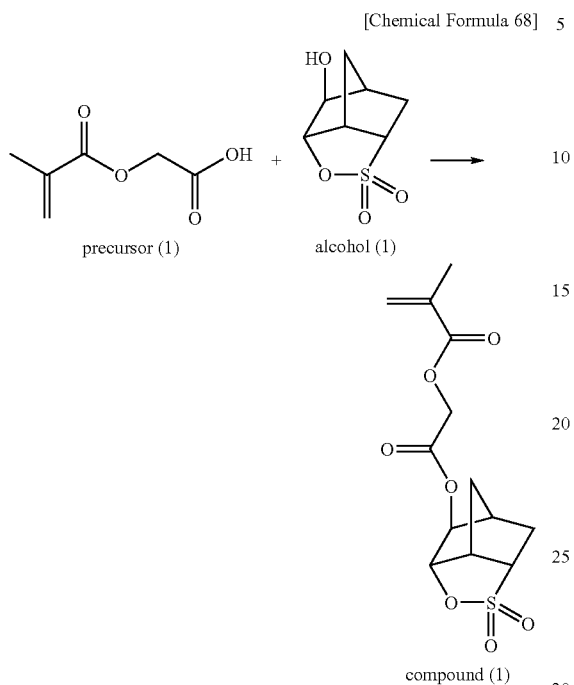

compound (1)

The results of instrumental analysis of the compound (1) thus obtained are as described below.

$^1$H-NMR (CDCl$_3$, 400 MHz): δ (ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$).

From the results described above, it was confirmed that the compound (1) had the structure shown below.

[Chemical Formula 69]

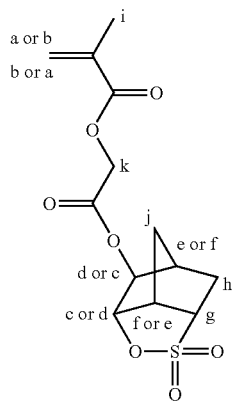

Polymer Synthesis Example 1

Synthesis of Polymeric Compound 1

10.00 g (31.65 mmol) of the compound (1), 9.10 g (38.88 mmol) of the compound (2) shown below, and 4.05 g (17.18 mmol) of the compound (3) shown below were dissolved in 34.73 g of methyl ethyl ketone (MEK) in a three-neck flask equipped with a thermometer and a reflux tube. Then, 5.8 mmol of dimethyl azobis(isobutyrate) (V-601) as a radical polymerization initiator was added and dissolved in the resultant solution. The reaction solution was dropwise added to 19.29 g of MEK heated at 78° C. for 6 hours under a nitrogen atmosphere. After the dropwise addition, the reaction solution was stirred on heating for 1 hour, and then cooled to room temperature. The reaction polymer solution as obtained was dropwise added to much amount of a mixed solvent of methanol/water, thereby precipitating a polymer. The precipitated white powder was separated by filtration, washed with a mixed solvent of methanol/water and dried, thereby obtaining 15 g of the polymeric compound 1 as intended.

With respect to the polymeric compound 1, the weight average molecular weight (Mw) (the polystyrene equivalent value determined by gel permeation chromatography (GPC)) was 9,200, and the dispersity (Mw/Mn) was 1.52.

Also, the copolymer formulation ratio (proportion (molar ratio) of each structural unit within the polymeric compound 4) determined by carbon 13 nuclear magnetic resonance spectrum (600 MHz $^{13}$C-NMR) was a0/a1/a3=39.5/41.4/19.1.

[Chemical Formula 70]

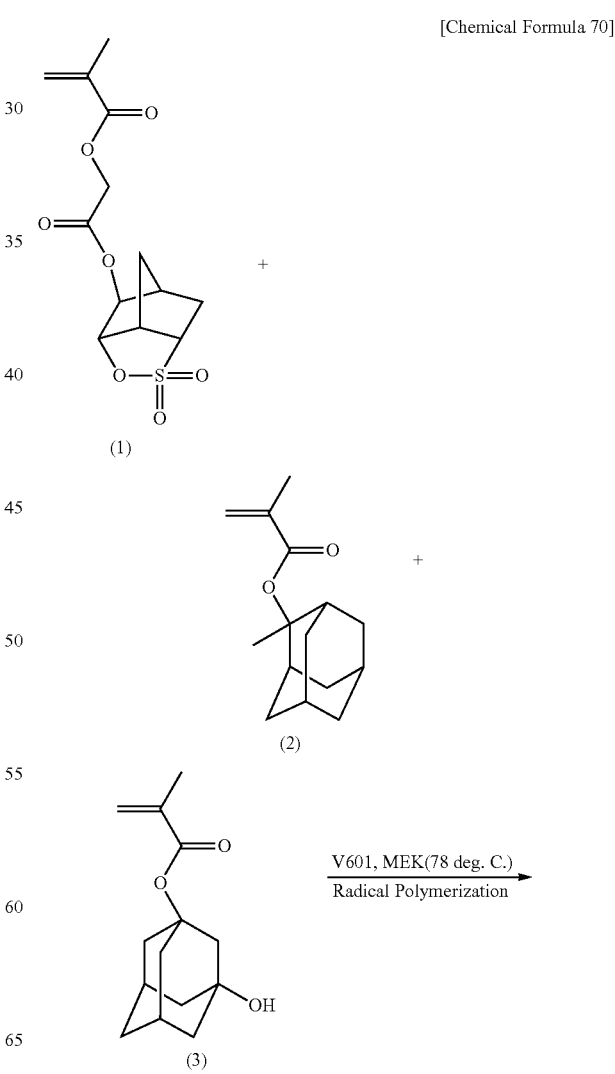

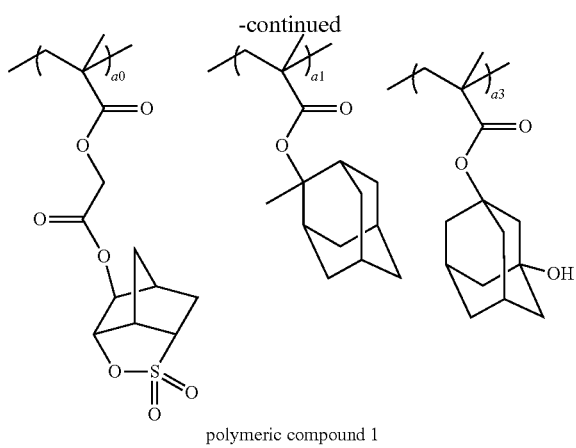

polymeric compound 1

Polymer Synthesis Example 2

Synthesis of Polymeric Compound 2

11.00 g (64.73 mmol) of the compound (4) shown below, 15.00 g (47.47 mmol) of the compound (1) shown below, 37.31 g (142.41 mmol) of the compound (5) shown below, and 5.09 g (21.58 mmol) of the compound (3) were dissolved in 102.60 g of methyl ethyl ketone (MEK) in a three-neck flask equipped with a thermometer and a reflux tube. Then, 27.6 mmol of dimethyl azobis(isobutyrate) (V-601) as a radical polymerization initiator was added and dissolved in the resultant solution. The reaction solution was dropwise added to 57.00 g of MEK heated at 78° C. for 3 hours under a nitrogen atmosphere. After the dropwise addition, the reaction solution was stirred on heating for 4 hours, and then cooled to room temperature. The reaction polymer solution as obtained was dropwise added to much amount of n-heptane, thereby precipitating a polymer. The precipitated white powder was separated by filtration, washed with a mixed solvent of n-heptane/isopropyl alcohol and dried, thereby obtaining 50 g of the polymeric compound 2 as intended.

With respect to the polymeric compound 2, the weight average molecular weight (Mw) (the polystyrene equivalent value determined by gel permeation chromatography (GPC)) was 7,700, and the dispersity (Mw/Mn) was 1.69.

Also, the copolymer formulation ratio (proportion (molar ratio) of each structural unit within the polymeric compound 2) determined by carbon 13 nuclear magnetic resonance spectrum (600 MHz $^{13}$C-NMR) was a2/a0/a11/a3=33.2/25.1/31.6/10.1.

[Chemical Formula 71]

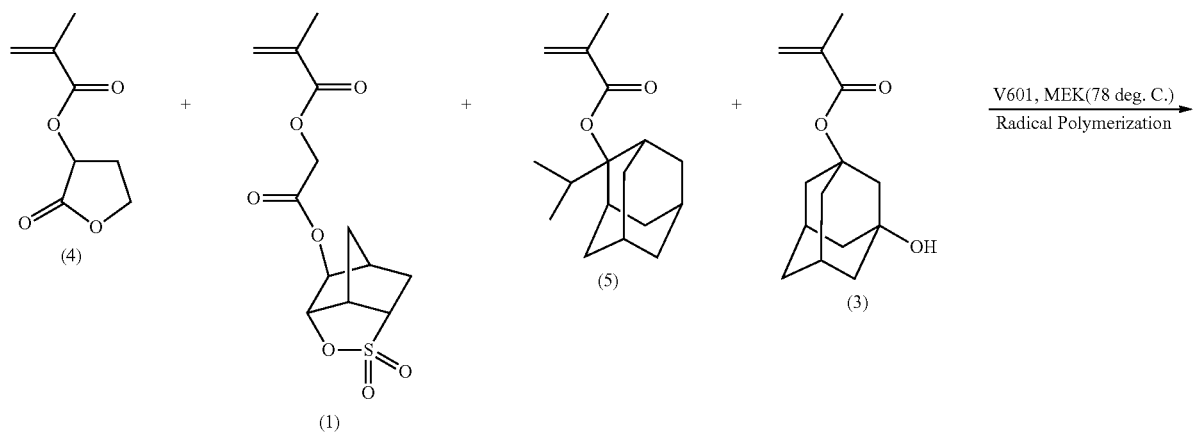

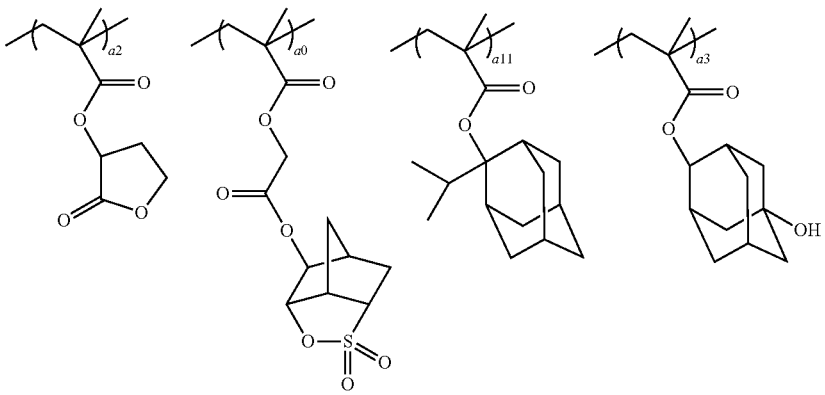

polymeric compound 2

Polymer Synthesis Example 3

Synthesis of Polymeric Compound 3

11.77 g (69.23 mmol) of the compound (4) shown below, 15.00 g (47.47 mmol) of the compound (1), 16.58 g (63.29 mmol) of the compound (5) shown below, 4.65 g (27.69 mmol) of the compound (6) shown below, and 3.27 g (13.85 mmol) of the compound (3) shown below were dissolved in 76.91 g of methyl ethyl ketone (MEK) in a three-neck flask equipped with a thermometer and a reflux tube. Then, 22.1 mmol of dimethyl azobis(isobutyrate) (V-601) as a radical polymerization initiator was added and dissolved in the resultant solution. The reaction solution was dropwise added to 42.72 g of MEK heated at 78° C. for 3 hours under a nitrogen atmosphere. After the dropwise addition, the reaction solution was stirred on heating for 4 hours, and then cooled to room temperature. The reaction polymer solution as obtained was dropwise added to much amount of normal (n-)heptane, thereby precipitating a polymer. The precipitated white powder was separated by filtration, washed with a mixed solvent of n-heptane/isopropyl alcohol and dried, thereby obtaining 41 g of the polymeric compound 3 as intended.

With respect to the polymeric compound 3, the weight average molecular weight (Mw) (the polystyrene equivalent value determined by gel permeation chromatography (GPC)) was 7,900, and the dispersity (Mw/Mn) was 1.78. Also, the copolymer formulation ratio (proportion (molar ratio) of each structural unit within the polymeric compound 3) determined by carbon 13 nuclear magnetic resonance spectrum (600 MHz $^{13}$C-NMR) was a2/a0/a11/a12/a3=35.0/26.5/17.9/13.2/7.4.

[Chemical Formula 72]

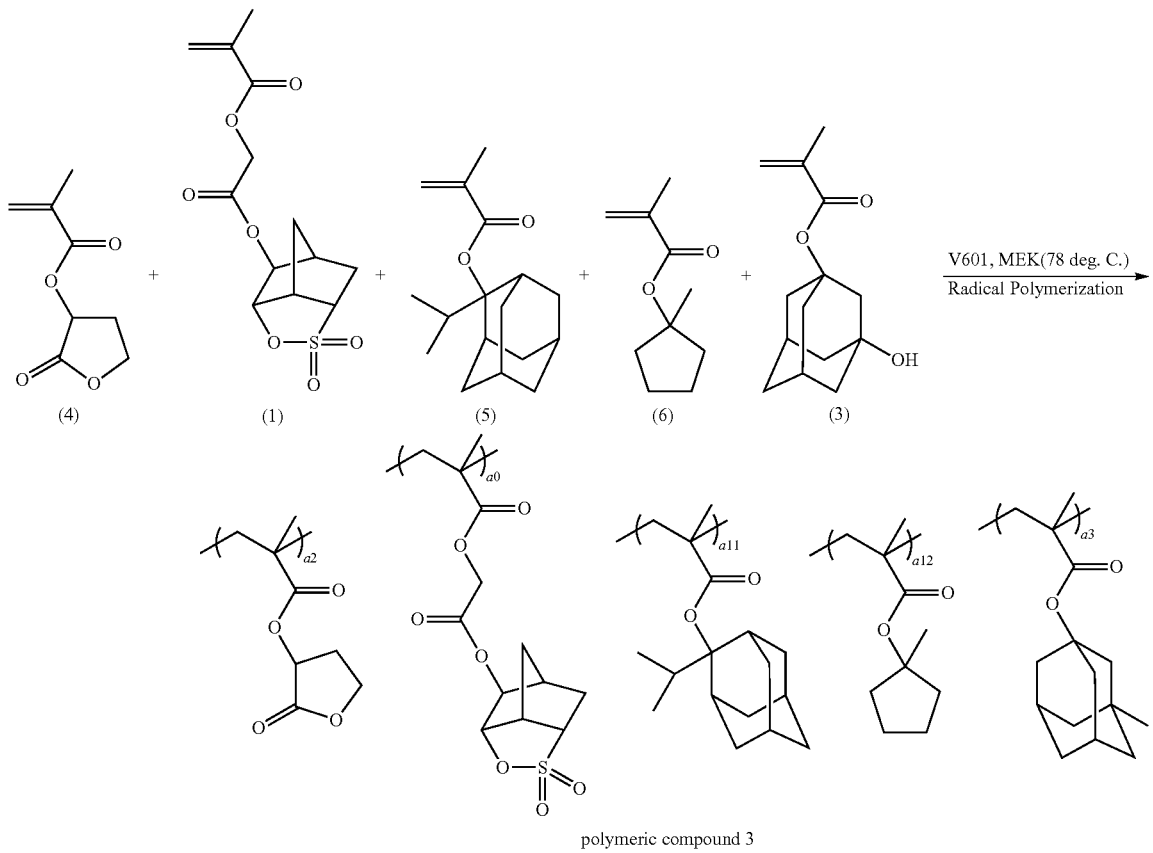

polymeric compound 3

<Acid Generator (B1) Synthesis (1)>

In the present examples, the compounds (e), (g), (i), and (j) used as the acid generator (B1) were respectively synthesized according to the following acid generator synthesis examples.

[Synthesis of Compound (b)]

(i) 192.1 g of methyl fluorosulfonyl(difluoro)acetate and 480 g of pure water were maintained at 10° C. or lower in an ice bath, and 440 g of 30% by weight aqueous solution of sodium hydroxide was dropwise added thereto. Then, the resultant was refluxed at 100° C. for 3 hours, followed by cooling and neutralizing with 10% hydrochloric acid. The resulting solution was dropwise added to 9,074 g of acetone, and the precipitate was collected by filtration and dried, thereby obtaining 257.6 g of the compound (a) shown below in the form of a white solid (yield: 94.5%).

[Chemical Formula 73]

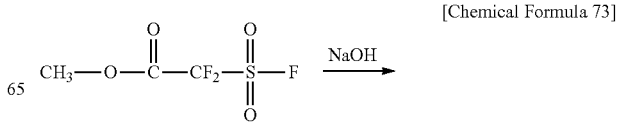

-continued

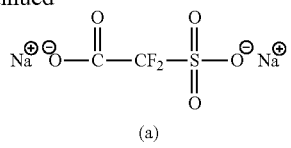

(a)

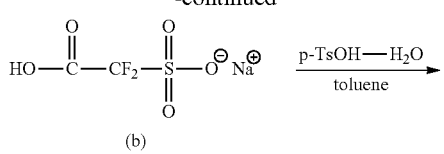

(b)

(ii) Subsequently, 56.2 g of the compound (a) obtained above and 562.2 g of acetonitrile were prepared, and 77.4 g of p-toluenesulfonic acid monohydrate was added thereto. The resultant was refluxed at 110° C. for 3 hours. Then, the solution was filtered, and the filtrate was concentrated and dried to obtain a solid. 900 g of t-butyl methyl ether was added to the obtained solid and stirred. Thereafter, the resultant was filtered, and the residue was dried, thereby obtaining 25.7 g of the compound (b) shown below in the form of a white solid (yield: 52.0%).

[Chemical Formula 74]

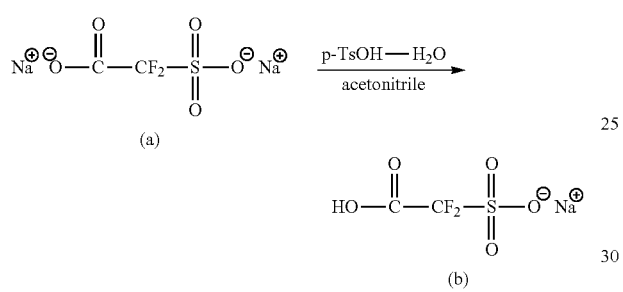

Acid Generator Synthesis Example 1

Synthesis of Compound (e)

(i) 5.00 g of the compound (b), 5.68 g of the sultone-OH (c) shown below and 100 g of toluene were prepared, and 0.43 g of p-toluenesulfonic acid monohydrate was added thereto. The resultant was heated until toluene was refluxed, and while maintaining such conditions, a reaction was conducted for 65 hours. Then, the reaction solution was filtered, and 100 g of toluene was added to the residue and stirred at room temperature for 10 minutes. This filtration procedure was repeated twice, thereby obtaining a black powder. The obtained powder was dried under reduced pressure for one night. Then, an extraction treatment was conducted twice using 100 g of acetone, thereby obtaining a filtrate. Acetone was removed from the obtained filtrate, and then the resultant was dissolved in 30 g of acetone. The resulting solution was dropwise added slowly to 300 g of TBME and 300 g of methylene chloride. Thereafter, the precipitated solid was collected by filtration and dried, thereby obtaining 6.88 g of the compound (d) shown below in the form of a white powder (yield: 78.4%).

[Chemical Formula 75]

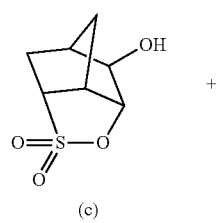

(c)

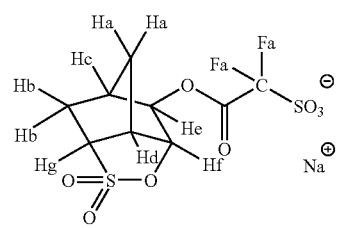

(d)

The obtained compound (d) was analyzed using $^1$H-NMR and $^{19}$F-NMR. The results are as follows.

$^1$H-NMR (DMSO-d6, 400 MHz): δ (ppm) 1.73-2.49 (m, 4H, Ha, Hb), 2.49 (m, 1H, Hc), 3.48 (m, 1H, Hd), 3.88 (t, 1H, He), 4.66 (t, 1H, Hf), 4.78 (m, 1H, Hg).

$^{19}$F-NMR (DMSO-d6, 400 MHz): δ (ppm) −107.7 (m, 2F, Fa) (here, the peak of hexafluorobenzene was regarded as −160 ppm).

From the result described above, it was confirmed that the compound (d) had the structure shown below.

[Chemical Formula 76]

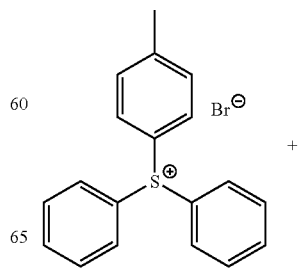

(ii) Subsequently, 3.21 g of the compound (d) obtained above was dissolved in 32.1 g of pure water, 3.72 g of 4-methylphenyldiphenylsulfonium bromide was added thereto, and then 32.1 g of methylene chloride was added thereto. The resultant was stirred for 1 hour at room temperature. Thereafter, the organic phase was collected by fractionation. The organic phase was washed three times with a 1% by weight aqueous solution of HCl, and then four times with pure water. The resulting organic phase was concentrated, thereby obtaining 4.94 g of the compound (e) shown below in the form of a white solid (yield: 86.8%).

[Chemical Formula 77]

-continued

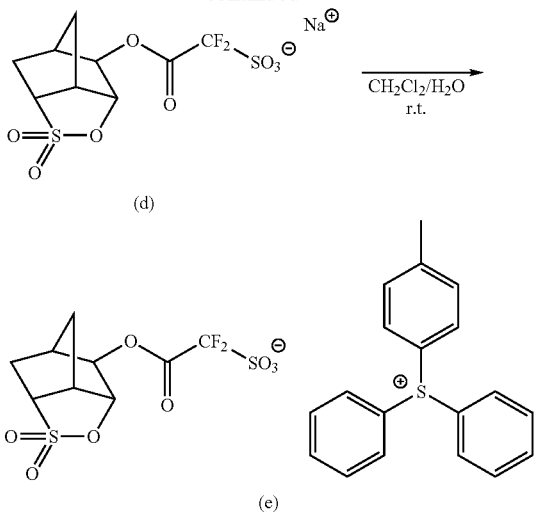

(d)

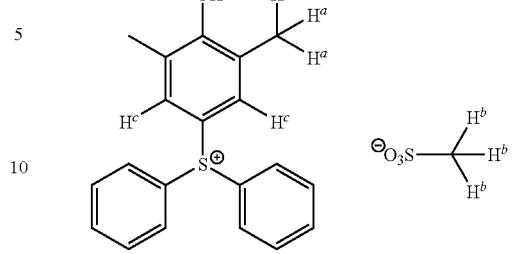

(e)

The obtained compound (e) was analyzed using $^1$H-NMR and $^{19}$F-NMR. The results are as follows.

$^1$H-NMR (DMSO-d6, 400 MHz): δ (ppm) 1.74-2.21 (m, 4H, anion), 2.41 (t, 3H, PhCH$_3$), 2.58 (m, 1H, anion), 3.48 (m, 1H, anion), 3.87 (t, 1H, anion), 4.66 (t, 1H, anion), 4.78 (m, 1H, anion), 7.58 (m, 2H, ph), 7.64-7.84 (m, 12H, ph).

$^{19}$F-NMR (DMSO-d6, 400 MHz): δ (ppm)-107.6 (m, 2F, Fa) (here, the peak of hexafluorobenzene was regarded as −160 ppm).

From the result described above, it was confirmed that the compound (e) had the structure represented by the formula (e) shown above.

Acid Generator Synthesis Example 2

Synthesis of Compound (g)

(i) Phosphorus oxide (8.53 g), 2,6-dimethylphenol (8.81 g) and diphenylsulfoxide (12.2 g) were added to methanesulfonic acid (60.75 g) controlled to 20° C. or lower in small amounts. While the temperature was controlled at 15° C. to 20° C., the resulting solution was matured for 30 minutes. Then, the temperature was raised up to 40° C., and the solution was matured for 2 hours. Thereafter, the reaction solution was dropwise added to 109.35 g of pure water cooled at 15° C. or lower. After the dropwise addition, 54.68 g of dichloromethane was added to the solution. Then, the resulting solution was stirred, and the dichloromethane phase was collected. 386.86 g of hexane at 20° C. to 25° C. was prepared in another container, and the dichloromethane phase collected above was dropwise added thereto. After the dropwise addition, the solution was matured for 30 minutes at 20 to 25° C., and then filtration was conducted, thereby obtaining the intermediate compound (f-01) as intended (yield: 70.9%).

The obtained intermediate compound (f-01) was analyzed using $^1$H-NMR. The results are as follows.

$^1$H-NMR (DMSO-d6, 600 MHz): δ (ppm)=7.61-7.72 (m, 10H, phenyl), 7.14 (s, 2H, H$^c$), 3.12 (s, 3H, H$^b$), 2.22 (s, 6H, H$^a$).

From the result described above, it was confirmed that the intermediate compound (f-01) had the structure shown below.

[Chemical Formula 78]

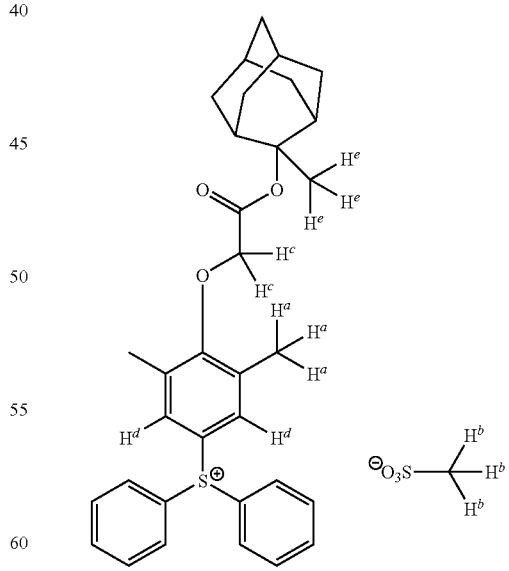

(ii) Subsequently, 4 g of the above intermediate compound (f-01) was dissolved in 79.8 g of dichloromethane. After the intermediate compound (f-01) was dissolved in dichloromethane, 6.87 g of potassium carbonate was added thereto, and 3.42 g of bromoacetic acid 2-methyl-2-adamantane (2-methyl-2-adamantyl bromoacetate) was further added. The resultant was reacted for 24 hours while refluxing. Subsequently, the resultant was filtrated and washed with water, and then crystallized with hexane. The resulting powder was dried under reduced pressure, thereby obtaining 3.98 g of an intended compound (yield: 66%).

The intended compound was analyzed using $^1$H-NMR. The results are as follows.

$^1$H-NMR (CDCl$_3$, 600 MHz): δ (ppm)=7.83-7.86 (m, 4H, phenyl), 7.69-7.78 (m, 6H, phenyl), 7.51 (s, 2H, Hd), 4.46 (s, 2H, Hc), 2.39 (s, 6H, Ha), 2.33 (s, 2H, Adamantane), 2.17 (s, 2H, Adamantane), 1.71-1.976 (m, 11H, Adamantane), 1.68 (s, 3H, Hb), 1.57-1.61 (m, 2H, Adamantane).

From the result described above, it was confirmed that the intended compound included the compound (f-1) represented by the structure shown below.

[Chemical Formula 79]

Furthermore, it was confirmed from the measurement results of ion chromatography that the intended compound also included the compounds (f-2) and (f-3) shown below, whose cation moieties have the same NMR data as that of the compound (f-1) described above, in addition to the compound (f-1). The proportion of the compounds (f-1) to (f-3) was compound (f-1): compound (f2): compound (f3)=21.4:11.4: 67.2 (mol %).

[Chemical Formula 80]

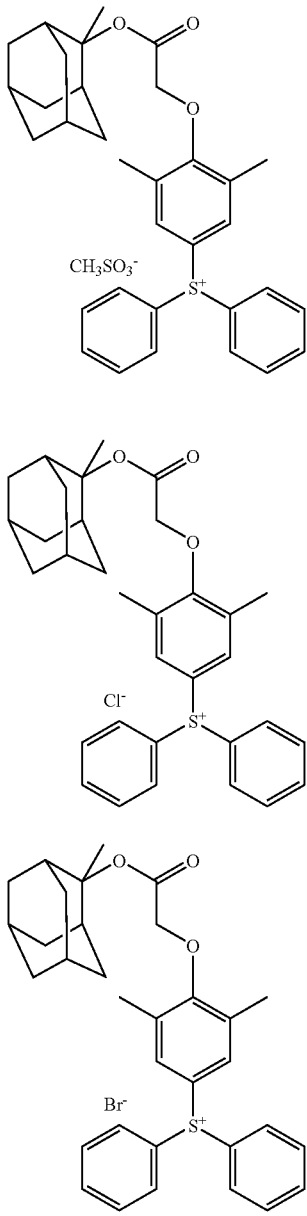

(iii) 5.00 g of the above compound (d) was dissolved in 50.0 g of pure water, and 6.19 g of the above compound (f-3) was added thereto. Then, the resultant was stirred for 10 hours at room temperature. Thereafter, the organic phase was collected by fractionation. The organic phase was washed three times with 1% by weight aqueous solution of HCl, once with 1% by weight aqueous solution of ammonia, and four times with pure water. The resulting organic phase was concentrated, thereby obtaining 8.58 g of the compound (g) shown below in the form of a white solid (yield: 90.4%).

[Chemical Formula 81]

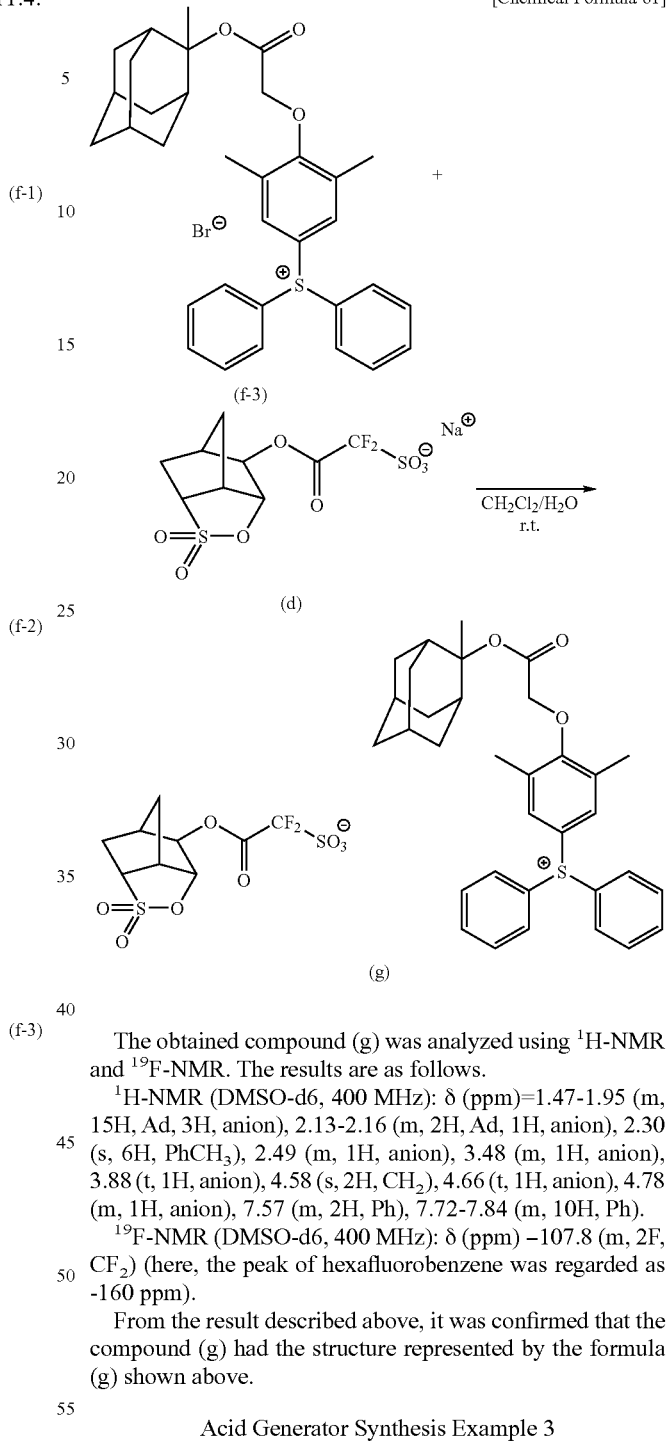

The obtained compound (g) was analyzed using $^1$H-NMR and $^{19}$F-NMR. The results are as follows.

$^1$H-NMR (DMSO-d6, 400 MHz): δ (ppm)=1.47-1.95 (m, 15H, Ad, 3H, anion), 2.13-2.16 (m, 2H, Ad, 1H, anion), 2.30 (s, 6H, PhCH$_3$), 2.49 (m, 1H, anion), 3.48 (m, 1H, anion), 3.88 (t, 1H, anion), 4.58 (s, 2H, CH$_2$), 4.66 (t, 1H, anion), 4.78 (m, 1H, anion), 7.57 (m, 2H, Ph), 7.72-7.84 (m, 10H, Ph).

$^{19}$F-NMR (DMSO-d6, 400 MHz): δ (ppm) −107.8 (m, 2F, CF$_2$) (here, the peak of hexafluorobenzene was regarded as -160 ppm).

From the result described above, it was confirmed that the compound (g) had the structure represented by the formula (g) shown above.

Acid Generator Synthesis Example 3

Synthesis of Compound (i)

(i) 5.00 g of the compound (b) (purity: 93.7%), 3.69 g of the oxo-OH shown below, and 25.00 g of toluene were prepared, and 0.410 g of p-toluenesulfonic acid monohydrate was added thereto. The resultant solution was then refluxed for 20 hours at 110° C. Thereafter, the resultant was filtrated, and then 79.50 g of methyl ethyl ketone was added to the residue and stirred. Subsequently, the resultant was filtrated, and the residue was washed twice with 23.86 g of methanol. The obtained precipitate was dried, thereby obtaining 4.55 g of the compound (h) in the form of a white solid (yield: 55.8%).

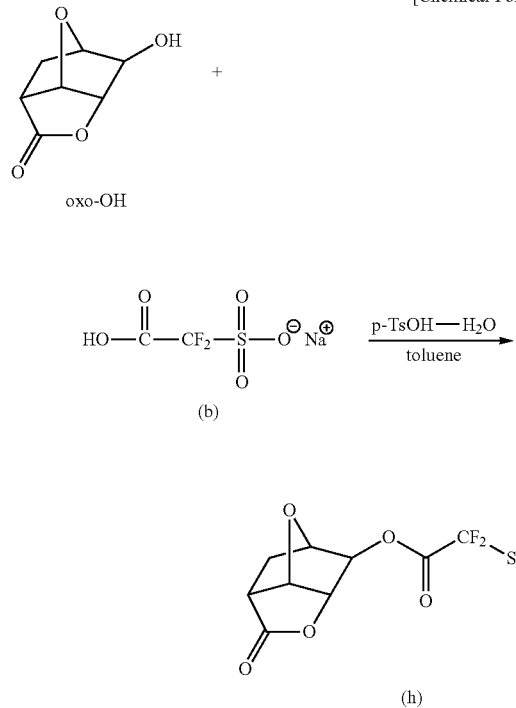

[Chemical Formula 82]

(ii) Subsequently, 1.36 g of the compound (h) obtained above was dissolved in 13.6 g of pure water. 0.53 g of 4-methyltriphenylsulfonium bromide dissolved in 5.30 g of dichloromethane was added to the above solution, and stirred for 3 hours at room temperature. The organic phase was then collected by fractionation. Thereafter, the organic phase was washed with 18.6 g of pure water, and then the organic phase was concentrated and dried, thereby obtaining 0.35 g of the compound (i) in the form of a colorless viscous liquid (yield: 35.7%).

[Chemical Formula 83]

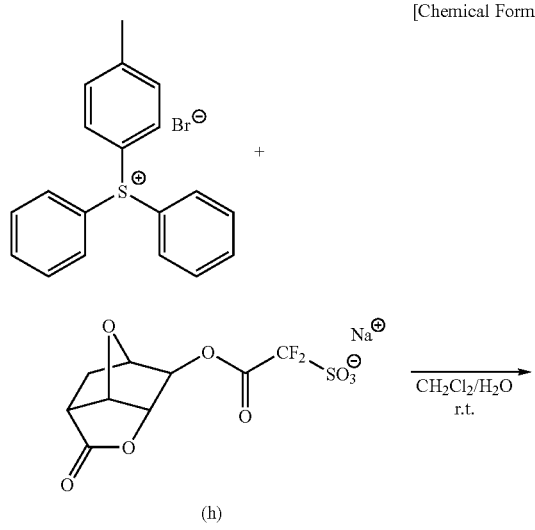

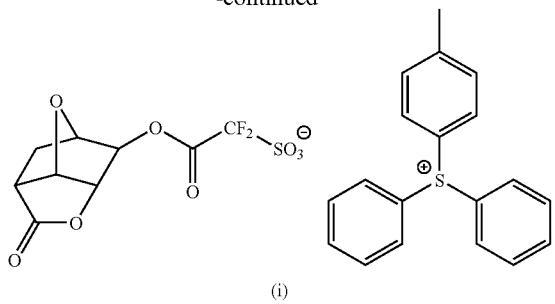

The obtained compound (i) was analyzed using $^1$H-NMR and $^{19}$F-NMR. The results are as follows.

$^1$H-NMR (DMSO-d6, 400 MHz): δ (ppm)=7.89-7.77 (m, 15H, Ha), 5.48 (m, 1H, Hb), 4.98 (s, 1H, Hc), 4.73-4.58 (d, 2H, Hd), 2.71 (m, 1H, He), 2.54 (m, 3H, Hf), 2.14 (m, 2H, Hg).

$^{19}$F-NMR (DMSO, 376 MHz): δ (ppm)=−107.1 (here, the peak of hexafluorobenzene was regarded as −160 ppm).

From the result described above, it was confirmed that the compound (i) had the structure shown below.

[Chemical Formula 84]

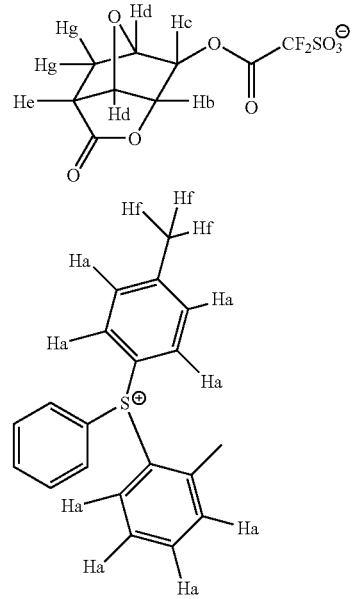

Acid Generator Synthesis Example 4

Synthesis of Compound (j)

1.79 g of the above compound (f-3) was dissolved in a mixed solution of 15.81 g of pure water and 31.62 g of dichloromethane. Thereafter, 1.33 g of the above compound (h) was added thereto in small amounts, and then stirred for 1 hour at 25° C. After the reaction was finished, the above dichloromethane solution was washed with water, and then concentrated to dryness. The powder thus obtained was dispersively washed with hexane, and then it was dried under reduced pressure, thereby obtaining 2.35 g of the compound (j) (yield: 83.3%).

[Chemical Formula 85]

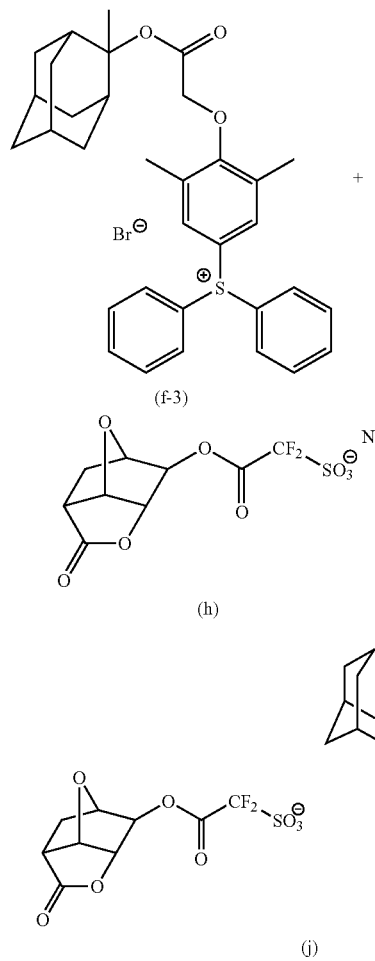

$^{19}$F-NMR (DMSO-d6, 400 MHz): δ (ppm)=−106.7 (here, the peak of hexafluorobenzene was regarded as −160 ppm).

From the results described above, it was confirmed that the compound (j) had the structure shown below.

[Chemical Formula 86]

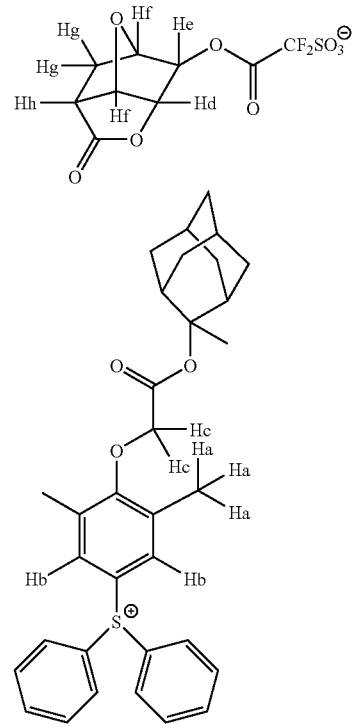

The obtained compound (j) was analyzed using $^1$H-NMR and $^{19}$F-NMR. The results are as follows.

$^1$H-NMR (DMSO-d6, 400 MHz): δ (ppm)=7.76-7.88 (m, 10H, Phenyl), 7.63 (S, 2H, Hb), 5.51 (s, 1H, Hd), 5.01 (s, 1H, He), 4.62-4.76 (m, 4H, Hc+Hf), 2.75 (m, 1H, Hh), 2.53-1.51 (m, 25H, Ha+Hg+Adamantane).

Positive Resist Composition Preparation (1)

Examples 1 to 8, Comparative Example 1, and Reference Examples 1 to 2

The components shown in Table 1 were mixed and dissolved to obtain positive resist compositions.

TABLE 1

|  | Component (A) | Component (B) | Component (D) | Component (E) | Component (S) | |
|---|---|---|---|---|---|---|
| Example 1 | (A)-1 | (B)-1 | (D)-1 | (E)-1 | (S)-1 | (S)-2 |
|  | [100] | [7.30] | [0.4] | [0.55] | [2890] | [10] |
| Example 2 | (A)-1 | (B)-2 | (D)-1 | (E)-1 | (S)-1 | (S)-2 |
|  | [100] | [10.06] | [0.4] | [0.55] | [2890] | [10] |
| Example 3 | (A)-1 | (B)-3 | (D)-1 | (E)-1 | (S)-1 | (S)-2 |
|  | [100] | [6.90] | [0.4] | [0.55] | [2890] | [10] |
| Example 4 | (A)-1 | (B)-4 | (D)-1 | (E)-1 | (S)-1 | (S)-2 |
|  | [100] | [9.67] | [0.4] | [0.55] | [2890] | [10] |
| Example 5 | (A)-2 | (B)-1 | (D)-1 | (E)-1 | (S)-1 | (S)-2 |
|  | [100] | [7.30] | [0.4] | [0.55] | [2890] | [10] |
| Example 6 | (A)-2 | (B)-2 | (D)-1 | (E)-1 | (S)-1 | (S)-2 |
|  | [100] | [10.06] | [0.4] | [0.55] | [2890] | [10] |
| Example 7 | (A)-3 | (B)-1 | (D)-1 | (E)-1 | (S)-1 | (S)-2 |
|  | [100] | [7.30] | [0.4] | [0.55] | [2890] | [10] |
| Example 8 | (A)-3 | (B)-2 | (D)-1 | (E)-1 | (S)-1 | (S)-2 |
|  | [100] | [10.06] | [0.4] | [0.55] | [2890] | [10] |
| Comparative Example 1 | (A)-4 | (B)-5 | (D)-1 | (E)-1 | (S)-1 | (S)-2 |
|  | [100] | [6.74] | [0.4] | [0.55] | [2890] | [10] |
| Reference Example 1 | (A)-4 | (B)-1 | (D)-1 | (E)-1 | (S)-1 | (S)-2 |
|  | [100] | [7.30] | [0.4] | [0.55] | [2890] | [10] |

TABLE 1-continued

|  | Component (A) | Component (B) | Component (D) | Component (E) | Component (S) | |
| --- | --- | --- | --- | --- | --- | --- |
| Reference Example 2 | (A)-4 [100] | (B)-2 [10.06] | (D)-1 [0.4] | (E)-1 [0.55] | (S)-1 [2890] | (S)-2 [10] |

In Table 1, each of the abbreviations represents the following. Also, the values within the brackets [ ] mean the blending amount (parts by weight).

(A)-1: the polymeric compound 1.
(A)-2: the polymeric compound 2.
(A)-3: the polymeric compound 3.
(A)-4: a copolymer represented by the formula (A2-11-1) shown below (Mw: 10,000, Mw/Mn: 1.72). In the formula (A2-11-1), the values attached at the bottom right of the brackets ( ) denote the proportion of each structural unit (mol %).

[Chemical Formula 87]

(A2-11-1)

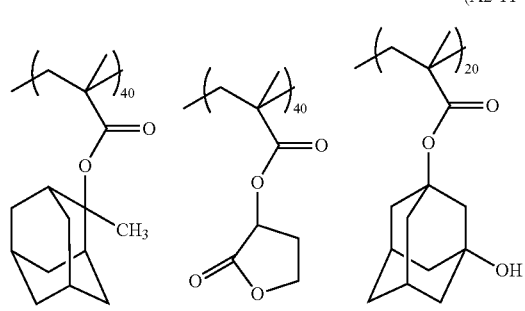

(B)-1: the compound (e).
(B)-2: the compound (g).
(B)-3: the compound (i).
(B)-4: the compound (j).
(B)-5: (4-methylphenyl)diphenylsulfonium nonafluoro-n-butanesulfonate.
(D)-1: tri-n-pentylamine.
(E)-1: salicylic acid.
(S)-1: a mixed solvent of PGMEA/PGME=6/4 (mass ratio).
(S)-2: γ-butyrolactone.

<Evaluation of Lithography Properties and Resist Pattern Shape>

Using the resist composition obtained above, the resist pattern was formed in the following procedure to evaluate the lithography properties and the resist pattern shape.

[Formation of Resist Pattern]

An organic anti-reflection film composition (product name: ARC29A, manufactured by Brewer Science Ltd.) was applied onto a 12-inch silicon wafer using a spinner, and the composition was then baked at 205° C. for 60 seconds and dried, thereby forming an organic anti-reflection film having a film thickness of 89 nm.

Then, each of the positive resist compositions obtained above was applied onto the organic anti-reflection film using a spinner, and was then prebaked (PAB) on a hotplate for 60 seconds at a temperature shown in Table 2 and dried, thereby forming a resist film having a film thickness of 100 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat with a film thickness of 90 nm.

Thereafter, using an ArF exposure apparatus for immersion lithography (product name: NSR-5609B, manufactured by Nikon Corporation, NA (numerical aperture)=1.07, σ=0.97), the resist film having a top coat formed thereon was selectively irradiated with an ArF excimer laser (193 nm) through a mask having a hole pattern.

Next, a post exposure bake (PEB) treatment was conducted for 60 seconds at a temperature shown in Table 2, followed by development for 30 seconds at 23° C. in a 2.38% by weight aqueous solution of tetramethylammonium hydroxide (product name: NMD-3; manufactured by Tokyo Ohka Kogyo Co., Ltd.). Then, the resist film was rinsed for 30 seconds with pure water, followed by drying by shaking.

As a result, in each of the examples, a contact hole pattern (hereinafter, referred to as "CH pattern") in which holes having a hole diameter of 90 nm were equally spaced (pitch: 140 nm) was formed on the resist film.

[Sensitivity]

In the above resist pattern formation, an optimum exposure "Eop" (mJ/cm$^2$; sensitivity) for forming a CH pattern with a hole diameter of 90 nm and a pitch of 140 nm was determined. The results are shown in Table 2.

[Evaluation of Exposure Margin (EL Margin)]

The exposure dose with which a CH pattern having a dimension of the target dimension (hole diameter: 90 nm)±5% (i.e., 85.5 to 94.5 nm) was formed was measured, and the EL margin (unit: %) was determined by the following formula. The results are shown in Table 2.

$$EL\ margin\ (\%) = (|E1-E2|/Eop) \times 100$$

E1: exposure dose (mJ/cm$^2$) for forming a CH pattern having a hole diameter of 85.5 nm.
E2: exposure dose (mJ/cm$^2$) for forming a CH pattern having a hole diameter of 94.5 nm.

Here, EL margin indicates that, the larger the value of EL margin, the smaller the variation in the pattern size depending on the change in the exposure dose.

[Mask Error Factor (MEF)]

With the Eop shown in Table 2, seven CH patterns with a fixed pitch of 140 nm were formed by using seven different mask patterns, wherein the seven different mask patterns set a target size of a hole diameter to 76 nm, 77 nm, 78 nm, 79 nm, 80 nm, 81 nm and 82 nm, respectively.

Here, a plurality of points was plotted on a graph, based on the target mask size (nm) as the abscissa axis and a diameter (nm) of the hole pattern formed on the resist film by using each mask pattern as the longitudinal axis. Then, a slope of a straight line which connects the plotted points was computed as the MEF. The results are shown in Table 2.

The closer to 1 the value of MEF (the slope of the straight line), the better the mask reproducibility becomes.

[Evaluation of Circularity]

The shape of the holes of each CH pattern was observed using a measuring SEM (product name: S-9220, manufactured by Hitachi, Ltd.), and evaluated against the criteria listed below.

A: extremely high circularity (no unevenness was observed at the circumference portions of the hole pattern when the hole pattern was observed from the upper side thereof, and the shape of the pattern was excellent).

B: high circularity (although slight unevenness was observed at the circumference portions of the hole pattern when the hole pattern was observed from the upper side thereof, the shape has a high level of circularity as a whole).

C: low circularity (many uneven portions were observed at the circumferential portions of the hole pattern when the hole pattern was observed from the upper side thereof.)

TABLE 2

|  | Example 1 | Example 2 | Example 3 | Example 4 | Comparative Example 1 | Example 5 | Example 6 | Example 7 | Example 8 | Reference Example 1 | Reference Example 2 |
|---|---|---|---|---|---|---|---|---|---|---|---|
| PAB/PEB (° C.) | 110/100 | 110/100 | 110/100 | 110/100 | 110/105 | 90/85 | 90/85 | 90/85 | 90/85 | 110/105 | 110/105 |
| Eop (mJ/cm$^2$) | 70.1 | 85.3 | 69.3 | 83.6 | 48.5 | 24.4 | 31.8 | 26.9 | 34.7 | 69.9 | 78.6 |
| 5% EL margin (%) | 11.29 | 11.56 | 9.76 | 9.96 | 8.41 | 11.37 | 11.98 | 11.64 | 12.10 | 10.69 | 10.72 |
| MEF | 6.23 | 6.15 | 6.87 | 6.62 | 9.45 | 5.63 | 5.60 | 5.55 | 5.42 | 7.32 | 7.01 |
| Circularity | A | A | B | B | C | A | A | A | A | B | B |

The positive resist composition used in each of Examples 1 to 8 of the present invention shows excellent results in circularity, when compared with the positive resist composition used in Comparative Example 1. Accordingly, it was confirmed that the positive resist composition used in each of Examples 1 to 8 excelled in the resist pattern shape.

Also, the positive resist composition used in each of Examples 1 to 8 of the present invention has a large value of 5% EL margin and a small value of MEF, when compared with the positive resist composition used in Comparative Example 1. Accordingly, it was confirmed that the positive resist composition used in each of Examples 1 to 8 could obtain excellent lithography properties.

Moreover, from comparing the results of Examples, it was also confirmed that, when an acid generator which includes a cyclic group containing —O—SO$_2$— within the ring skeleton thereof was used together with the polymeric compound (A1) of the present invention, the resist pattern shape and lithography properties were further improved.

Furthermore, from comparing the results of Examples 1, 2, and 5 to 8 and Reference Examples 1 and 2, it was confirmed that, when the polymeric compound (A1) and the acid generator (B1) of the present invention were used together, the resist pattern shape and lithography properties were further improved.

<Polymeric Compound (A1) Synthesis (2)>

In each of the examples below, the polymeric compounds 4 and 5 used as the polymeric compound (A1) were synthesized, respectively, according to the following polymer synthesis examples.

Polymer Synthesis Example 4

Synthesis of Polymeric Compound 4

17.42 g (55.13 mmol) of the compound (1), 8.91 g (25.47 mmol) of the compound (7), 90.00 g (343.51 mmol) of the compound (5), and 6.01 g (25.47 mmol) of the compound (3) were dissolved in 183.51 g of methyl ethyl ketone (MEK) in a three-neck flask equipped with a thermometer and a reflux tube. Then, 31.5 mmol of dimethyl azobis(isobutyrate) (V-601) as a radical polymerization initiator was added and dissolved in the resultant solution. The solution was dropwise added to 101.95 g of MEK heated at 78° C. for 3 hours under a nitrogen atmosphere. After the dropwise addition, the reaction solution was stirred on heating for 4 hours, and then cooled to room temperature.

The reaction polymer solution as obtained was dropwise added to much amount of n-heptane, thereby precipitating a polymer. The precipitated white powder was separated by filtration, washed with a mixed solvent of n-heptane/2-propanol and dried, thereby obtaining 25 g of the polymeric compound 4 as intended.

With respect to the polymeric compound 4, the weight average molecular weight (Mw) (the polystyrene equivalent value determined by gel permeation chromatography (GPC)) was 5,100, and the dispersity (Mw/Mn) was 1.27. Also, the copolymer formulation ratio (proportion (molar ratio) of each structural unit within the polymeric compound 4) determined by carbon 13 nuclear magnetic resonance spectrum (600 MHz_$^{13}$C-NMR) was a0/a13/a11/a3=32.5/11.0/45.1/11.4.

[Chemical Formula 88]

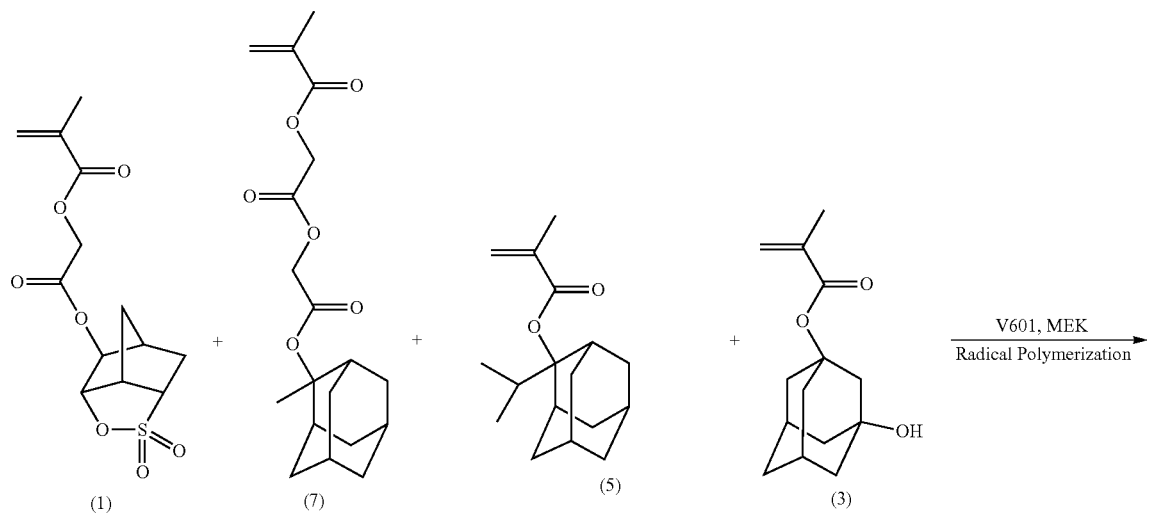

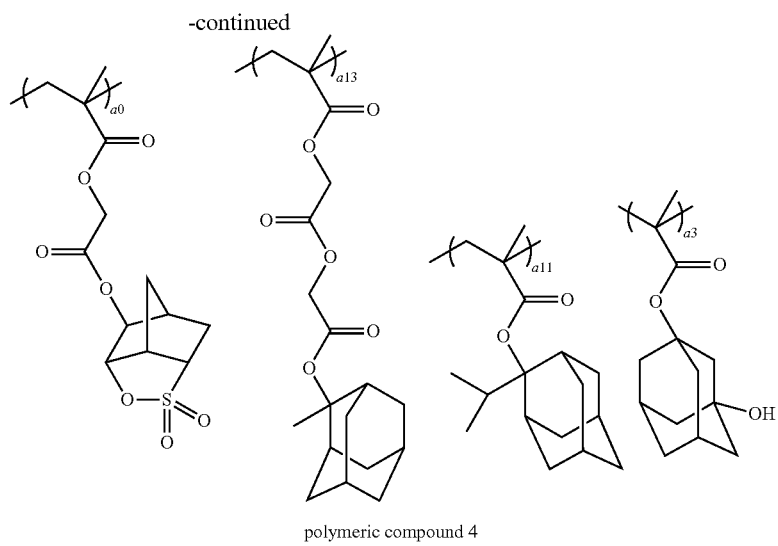

polymeric compound 4

Polymer Synthesis Example 5

Synthesis of Polymeric Compound 5

The polymeric compound 5 as intended was synthesized in the same manner as the above polymer synthesis example 4, except that a predetermined amount of the compound (8) was used instead of the compound (7).

With respect to the polymeric compound 5, the weight average molecular weight (Mw) (the polystyrene equivalent value determined by gel permeation chromatography (GPC)) was 7,900, and the dispersity (Mw/Mn) was 1.68.

Also, the copolymer formulation ratio (proportion (molar ratio) of each structural unit within the polymeric compound 5) determined by carbon 13 nuclear magnetic resonance spectrum (600 MHz $^{13}$C-NMR) was a0/a11/a14/a3=35/39/15/11.

[Chemical Formula 89]

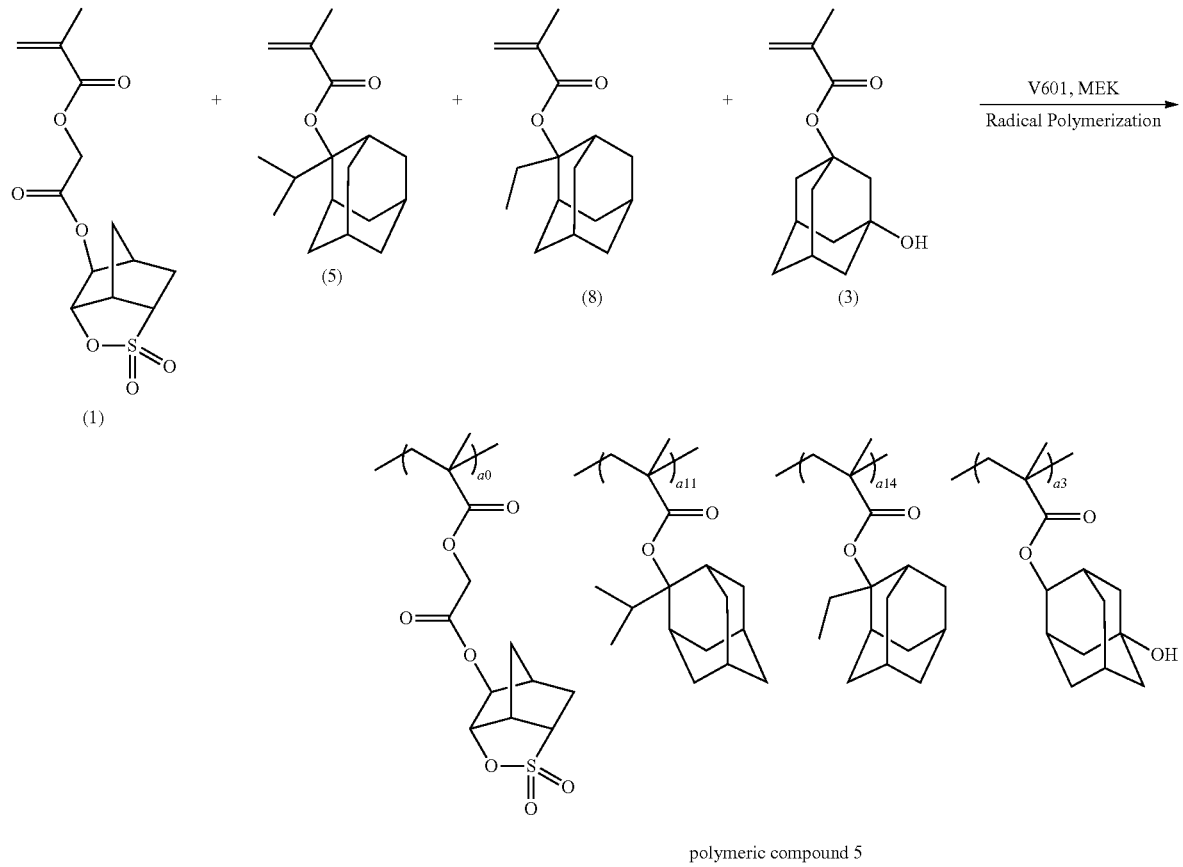

polymeric compound 5

<Acid Generator (B1) Synthesis (2)>

In the following examples, the compound (1) used as the acid generator (B1) was synthesized according to the following acid generator synthesis example. Here, in the NMR analysis, the internal standard of $^1$H-NMR was tetramethylsilane (TMS), and the internal standard of $^{19}$F-NMR was hexafluorobenzene (the peak of hexafluorobenzene was −160 ppm).

[Acid Generator Synthesis 5 (Synthesis of Compound (1))]

7.40 g of the compound (k) shown below, 209.8 g of dichloromethane, and 104.9 g of pure water were added to a beaker, and 10.49 g of the compound (d) shown below was added thereto. Then, the resulting solution was stirred for 30 minutes at room temperature. Subsequently, the reaction solution was separated by fractionation, and the organic phase was washed with dilute hydrochloric acid and then washed with water. The obtained organic phase was concentrated and dried, thereby obtaining 9.81 g of the compound (1) in the form of a white powder.

The obtained compound (1) was analyzed using $^1$H-NMR and $^{19}$F-NMR. The results are as follows.

$^1$H-NMR (DMSO-d6, 400 MHz): δ (ppm)=1.71-2.03 (m, 3H, Anion), 2.18-2.36 (m, 5H, CH$_2$S+Anion), 2.51 (s, 1H, Anion), 3.43-3.66 (m, 5H, SCH$_2$CH$_2$+Anion), 3.89 (d, 1H, Anion), 4.66 (t, 1H, Anion), 4.78 (m, 1H, Anion), 5.31 (s, 2H, SCH$_2$C=O), 7.58-7.61 (t, 2H, Ar), 7.73-7.76 (t, 1H, Ar), 7.99-8.01 (d, 2H, Ar).

$^{19}$F-NMR (DMSO-d6, 376 MHz): δ (ppm)=−107.7.

From the results described above, it was confirmed that the compound (1) had the structure shown above.

Positive Resist Composition Preparation (2)

Examples 9 to 12, and Comparative Examples 2 to 3

The components shown in Table 3 were mixed and dissolved to obtain positive resist compositions.

TABLE 3

|  | Component (A) | Component (B) |  |  | Component (E) | Component (S) |  |
|---|---|---|---|---|---|---|---|
| Example 9 | (A)-5 | (B)-6 | — | (B)-8 | (E)-1 | (S)-1 | (S)-2 |
|  | [100] | [13.8] |  | [1.0] | [0.26] | [2300] | [25] |
| Example 10 | (A)-5 | (B)-7 | (B)-1 | (B)-8 | (E)-1 | (S)-1 | (S)-2 |
|  | [100] | [5.0] | [2.7] | [1.0] | [0.26] | [2300] | [25] |
| Comparative Example 11 | (A)-5 | (B)-5 | — | (B)-8 | (E)-1 | (S)-1 | (S)-2 |
|  | [100] | [14.0] |  | [1.0] | [0.26] | [2300] | [25] |
| Example 11 | (A)-6 | (B)-7 | (B)-1 | (B)-8 | (E)-1 | (S)-1 | (S)-2 |
|  | [100] | [5.0] | [2.7] | [1.0] | [0.26] | [2300] | [25] |
| Example 12 | (A)-6 | (B)-6 | — | (B)-8 | (E)-1 | (S)-1 | (S)-2 |
|  | [100] | [13.8] |  | [1.0] | [0.26] | [2300] | [25] |
| Comparative Example 3 | (A)-6 | (B)-5 | — | (B)-8 | (E)-1 | (S)-1 | (S)-2 |
|  | [100] | [14.0] |  | [1.0] | [0.26] | [2300] | [25] |

In Table 3, each of the abbreviations indicates the following. Also, the values within the brackets [ ] indicate blending amount (parts by weight). In Table 3, the term "-" represents that nothing was blended.

(A)-5: the polymeric compound 4.
(A)-6: the polymeric compound 5.
(B)-1: the compound (e).
(B)-5: (4-methylphenyl)diphenylsulfonium nonafluoro-n-butanesulfonate.
(B)-6: the compound (l).
(B)-7: the compound represented by the formula (B)-7 shown below.
(B)-8: the compound represented by the formula (B)-8 shown below.

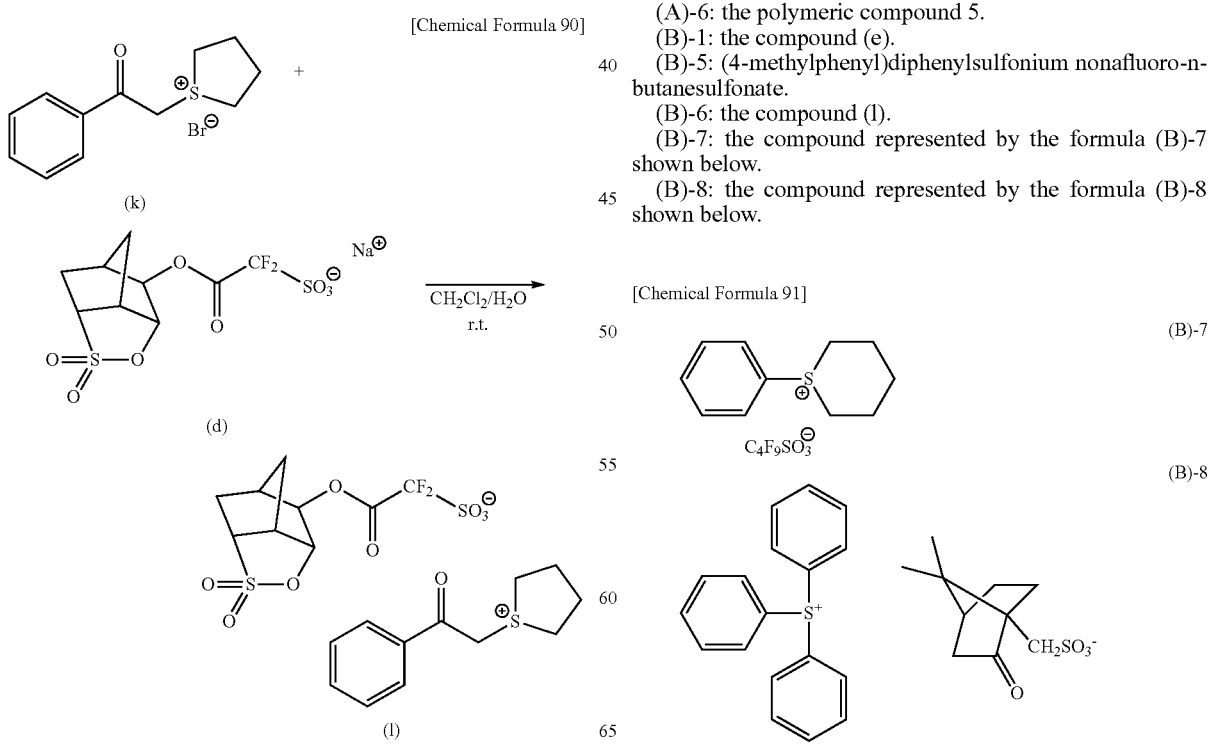

[Chemical Formula 90]

(k)

(d)

(l)

[Chemical Formula 91]

(B)-7

(B)-8

(E)-1: salicylic acid.

(S)-1: a mixed solvent of PGMEA/PGME=6/4 (mass ratio).

(S)-2: γ-butyrolactone.

<Evaluation of Resist Pattern Shape>

Using the resist composition obtained above, the resist pattern was formed in the following procedure to evaluate the resist pattern shape.

[Formation of Resist Pattern]

An organic anti-reflection film composition (product name: ARC29A, manufactured by Brewer Science Ltd.) was applied onto an 8-inch silicon wafer using a spinner, and the composition was then baked on a hotplate at 205° C. for 60 seconds, thereby forming an organic anti-reflection film having a film thickness of 82 nm.

Then, each of the positive resist compositions of Examples and Comparative Examples was applied onto the anti-reflection film using a spinner, and was then prebaked (PAB) on a hotplate at 100° C. for 60 seconds and dried, thereby forming a resist film having a film thickness of 160 nm.

Subsequently, the resist film was selectively exposed with an ArF excimer laser (193 nm) through a mask pattern (6% half tone), using an ArF exposure apparatus NSR-5302 (a product name, manufactured by Nikon Corporation, NA (numerical aperture)=0.60, 2/3 annular illumination).

A post exposure baking (PEB) treatment was then conducted at 90° C. for 60 seconds, the resist film was subjected to alkali developing for 30 seconds at 23° C. in a 2.38% by weight aqueous solution of tetramethylammonium hydroxide (TMAH) (product name: NMD-3, manufactured by Tokyo Ohka Kogyo Co., Ltd.), and was then rinsed with pure water for 30 seconds and dried by shaking.

As a result, in each example, a line and space resist pattern (hereinafter, referred to as "LS pattern") with a line width of 140 nm and a pitch of 280 nm was formed on the resist film.

[Evaluation of Sensitivity]

In the above resist pattern formation, an optimum exposure "Eop" (mJ/cm$^2$; sensitivity) for forming a LS pattern was determined. The results are shown in Table 4.

[Evaluation of Resist Pattern Shape]

Each of the LS patterns with a line width of 140 nm and a pitch of 280 nm formed by using the above Eop was observed using a scanning electron microscope (SEM), and the cross-sectional shape of the LS pattern was evaluated against the following criteria. A: high rectangularity. B: low rectangularity. The results are shown in Table 4.

TABLE 4

| | PAB/PEB (° C.) | Eop (mJ/cm$^2$) | Cross-sectional shape of LS pattern |
|---|---|---|---|
| Example 9 | 100/90 | 39 | A |
| Example 10 | 100/90 | 11 | A |
| Comparative Example 2 | 100/90 | 22 | B |
| Example 11 | 100/90 | 11 | A |
| Example 12 | 100/90 | 39 | A |
| Comparative Example 3 | 100/90 | 22 | B |

From the results shown in Table 4, it was confirmed that the positive resist compositions of Examples 9 to 12 of the present invention excelled in the resist pattern shape, because the cross-sectional shape of LS pattern had high rectangularity in Examples 9 to 12 as compared with Comparative Examples 2 to 3.

The invention claimed is:

1. A positive resist composition comprising: a base component (A) which exhibits increased solubility in an alkali developing solution under action of an acid; and an acid generator component (B) which generates an acid upon exposure, wherein the base component (A) comprises a polymeric compound (A1) which contains a structural unit (a0) represented by the general formula (a0-1) shown below and a structural unit (a1) derived from an acrylate ester containing an acid dissociable, dissolution inhibiting group, and the acid generator component (B) comprises an acid generator (B1) containing an anion moiety represented by the general formula (I) shown below:

[Chemical Formula 1]

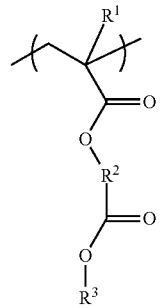

(a0-1)

(in the formula (a0-1), R$^1$ represents a hydrogen atom, a lower alkyl group of 1 to 5 carbon atoms, or a halogenated lower alkyl group of 1 to 5 carbon atoms; R$^2$ represents a bivalent linking group; and R$^3$ represents a cyclic group containing —SO$_2$— within the ring skeleton), and

[Chemical Formula 2]

$$X\text{-}Q^1\text{-}Y^1\text{—}SO_3^- \quad (I)$$

(in the formula (I), X represents a cyclic group of 3 to 30 carbon atoms which may contain a substituent; Q$^1$ represents a bivalent linking group which contains an oxygen atom; Y$^1$ represents an alkylene group of 1 to 4 carbon atoms which may contain a substituent, or a fluorinated alkylene group of 1 to 4 carbon atoms which may contain a substituent).

2. The positive resist composition according to claim 1, wherein said R$^3$ is a cyclic group containing —O—SO$_2$— within the ring skeleton.

3. The positive resist composition according to claim 2, wherein said R$^3$ is a cyclic group represented by the general formula (3-1) shown below

[Chemical Formula 3]

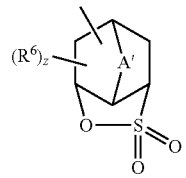

(3-1)

(in the formula (3-1), A' represents an oxygen atom, a sulfur atom, or an alkylene group of 1 to 5 carbon atoms which may contain an oxygen atom or a sulfur atom; z represents an integer of 0 to 2; R$^6$ represents an alkyl group, an alkoxy group, a halogenated alkyl group, a hydroxyl group, —COOR'', —OC(=O)R'', a hydroxyalkyl group or a cyano group, wherein R'' represents a hydrogen atom or an alkyl group).

4. The positive resist composition according to claim 1, wherein the polymeric compound (A1) further comprises a structural unit (a3) derived from an acrylate ester which has a polar group-containing aliphatic hydrocarbon group.

5. The positive resist composition according to claim 1, further comprising a nitrogen-containing organic compound (D).

6. A method of forming a resist pattern, comprising: forming a resist film on a substrate using the positive resist composition of claim 1; exposing the resist film; and alkali-developing the resist film to form a resist pattern.

* * * * *

UNITED STATES PATENT AND TRADEMARK OFFICE
CERTIFICATE OF CORRECTION

PATENT NO. : 8,206,891 B2
APPLICATION NO. : 12/573686
DATED : June 26, 2012
INVENTOR(S) : Takehiro Seshimo et al.

It is certified that error appears in the above-identified patent and that said Letters Patent is hereby corrected as shown below:

In the Specifications:

In Column 17, Line 23, Change "diccociable," to --dissociable,--.

In Column 22, Line 14, Change "IC" to --$R^{17}$--.

In Column 73, Line 36, Change "norbonyl" to --norbornyl--.

In Column 73, Line 36, Change "norbonyl" to --norbornyl--.

In Column 74, Line 13, Change "(a-4-1)" to --(a4-1)--.

In Column 74, Lines 13-14, Change "(a-4-5)" to --(a4-5)--.

In Column 76, Line 64, Change "dicyclohexylcarboxylmide" to --dicyclohexylcarboxyimide--.

In Column 79, Line 15, Change "substitutent" to --substituent--.

In Column 81, Line 22, Change "substitutents." to --substituents.--.

In Column 81, Line 32, Change "substitutent" to --substituent--.

In Column 81, Line 43, Change "—C(=O)—," to -- -C(=O)-, -O-C(=O)-O-,--.

In Column 82, Line 31, Change "—CH$_2$CF$_2$—," to -- -CHF-, -CH$_2$CF$_2$-,--.

In Column 82, Line 50, Change "fluororinated" to --fluorinated--.

In Column 91, Line 2, Change "$1 \leq b \leq c \leq 5$.)" to --$1 \leq b+c \leq 5$.)--.

In Column 93, Line 58, Change "$Q^2$," to --$Q^2$, $Y^1$,--.

In Column 96, Line 11, Change "substitutent" to --substituent--.

Signed and Sealed this
Twenty-first Day of May, 2013

Teresa Stanek Rea
*Acting Director of the United States Patent and Trademark Office*

CERTIFICATE OF CORRECTION (continued)
U.S. Pat. No. 8,206,891 B2

In Column 97, Line 41, Change "napthyl" to --naphthyl--.

In Column 105, Line 42, Change "d-camphar" to --d-camphor--.

In Column 114, Line 42, Change "($Q^1$-))." to --(-$Q^1$-).--.

In Column 133, Line 66, Change "NSR-5609B," to --NSR-S609B,--.

In Column 141, Line 22, Change "NSR-5302" to --NSR-S302--.